US012813065B2

(12) United States Patent
Pavicic et al.

(10) Patent No.: US 12,813,065 B2
(45) Date of Patent: Nov. 24, 2026

(54) ORGANIC LIGHT EMITTING DIODE, METHOD FOR PREPARING THE SAME AND DEVICE COMPRISING THE SAME

(71) Applicant: Novaled GmbH, Dresden (DE)

(72) Inventors: Domagoj Pavicic, Dresden (DE); Jerome Ganier, Dresden (DE); Mauro Furno, Dresden (DE); Elena Galán García, Dresden (DE); Steffen Runge, Dresden (DE); Irina Rörich, Dresden (DE)

(73) Assignee: Novaled GmbH, Dresden (DE)

( * ) Notice: Subject to any disclaimer, the term of this patent is extended or adjusted under 35 U.S.C. 154(b) by 351 days.

(21) Appl. No.: 18/714,948

(22) PCT Filed: Dec. 8, 2022

(86) PCT No.: PCT/EP2022/084932
§ 371 (c)(1),
(2) Date: May 30, 2024

(87) PCT Pub. No.: WO2023/110610
PCT Pub. Date: Jun. 22, 2023

(65) Prior Publication Data
US 2025/0126967 A1 Apr. 17, 2025

(30) Foreign Application Priority Data
Dec. 14, 2021 (EP) .................................... 21214436

(51) Int. Cl.
*H10K 50/16* (2023.01)
*H10K 71/16* (2023.01)
*H10K 85/60* (2023.01)

(52) U.S. Cl.
CPC ......... *H10K 50/166* (2023.02); *H10K 71/164* (2023.02); *H10K 85/615* (2023.02); *H10K 85/654* (2023.02)

(58) Field of Classification Search
None
See application file for complete search history.

(56) References Cited

U.S. PATENT DOCUMENTS

2012/0319094 A1 12/2012 Furukawa et al.
2020/0161559 A1* 5/2020 Senkovskyy ........ C07D 251/14
(Continued)

FOREIGN PATENT DOCUMENTS

EP 3406599 A1 11/2018
EP 3407401 A1 11/2018
(Continued)

OTHER PUBLICATIONS

International Search Report and Written Opinion issued in international application No. PCT/EP2022/084932, dated Jan. 31, 2023 (9 pages).
(Continued)

*Primary Examiner* — Daniel J. Schleis
(74) *Attorney, Agent, or Firm* — Eversheds Sutherland (US) LLP

(57) ABSTRACT

The present invention relates to an organic light emitting diode comprising a non-transparent substrate, an anode, a cathode, an emission layer, an electron injection layer and an electron transport layer stack; a method for preparing the same; and to a display device or lighting device comprising the same.

15 Claims, 2 Drawing Sheets

(56) References Cited

U.S. PATENT DOCUMENTS

| | | | | |
|---|---|---|---|---|
| 2021/0028371 | A1 | 1/2021 | Okuyama et al. | |
| 2021/0083192 | A1* | 3/2021 | Galan .................. | C07D 405/04 |

FOREIGN PATENT DOCUMENTS

| | | | |
|---|---|---|---|
| EP | 3470398 | A1 | 4/2019 |
| KR | 20180110681 | A | 10/2018 |

OTHER PUBLICATIONS

Notice to File a Response issued in corresponding Korean application No. 10-2024-7019115, dated Jun. 22, 2026 (30 pages).

* cited by examiner

ORGANIC LIGHT EMITTING DIODE, METHOD FOR PREPARING THE SAME AND DEVICE COMPRISING THE SAME

CROSS-REFERENCE TO RELATED APPLICATIONS

This application is a U.S. national phase entry of PCT/EP2022/084932, filed Dec. 8, 2022, which claims priority to European Patent Application No. 21214436.4, filed Dec. 14, 2021. The content of these applications is incorporated by reference herein.

TECHNICAL FIELD

The present invention relates to an organic light emitting diode, a method for preparing the same and a device comprising the same.

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole transport layer (HTL), an emission layer (EML), an electron transport layer (ETL), and a cathode, which are sequentially stacked on a substrate. In this regard, the HTL, the EML, and the ETL are thin films formed from organic and/or organometallic compounds.

When a voltage is applied to the anode and the cathode, holes injected from the anode electrode move to the EML, via the HTL, and electrons injected from the cathode electrode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency.

A variety of organic electronic diodes comprising different electron transport materials are well known in the art. However, there is still a need to improve the performance of such devices, in particular to improve the performance of single-emission-layer top emission OLEDs, specifically with regard to device stability and lifetime. Furthermore, there is still the need to simplify the processes for device preparation.

It is, therefore, the object of the present invention to provide an organic light emitting diode overcoming drawbacks of the prior art, in particular a single-emission-layer top emission OLED with improved performance, that with improved device stability and lifetime, which can be prepared in a simplified process.

DISCLOSURE

The object is achieved by an organic light emitting diode comprising a non-transparent substrate, an anode, a cathode, an emission layer, and an electron transport layer stack; wherein

- the electron transport layer stack is arranged between the emission layer and the cathode;
- the electron transport layer stack comprises a first electron transport layer, a second electron transport layer, and a third electron transport layer;
- the second electron transport layer is arranged between and in direct contact with the first electron transport layer and the third electron transport layer, respectively;
- the first electron transport layer is arranged closer to the emission layer than the third electron transport layer;
- the third electron transport layer is arranged closer to the cathode than the first electron transport layer;
- the first electron transport layer comprises a compound of Formula (I)

$$(Ar^1\text{-}A_c)_a\text{-}X_b \qquad (I);$$

a and b are independently 1 or 2;

c is independently 0 or 1;

$Ar^1$ is independently selected from $C_6$ to $C_{60}$ aryl or $C_2$ to $C_{42}$ heteroaryl, wherein each $Ar^1$ may be substituted with one or two substituents independently selected from the group consisting of $C_6$ to $C_{12}$ aryl, $C_3$ to $C_{11}$ heteroaryl, and $C_1$ to $C_6$ alkyl, D, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, halogen, CN or $PY(R^{10})_2$, wherein Y is selected from O, S or Se, preferably O and $R^{10}$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy;

wherein each $C_6$ to $C_{12}$ aryl substituent on $Ar^1$ and each $C_3$ to $C_{11}$ heteroaryl substituent on $Ar^1$ may be substituted with $C_1$ to $C_4$ alkyl or halogen;

A is independently selected from $C_6$ to $C_{30}$ aryl, wherein each A may be substituted with one or two substituents independently selected from the group consisting of $C_6$ to $C_{12}$ aryl and $C_1$ to $C_6$ alkyl, D, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, halogen, CN or $PY(R^{10})_2$, wherein Y is selected from O, S or Se, preferably O, and $R^{10}$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy;

wherein each $C_6$ to $C_{12}$ aryl substituent on A may be substituted with $C_1$ to $C_4$ alkyl or halogen;

X is independently selected from the group consisting of $C_2$ to $C_{42}$ heteroaryl and $C_6$ to $C_{60}$ aryl, wherein each X may be substituted with one or two substituents independently selected from the group consisting of $C_6$ to $C_{12}$ aryl, $C_3$ to $C_{11}$ heteroaryl, and $C_1$ to $C_6$ alkyl, D, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, halogen, CN or $PY(R^{10})_2$, wherein Y is selected from O, S or Se, preferably O, and $R^{10}$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy;

wherein each $C_6$ to $C_{12}$ aryl substituent on X and each $C_3$ to $C_{11}$ heteroaryl substituent on X may be substituted with $C_1$ to $C_4$ alkyl or halogen;

the molecular dipole moment of the compound of formula (I) is ≥0 D and ≤4 D;

the second electron transport layer comprises the compound of formula (I) and a compound of Formula (II)

$$(Ar^2)_m\text{-}(Z_k\text{-}G)_n \qquad (II);$$

m and n are independently 1 or 2;

k is independently 0, 1 or 2;

Ar is independently selected from the group consisting of $C_2$ to $C_{42}$ heteroaryl and $C_6$ to $C_{60}$ aryl, wherein each $Ar^2$ may be substituted with one or two substituents independently selected from the group consisting of $C_6$ to $C_{12}$ aryl, $C_3$ to $C_{11}$ heteroaryl, and $C_1$ to $C_6$ alkyl, D, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, halogen, CN or $PY(R^{10})_2$, wherein Y is selected from O, S or Se, preferably O, and $R^{10}$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy;

wherein each $C_6$ to $C_{12}$ aryl substituent on $Ar^2$ and each $C_3$ to $C_{11}$ heteroaryl substituent on $Ar^2$ may be substituted with $C_1$ to $C_4$ alkyl or halogen;

Z is independently selected from $C_6$ to $C_{30}$ aryl, wherein each Z may be substituted with one or two substituents independently selected from the group consisting of $C_6$ to $C_{12}$ aryl and $C_1$ to $C_6$ alkyl, D, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_6$ alkyl, partially or perfluorinated $C_1$ to $C_6$ alkoxy, partially or perdeuterated C to $C_6$ alkyl, partially or perdeuterated $C_1$ to $C_6$ alkoxy, halogen, CN or $PY(R^{10})_2$, wherein Y is selected from O, S or Se, preferably O, and $R^{10}$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy;

wherein each $C_6$ to $C_{12}$ aryl substituent on Z may be substituted with $C_1$ to $C_4$ alkyl or halogen;

G is chosen so that the dipole moment of a compound G-phenyl is ≥1 D and ≤7 D;

the third electron transport layer comprises the compound of Formula (II);

the compound of Formula (I) and the compound of Formula (II) are structurally different from each other;

the first electron transport layer does not comprise the compound of Formula (II) as comprised in the third electron transport layer; and the third electron transport layer does not comprise the compound of Formula (I) as comprised in the first electron transport layer; and the first electron transport layer and the second electron transport layer are free of an electrical dopant.

The object is further achieved by a method for preparing the organic electronic device according to the invention, the method comprising the steps:

i) providing the compound of formula (I) in a first vapor deposition source;

ii) providing the compound of formula (II) in a second vapor deposition source;

iii) either a) evaporating the compound of formula (I) from the first vapor deposition source and depositing the evaporated compound of formula (I) on the emission layer to form the first electron transport layer;

b) evaporating simultaneously the compound of formula (I) from the first vapor deposition source and the compound of formula (II) from the second vapor deposition source and depositing simultaneously the evaporated compound of formula (I) and the evaporated compound of formula (II) on the first electron transport layer to form the second electron transport layer; and c) evaporating the compound of formula (II) from the second vapor deposition source and depositing the evaporated compound of formula (II) on the second electron transport layer to form the third electron transport layer;

or d) evaporating the compound of formula (II) from the second vapor deposition source and depositing the evaporated compound of formula (II) on the cathode or on a layer provided on the cathode or an outermost layer of a layer stack provided on the cathode to form the third electron transport layer;

e) evaporating simultaneously the compound of formula (I) from the first vapor deposition source and the compound of formula (II) from the second vapor deposition source and depositing simultaneously the evaporated compound of formula (I) and the evaporated compound of formula (II) on the third electron layer to form the second electron transport layer; and f) evaporating the compound of formula (I) from the first vapor deposition source and depositing the evaporated compound of formula (I) on the second electron transport layer to form the first electron transport layer.

The object is further achieved by a method comprising the steps:

i) providing a first vapor deposition source and a second vapor deposition source in spatial proximity with respect to each other the spatial proximity allowing to co-deposit a first compound from the first vapor deposition source and a second compound from the second vapor deposition source on a substrate arranged at equal distance from the first vapor deposition source and the second vapor deposition source;

ii) providing the compound of formula (I) in the first vapor deposition source;

iii) providing the compound of formula (II) in the second vapor deposition source;

iv) evaporating simultaneously the compound of formula (I) from the first vapor deposition source and the compound of formula (II) from the second vapor deposition source; and v) either a) moving layer stack comprising the anode and the light emission layer, wherein the light emitting layer is an outer layer, in a direction from the first vapor deposition source to the second vapor deposition source at first along the first vapor deposition source and thereafter along the second vapor deposition source to form, in this order, the first electron transport layer on the light emission layer, the second electron transport layer on the first electron transport layer and the third electron transport layer on the second electron transport layer;

or b) moving the cathode or a layer stack comprising the cathode and at least one further layer in a direction from the second vapor deposition source to the first vapor deposition source at first along the second vapor deposition source and thereafter along the first vapor deposition to form, in this order, the third electron transport layer on the cathode or the outermost layer of the at least one further layer(s), the second electron transport layer on the third electron transport layer and the first electron transport layer on the second electron transport layer.

The object is further achieved by a device comprising the inventive organic light emitting diode, wherein the device is a display device or a lighting device.

First Electron Transport Layer

The first electron transport layer comprises a compound of Formula (I)

$$(Ar^1\text{-}A_c)_a\text{-}X_b \quad (I).$$

The first electron transport layer does not comprise the compound of Formula (II), that is, the compound of formula (II) as it is comprised in the second electron transport layer and in the third electron transport layer.

The first electron transport layer may consist of the compound of Formula (I) (including a mixture of two or more of the compounds of Formula (I). Alternatively, the first electron transport layer may consist of a mixture of the compound of Formula (I) and one or more further compounds, provided that none of the further compounds is an electrical dopant. The first electron transport layer may comprise more than one compound of Formula (I). In particular, the first electron transport layer may consist of a mixture of the compound of Formula (I) and further compounds known in the art as electron transport matrix compounds. Exemplary further electron transport matrix compounds which may be contained are disclosed below.

In the compound of Formula (I), the group "A" is spacer moiety connecting (if present, that is in case that c>1) the group $Ar^1$ and X. In case that the compound of Formula (I) comprises more than one groups ($Ar^1$-$A_c$), the groups may or may not independently comprise the spacer A.

In the compound of Formula (I), a and b are independently 1 or 2. Alternatively, a and b may both be 1.

In the compound of Formula (I), c is independently 0 or 1.

$Ar^1$ is independently selected from $C_6$ to $C_{60}$ aryl or $C_2$ to $C_{42}$ heteroaryl, alternatively $C_6$ to $C_{54}$ aryl or $C_2$ to $C_{39}$ heteroaryl, alternatively $C_6$ to $C_{48}$ aryl or $C_2$ to $C_{36}$ heteroaryl, alternatively $C_6$ to $C_{42}$ aryl or $C_2$ to $C_{36}$ heteroaryl, alternatively $C_6$ to $C_{36}$ aryl or $C_2$ to $C_{30}$ heteroaryl, alternatively $C_6$ to $C_{30}$ aryl or $C_2$ to $C_{24}$ heteroaryl.

$Ar^1$ may be independently $C_6$ to $C_{54}$ aryl, optionally $C_6$ to $C_{48}$ aryl, optionally $C_6$ to $C_{42}$ aryl, optionally $C_6$ to $C_{36}$ aryl, optionally $C_6$ to $C_{30}$ aryl, and optionally $C_6$ to $C_{24}$ aryl.

$Ar^1$ may be independently $C_2$ to $C_{42}$ hetroaryl, optionally $C_2$ to $C_{40}$ hetroaryl, optionally $C_2$ to $C_{36}$ hetroaryl, optionally $C_2$ to $C_{30}$ hetroaryl, and optionally $C_2$ to $C_{24}$ hetroaryl.

In an embodiment $Ar^1$ is different from X.

$Ar^1$ may comprise a system of two or more anellated aromatic rings, preferably three or more anellated aromatic rings.

$Ar^1$ may comprise at least one $sp^3$-hypridized carbon atom.

$Ar^1$ may comprise at least one carbon-carbon $sp^2$ alkene bond which is not integrated into an aromatic ring structure. In an embodiment where $Ar^1$ is independently selected from unsubstituted $C_2$ to $C_{42}$ heteroaryl, the heteroatoms are bound into the molecular structure of $Ar^1$ by single bonds.

$Ar^1$ may be independently selected from the group consisting of phenyl, naphthyl, anthracenyl, fluoranthenyl, xanthenyl, dibenzofuranyl, pyrimidinyl pyraziny, spiro-xanthenyl, fluorenyl, spiro-fluorenyl, triphenylsilyl, tetraphenylsilyl, tetraphenylethylene, or a group having the formula (IIa) or (IIb)

(IIa)

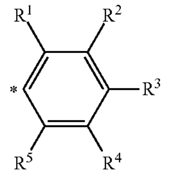

(IIb)

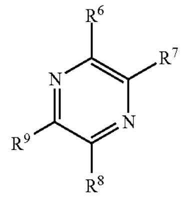

wherein the asterisk symbol "*" represents the binding position for binding the group of formula (IIa) to A; and $R^1$ to $R^9$ are independently selected from the group consisting of H, $C_6$ to $C_{12}$ aryl and $C_4$ to $C_{10}$ heterorayl.

If $Ar^1$ is a group having the formula (IIb), binding of the group having the formula (IIb) to A (or if A is not present in case that c=0) to X may be via any of the groups $R^6$ to $R^9$ wherein (formally) A (respectively X) replaces a terminal hydrogen atom of the respective $R^6$ to $R^9$.

$Ar^1$ may be independently selected from the group consisting of anthracenyl, fluorenyl, dibenzofuranyl, 9,9-dimethylfluorenyl, a group having the formula (IIa), a group having the formula (IIb), (IIa)

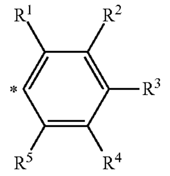

(IIb)

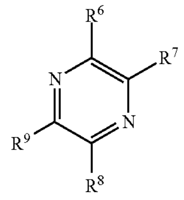

wherein the asterisk symbol "*" represents the binding position for binding the group of formula (IIa) to A; and $R^1$ is H and $R^2$ to $R^5$ are independently phenyl; or $R^1$ and $R^3$ are phenyl and $R^2$, $R^4$ and $R^5$ are H or $R^1$, $R^3$ and $R^5$ are phenyl and $R^2$ and $R^4$ are H or $R^1$, $R^3$ and $R^5$ are H and $R^2$ and $R^4$ are biphenylene or $R^6$ to $R^9$ are phenyl.

If $Ar^1$ is a group having the formula (IIb), binding of the group having the formula (IIb) to A (or if A is not present in case that c=0) to X may be via any of the groups $R^6$ to $R^9$ wherein (formally) A (respectively X) replaces a terminal hydrogen atom of the respective $R^6$ to $R^9$.

In the group of Formula (IIa), at least two of $R^1$ to $R^5$, which are not H may be in ortho-position to each other. At least one of $R^1$ to $R^5$ which is not H may be in ortho-position to the *-position. In this regard, two groups are in ortho-position to each other if bound to adjacent carbon atoms of the benzene ring in Formula (IIa), respectively. In other words, it can be provided that at least one of $R^1$ and $R^5$ is phenyl; and/or $R^1$ and $R^2$ are both phenyl; and/or $R^2$ and $R^3$ are both phenyl; and/or $R^3$ and $R^4$ are both phenyl; and/or $R^4$ and $R^5$ are both phenyl.

$Ar^1$ may be independently selected from the group consisting of anthracenyl and a group having the formula (IIa), (IIa)

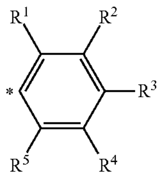

wherein the asterisk symbol "*" represents the binding position for binding the group of formula (IIa) to A; and $R^1$ is H and $R^2$ to $R^5$ are independently phenyl.

$Ar^1$ may be selected independently from one of the following groups

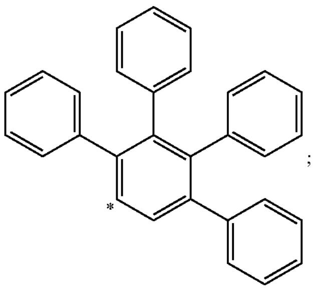

;

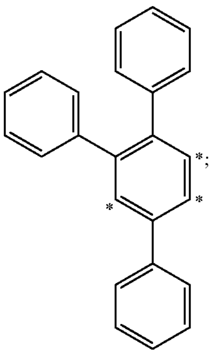

-continued

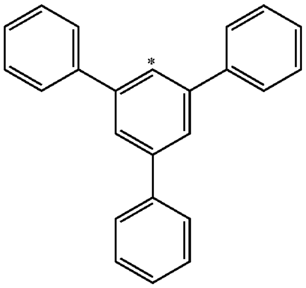

;

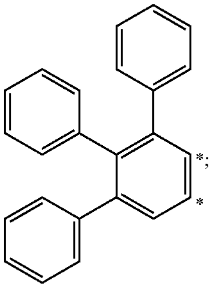

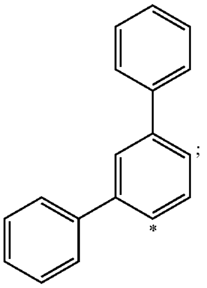

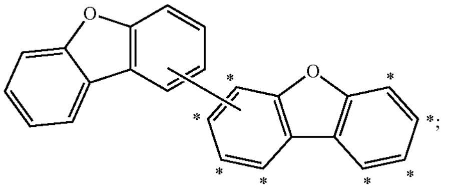

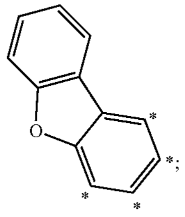

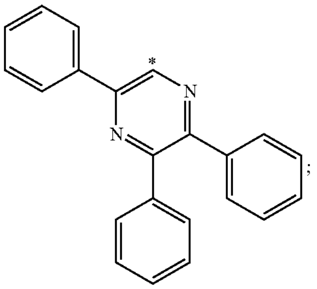

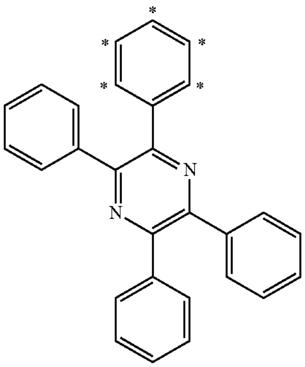

;

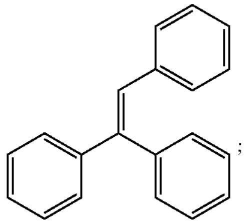

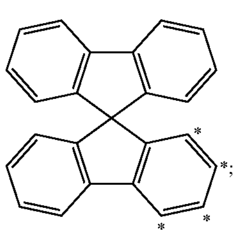

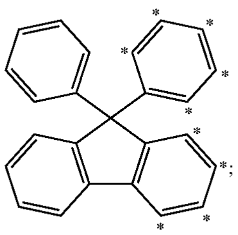

-continued

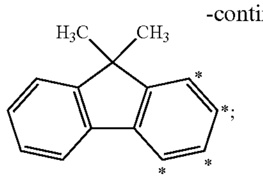
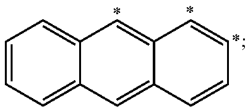
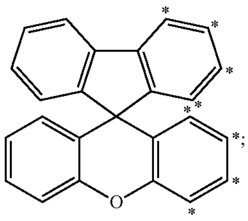
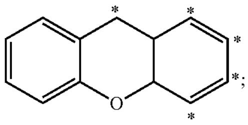

wherein the asterisk symbol "*" represents the binding position for binding the to A, respectively and which may be substituted or unsubstituted, respectively.

$Ar^1$ may be selected independently from one of the following groups

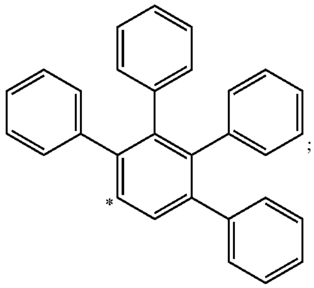
; and
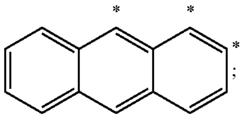

wherein the asterisk symbol "*" represents the binding position for binding the to A, respectively and which may be substituted or unsubstituted, respectively.

In case that $Ar^1$ is substituted, each of the substituents may be independently selected from the group consisting of phenyl, naphtyl, biphenyl, pyridyl, picolinyl, lutdine, dibenzofuranyl, dibenzothiophene-yl, and benzothiophene-yl.

In case that $Ar^1$ is substituted, each of the substituents may be phenyl.

$Ar^1$ (including all substituents) may be selected independently from one of the following groups

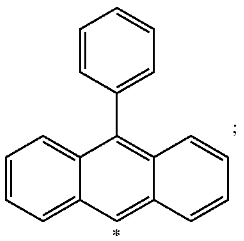
; and

-continued

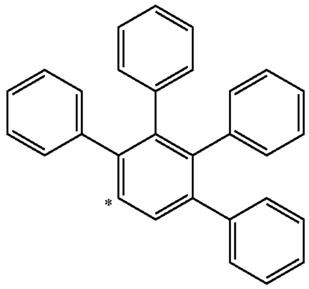

wherein the asterisk symbol "*" represents the binding position for binding the to A, respectively and which may be substituted or unsubstituted, respectively.

biphenylene and terphenylene which may be substituted or unsubstituted, respectively.

A may be selected independently from one of the following groups or combinations thereof

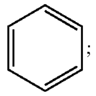
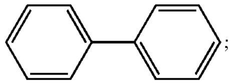
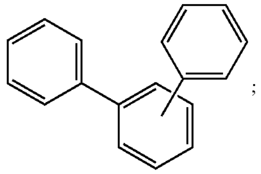
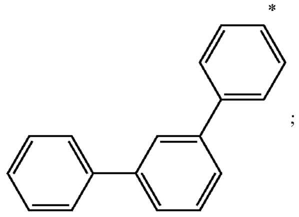

wherein the binding positions for binding to Ar and X can be freely selected, preferably

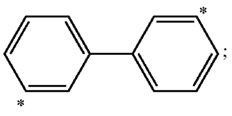
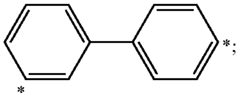
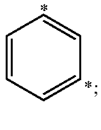
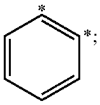
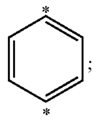

-continued

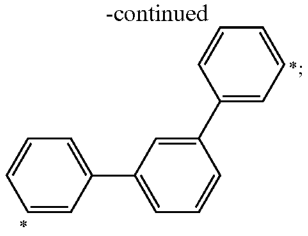

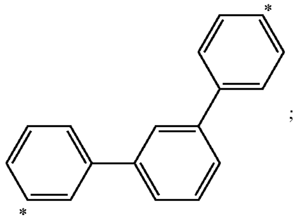

most preferred

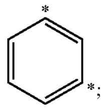

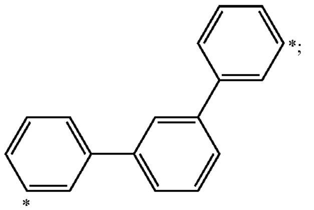

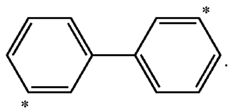

In case that A is substituted, each substituent on A may be independently selected from the group consisting of phenyl and $C_1$ to $C_4$ alkyl.

X may be independently selected from the group consisting of $C_2$ to $C_{39}$ heteroaryl and $C_6$ to $C_{54}$ aryl, optionally $C_2$ to $C_{36}$ heteroaryl and $C_6$ to $C_{48}$ aryl, optionally $C_3$ to $C_{30}$ heteroaryl and $C_6$ to $C_{42}$ aryl, optionally $C_3$ to $C_{27}$ heteroaryl and $C_6$ to $C_{36}$ aryl, optionally $C_3$ to $C_{24}$ heteroaryl and $C_6$ to $C_{30}$ aryl, and optionally $C_3$ to $C_{21}$ heteroaryl and $C_6$ to $C_{24}$ aryl, wherein the respective group may be substituted or unsubstituted.

X may be independently selected from the group consisting of $C_2$ to $C_{39}$ N-containing heteroaryl, $C_2$ to $C_{39}$ O-containing heteroaryl and $C_6$ to $C_{54}$ aryl, optionally $C_2$ to $C_{36}$ N-containing heteroaryl, $C_2$ to $C_{36}$ O-containing heteroaryl and $C_6$ to $C_{48}$ aryl, optionally $C_3$ to $C_{30}$ N-containing heteroaryl, $C_3$ to $C_{30}$ O-containing heteroaryl and $C_6$ to $C_{42}$ aryl, optionally $C_3$ to $C_{27}$ N-containing heteroaryl, $C_3$ to $C_{27}$ O-containing heteroaryl and $C_6$ to $C_{36}$ aryl, optionally $C_3$ to $C_{24}$ N-containing heteroaryl, $C_3$ to $C_{24}$ O-containing heteroaryl and $C_6$ to $C_{30}$ aryl, and optionally $C_3$ to $C_{21}$ N-containing heteroaryl, $C_3$ to $C_{21}$ O-containing heteroaryl and $C_6$ to $C_{24}$ aryl, wherein the respective group may be substituted or unsubstituted.

X may be independently selected from the group consisting of $C_2$ to $C_{39}$ N-containing heteroaryl and $C_6$ to $C_{54}$ aryl, optionally $C_2$ to $C_{36}$ N-containing heteroaryl, and $C_6$ to $C_{48}$ aryl, optionally $C_3$ to $C_{30}$ N-containing heteroaryl and $C_6$ to $C_{42}$ aryl, optionally $C_3$ to $C_{27}$ N-containing heteroaryl and $C_6$ to $C_{36}$ aryl, optionally $C_3$ to $C_{24}$ N-containing heteroaryl and $C_6$ to $C_{30}$ aryl, and optionally $C_3$ to $C_{21}$ N-containing heteroaryl and $C_6$ to $C_{24}$ aryl. In this regard, it may be provided that a respective N-containing heteroaryl comprises one or more N-atoms as the only heteroatom(s), wherein the respective group may be substituted or unsubstituted.

X may be independently selected from the group consisting of triazinyl, 1,2-diazinyl, 1,3-diazinyl, 1,4-diazinyl, quinazolinyl, benzoquinazolinyl, benzimidazolyl, quinolinyl, benzoquinolinyl benzoacridinyl, dibenzoacridinyl, fluoranthenyl, anthracenyl, naphthyl, triphenylenyl, phenathrolinyl, and dinaphthofuranyl which may be substituted or unsubstituted, respectively.

X may be independently selected from the group consisting of triazinyl, 1,2-diazinyl, 1,3-diazinyl, 1,4-diazinyl, quinazolinyl, benzoquinazolinyl, benzoacridinyl, dibenzoacridinyl, fluoranthenyl, anthracenyl, naphthyl, triphenylenyl, phenathrolinyl, and dinaphthofuranyl which may be substituted or unsubstituted, respectively.

X may be independently selected from the group consisting of naphthyl, triazinyl, 1,3-diazinyl, 1,4-diazinyl, benzoquinazolinyl, dibenzoacridinyl, which may be substituted or unsubstituted, respectively.

X may be triazinyl.

X may be selected independently from one of the following groups

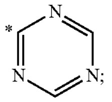

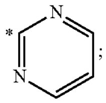

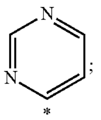

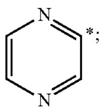

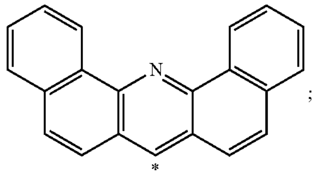

; and

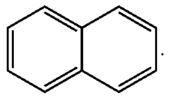

wherein the asterisk symbol "*" represents the binding position for binding the group to A, respectively; and the group may be substituted or unsubstituted, respectively.

X may be

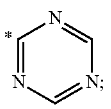

wherein the asterisk symbol "*" represents the binding position for binding the group to A, respectively; and the group may be substituted or unsubstituted, respectively.

In case that X is substituted, each substituent on X may be independently selected from the group consisting of phenyl, naphthyl, phenyl-2,6-lutidinyl, phenyl-pyridinyl and biphenyl-yl. In case that X is substituted, each substituent on X may be independently selected from the group consisting of phenyl, phenyl-pyridinyl, phenyl-2,6-lutidinyl and biphenyl-yl.

In case that X is substituted, each substituent on X may be independently selected from the group consisting of phenyl and biphenyl-yl.

In case that X is substituted, respective substituted X groups (including all substituents) may be independently

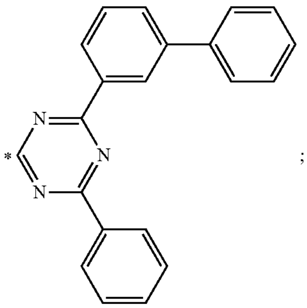
;
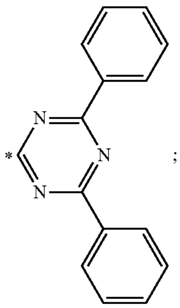
;
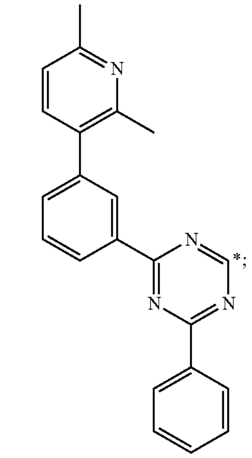
;
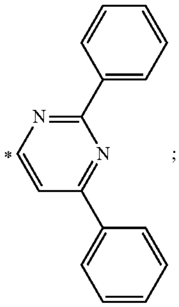
;
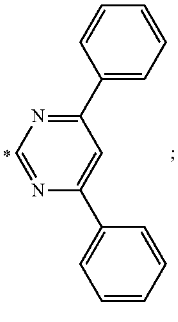
;
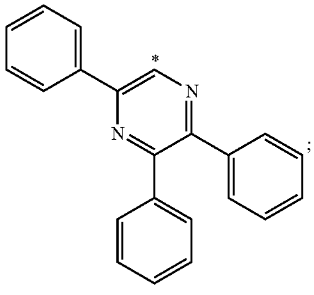
;

-continued

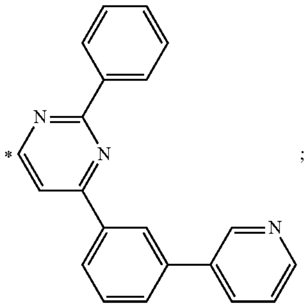
;
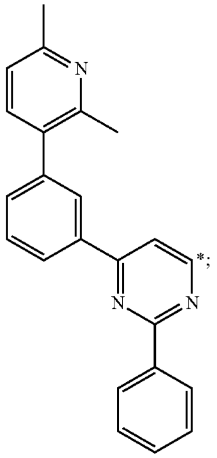
;
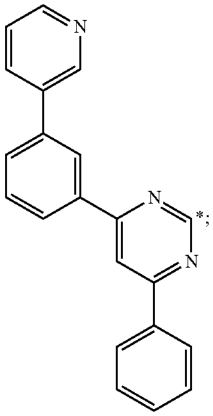
; and
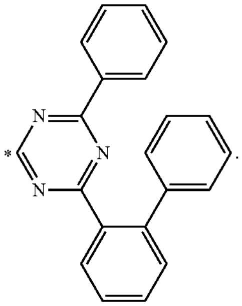
.

In case that X is substituted, respective substituted X groups (including all substituents) may be independently

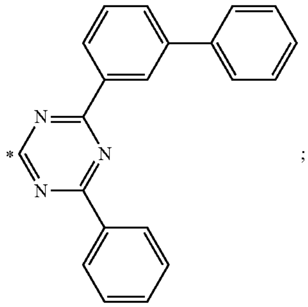
; and
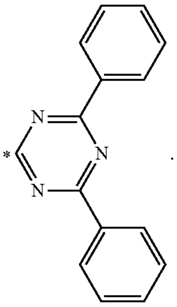
.

It may be provided that the compound of Formula (I) does not contain a moiety P═O. It may be provided that the compound of Formula (I) does not contain P(═O)Aryl$_2$. It may be provided that the compound of Formula (I) does not contain P(=O)Alkyl$_2$. It may be provided that the compound of Formula (I) does not contain P(=O)Ph$_2$. It may be provided that the compound of Formula (I) does not contain P(=O)(CH$_3$)$_2$. It may be provided that the compound of Formula (I) does not contain R'P(=O)R" wherein R' and R" are connected with each other to form a ring, that is, does not contain ring-phosphine oxide. It may be provided that the compound of Formula (I) does not contain R'P(=O)R" wherein R' and R" are connected with each other to form a 7-membered ring.

It may be provided that the compound of Formula (I) does not contain two moieties P=O. It may be provided that wherein the compound of Formula (I) does not contain two P(=O)Aryl$_2$. It may be provided that wherein the compound of Formula (I) does not contain two P(=O)Alkyl$_2$. It may be provided that wherein the compound of Formula (I) does not contain two P(=O)Ph$_2$. It may be provided that wherein the compound of Formula (I) does not contain two P(=O)(CH$_3$)$_2$. It may be provided that wherein the compound of Formula (I) does not contain CN.

It may be provided that one or more of the following formulas are excluded from the scope of the Compound of Formula (I)

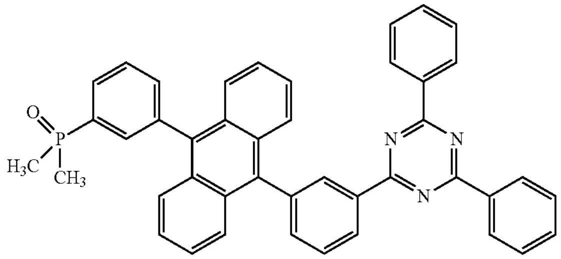
;

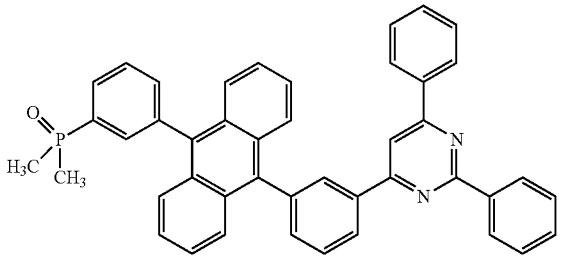
;

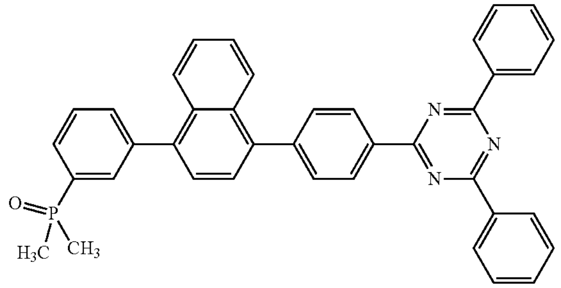
;

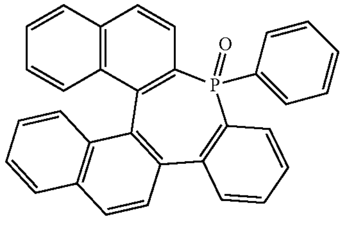
;

-continued

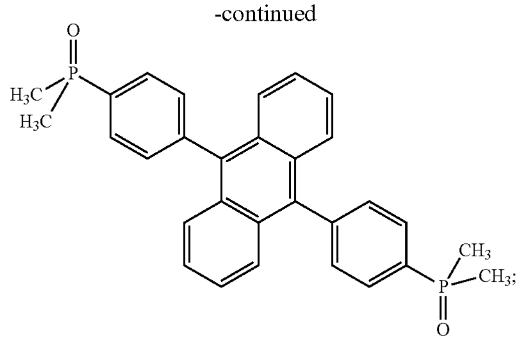

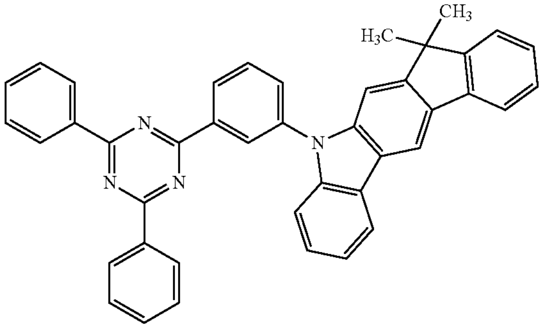
;

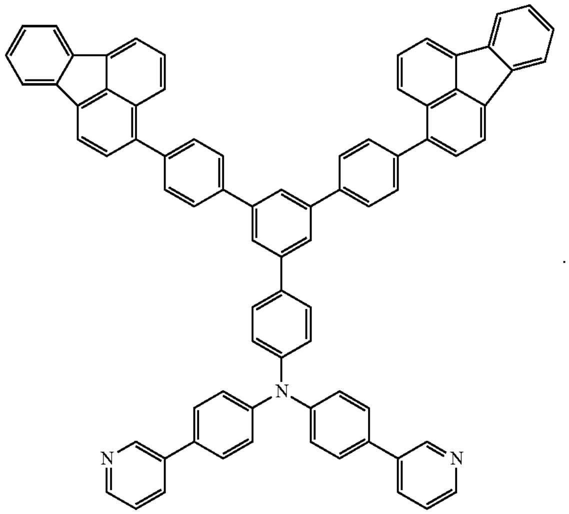
.

The compound of Formula (I) may comprise 6 to 14 aromatic or heteroaromatic rings, optionally 7 to 13 aromatic or heteroaromatic rings, optionally 7 to 12 aromatic or heteroaromatic rings, optionally 9 to 11 aromatic or heteroaromatic rings. In this regard, an aromatic, respectively heteroaromatic ring, is a single aromatic ring, for example a 6-membered aromatic ring such as phenyl, a 6-membered heteroaromatic ring, an example would be pyridyl, a 5-membered heteroaromatic ring an example would be pyrrolyl etc. In a system of condensed (hetero) aromatic rings, each ring is considered as a single ring in this regard. For example, naphthalene comprises two aromatic rings.

The molecular dipole moment, computed by the TURBOMOLE V6.5 program package using hybrid functional B3LYP and Gaussian 6-31G* basis set, of the compound of formula (I) may be ≥0 D and ≤4 D; alternatively ≥0 D and ≤3.5 D; alternatively ≥0 D and ≤3.0 D; alternatively ≥0 D and ≤2.5 D; alternatively ≥0 D and ≤2.0 D. In this regards, the dipole moment $|\vec{\mu}|$ of a molecule containing N atoms is given by:

$$\vec{\mu} = \sum_{i}^{N} q_i \vec{r_i}$$

$$|\vec{\mu}| = \sqrt{\mu_x^2 + \mu_y^2 + \mu_z^2}$$

where $q_i$ and $\vec{r_i}$ are the partial charge and position of atom i in the molecule. The dipole moment is determined by a semi-empirical molecular orbital method. The geometries of the molecular structures are optimized using the hybrid functional B3LYP with the 6-31G* basis set in the gas phase as implemented in the program package TURBOMOLE V6.5 (TURBOMOLE GmbH, Litzenhardtstrasse 19, 76135 Karlsruhe, Germany). If more than one conformation is viable, the conformation with the lowest total energy is selected to determine the bond lengths of the molecules.

In an embodiment the LUMO energy level of the compound of formula (I) in the absolute scale taking vacuum energy level as zero, computed by the TURBOMOLE V6.5 program package using hybrid functional B3LYP and Gaussian 6-31G* basis set, is in the range from −1.90 eV to −1.60 eV, preferably from −1.87 eV to −1.65 eV, preferably from −1.85 eV to −1.65 eV.

The compound of Formula (I) may be selected from the compounds A-1 to A-26 of the following Table 1.

TABLE 1

| Name | Structure | LUMO [eV] | HOMO [eV] | Dipole moment [D] |
|---|---|---|---|---|
| A-1 | 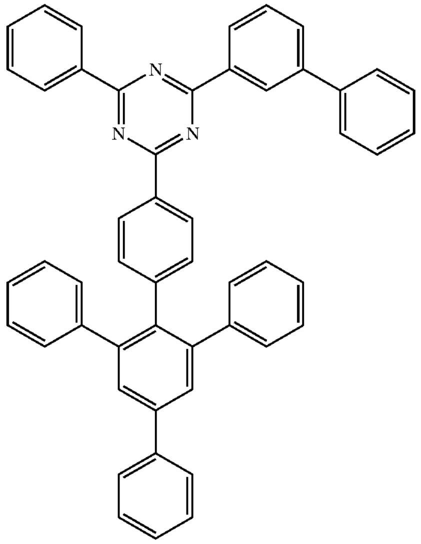 [SMILES: c1ccc(-c2cccc(-c3nc(-c4ccccc4)nc(-c4ccc(-c5c(-c6ccccc6)cc(-c6ccccc6)cc5-c5ccccc5)cc4)n3)c2)cc1] | −1.83 | −5.82 | 0.37 |
| A-2 | 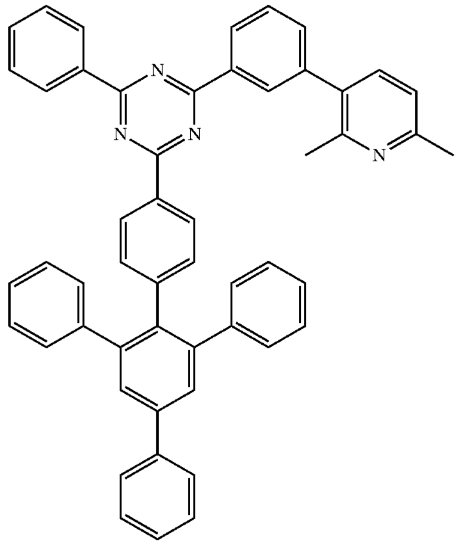 [SMILES: Cc1ccc(-c2cccc(-c3nc(-c4ccccc4)nc(-c4ccc(-c5c(-c6ccccc6)cc(-c6ccccc6)cc5-c5ccccc5)cc4)n3)c2)c(C)n1] | −1.86 | −5.83 | 1.61 |

TABLE 1-continued
| Name | Structure | LUMO [eV] | HOMO [eV] | Dipole moment [D] |
|---|---|---|---|---|
| A-3 | 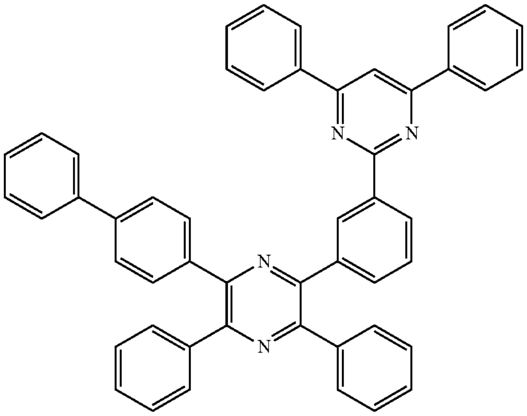 [SMILES: c1ccc(-c2ccc(-c3nc(-c4cccc(-c5nc(-c6ccccc6)cc(-c6ccccc6)n5)c4)c(-c4ccccc4)nc3-c3ccccc3)cc2)cc1] | −1.65 | −6.16 | 1.79 |
| A-4 | 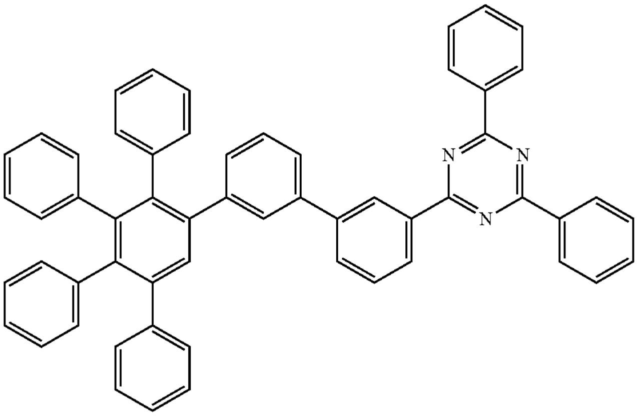 [SMILES: c1ccc(-c2nc(-c3ccccc3)nc(-c3cccc(-c4cccc(-c5cc(-c6ccccc6)c(-c6ccccc6)c(-c6ccccc6)c5-c5ccccc5)c4)c3)n2)cc1] | −1.76 | −5.83 | 1.03 |
| A-5 | 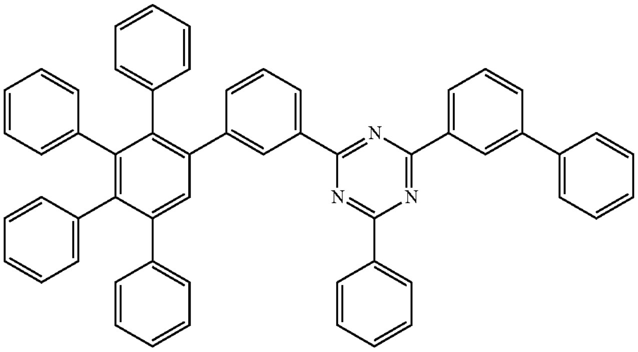 [SMILES: c1ccc(-c2cccc(-c3nc(-c4ccccc4)nc(-c4cccc(-c5cc(-c6ccccc6)c(-c6ccccc6)c(-c6ccccc6)c5-c5ccccc5)c4)n3)c2)cc1] | −1.78 | −5.82 | 0.65 |

TABLE 1-continued
| Name | Structure | LUMO [eV] | HOMO [eV] | Dipole moment [D] |
|---|---|---|---|---|
| A-6 | 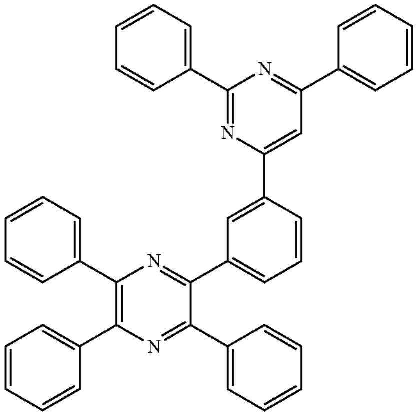 [SMILES: c1ccc(-c2cc(-c3cccc(-c4nc(-c5ccccc5)c(-c5ccccc5)nc4-c4ccccc4)c3)nc(-c3ccccc3)n2)cc1] | −1.69 | −5.88 | 2.45 |
| A-7 | 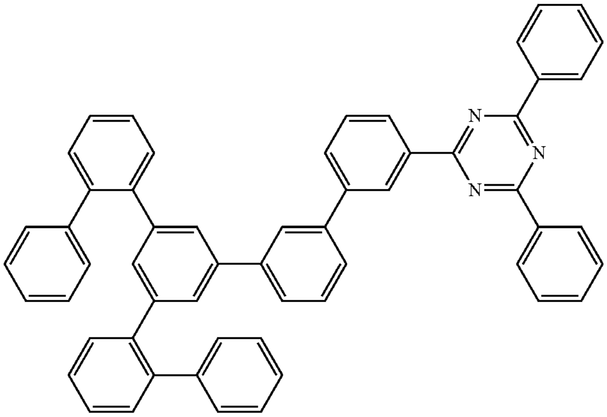 [SMILES: c1ccc(-c2nc(-c3ccccc3)nc(-c3cccc(-c4cccc(-c5cc(-c6ccccc6-c6ccccc6)cc(-c6ccccc6-c6ccccc6)c5)c4)c3)n2)cc1] | −1.83 | −5.81 | 0.1 |
| A-8 | 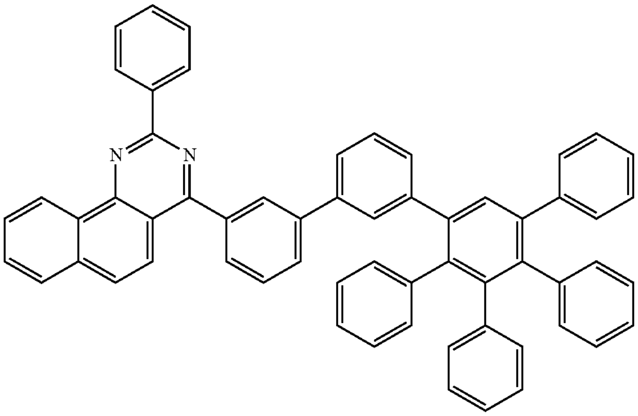 [SMILES: c1ccc(-c2nc(-c3cccc(-c4cccc(-c5cc(-c6ccccc6)c(-c6ccccc6)c(-c6ccccc6)c5-c5ccccc5)c4)c3)c3ccc4ccccc4c3n2)cc1] | −1.75 | −5.77 | 1.59 |
| A-9 | 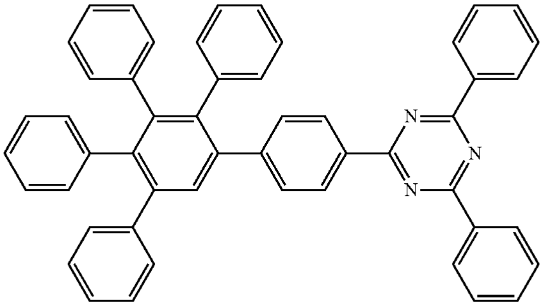 [SMILES: c1ccc(-c2nc(-c3ccccc3)nc(-c3ccc(-c4cc(-c5ccccc5)c(-c5ccccc5)c(-c5ccccc5)c4-c4ccccc4)cc3)n2)cc1] | −1.81 | −5.84 | 0.86 |

TABLE 1-continued
| Name | Structure | LUMO [eV] | HOMO [eV] | Dipole moment [D] |
|---|---|---|---|---|
| A-10 | 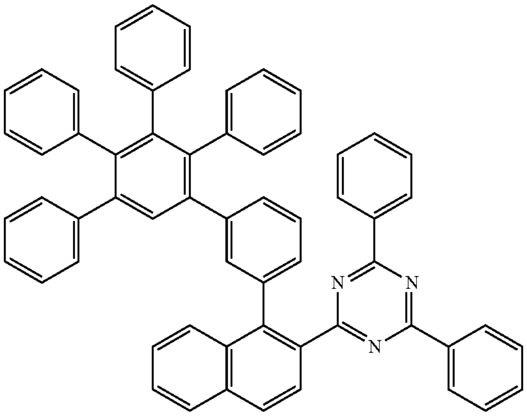 [SMILES: c1ccc(-c2nc(-c3ccccc3)nc(-c3ccc4ccccc4c3-c3cccc(-c4cc(-c5ccccc5)c(-c5ccccc5)c(-c5ccccc5)c4-c4ccccc4)c3)n2)cc1] | −1.78 | −5.72 | 0.51 |
| A-11 | 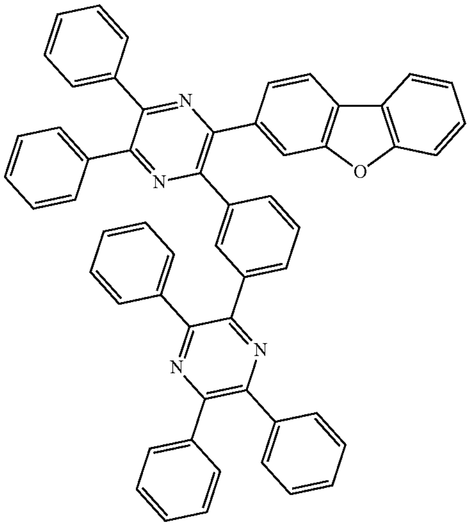 [SMILES: c1ccc(-c2nc(-c3ccccc3)c(-c3cccc(-c4nc(-c5ccccc5)c(-c5ccccc5)nc4-c4ccc5c(c4)oc4ccccc45)c3)nc2-c2ccccc2)cc1] | −1.69 | −5.53 | 0.59 |
| A-12 | 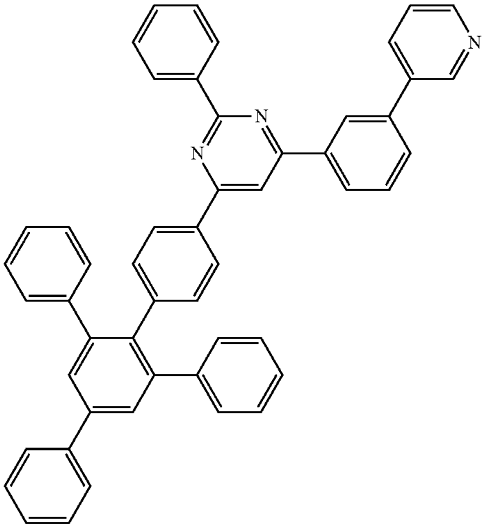 [SMILES: c1ccc(-c2cc(-c3ccccc3)c(-c3ccc(-c4cc(-c5cccc(-c6cccnc6)c5)nc(-c5ccccc5)n4)cc3)c(-c3ccccc3)c2)cc1] | −1.77 | −5.84 | 3.22 |

TABLE 1-continued
| Name | Structure | LUMO [eV] | HOMO [eV] | Dipole moment [D] |
|---|---|---|---|---|
| A-13 | 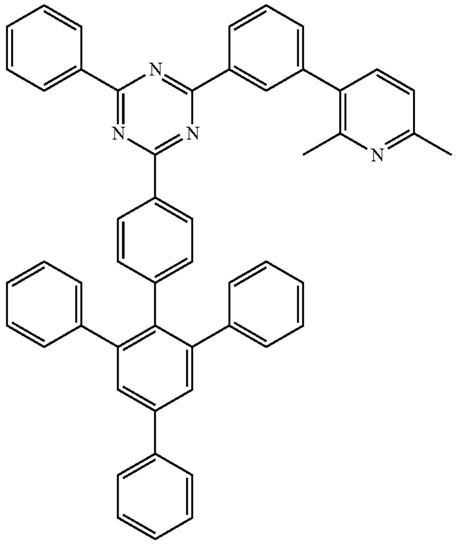 [SMILES: Cc1ccc(-c2cccc(-c3nc(-c4ccccc4)nc(-c4ccc(-c5c(-c6ccccc6)cc(-c6ccccc6)cc5-c5ccccc5)cc4)n3)c2)c(C)n1] | −1.74 | −5.80 | 2.08 |
| A-14 | 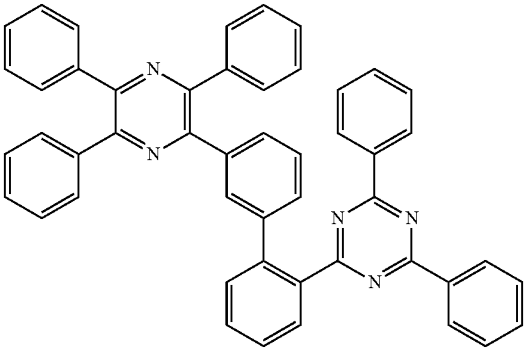 [SMILES: c1ccc(-c2nc(-c3ccccc3)nc(-c3ccccc3-c3cccc(-c4nc(-c5ccccc5)c(-c5ccccc5)nc4-c4ccccc4)c3)n2)cc1] | −1.79 | −5.54 | 0.39 |
| A-15 | 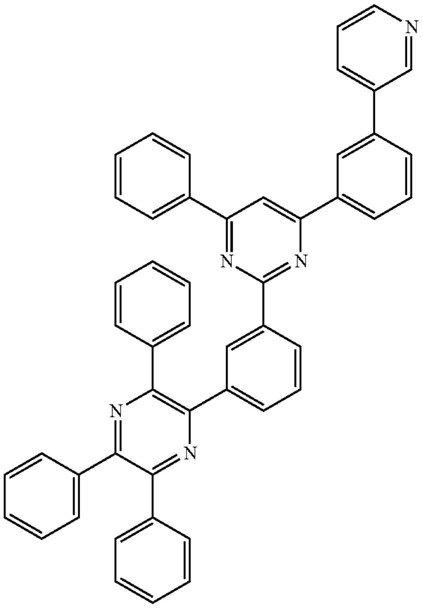 [SMILES: c1ccc(-c2cc(-c3cccc(-c4cccnc4)c3)nc(-c3cccc(-c4nc(-c5ccccc5)c(-c5ccccc5)nc4-c4ccccc4)c3)n2)cc1] | −1.78 | −5.60 | 1.54 |

TABLE 1-continued
| Name | Structure | LUMO [eV] | HOMO [eV] | Dipole moment [D] |
| --- | --- | --- | --- | --- |
| A-16 | 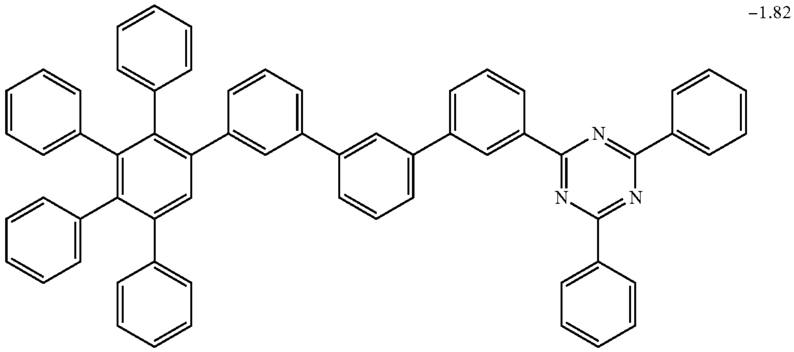 | −1.82 | −5.72 | 0.3 |
| A-17 | 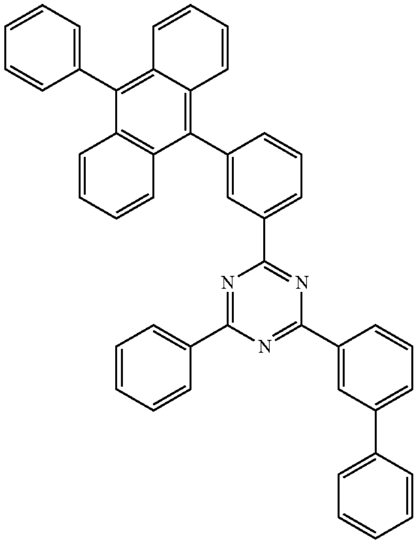 [SMILES: c1ccc(-c2cccc(-c3nc(-c4ccccc4)nc(-c4cccc(-c5c6ccccc6c(-c6ccccc6)c6ccccc56)c4)n3)c2)cc1] | −1.84 | −5.19 | 0.37 |
| A-18 | 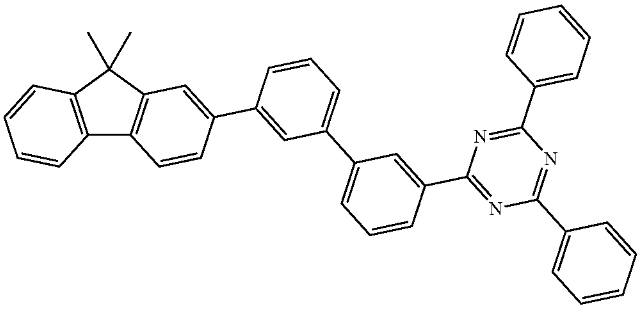 [SMILES: CC1(C)c2ccccc2-c2ccc(-c3cccc(-c4cccc(-c5nc(-c6ccccc6)nc(-c6ccccc6)n5)c4)c3)cc21] | −1.84 | −5.57 | 0.48 |

TABLE 1-continued
| Name | Structure | LUMO [eV] | HOMO [eV] | Dipole moment [D] |
|---|---|---|---|---|
| A-19 | 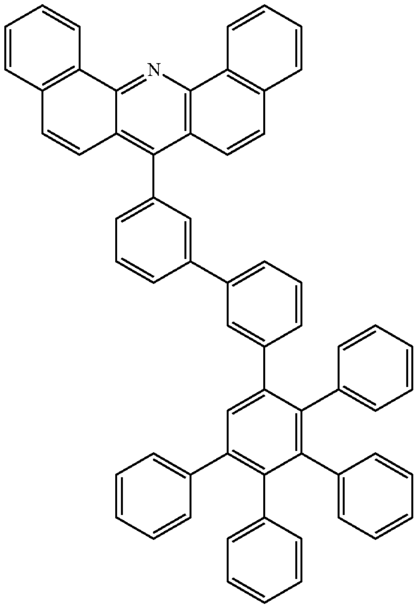 [SMILES: c1ccc(-c2cc(-c3cccc(-c4cccc(-c5c6ccc7ccccc7c6nc6c5ccc5ccccc56)c4)c3)c(-c3ccccc3)c(-c3ccccc3)c2-c2ccccc2)cc1] | −1.70 | −5.60 | 2.74 |
| A-20 | 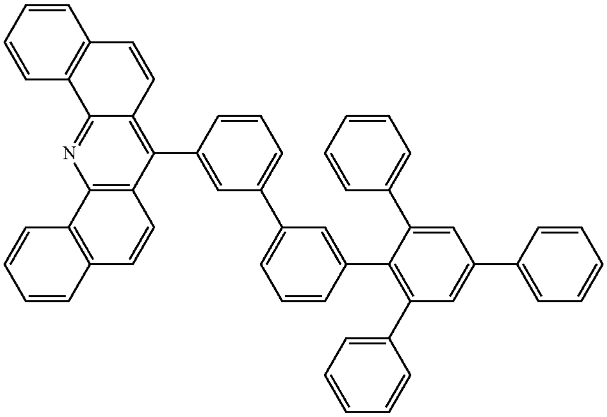 [SMILES: c1ccc(-c2cc(-c3ccccc3)c(-c3cccc(-c4cccc(-c5c6ccc7ccccc7c6nc6c5ccc5ccccc56)c4)c3)c(-c3ccccc3)c2)cc1] | −1.72 | −5.62 | 1.87 |
| A-21 | 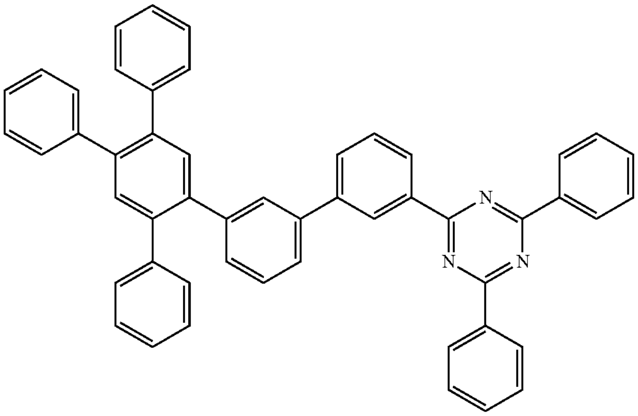 [SMILES: c1ccc(-c2nc(-c3ccccc3)nc(-c3cccc(-c4cccc(-c5cc(-c6ccccc6)c(-c6ccccc6)cc5-c5ccccc5)c4)c3)n2)cc1] | −1.82 | −5.67 | 0.22 |

TABLE 1-continued
| Name | Structure | LUMO [eV] | HOMO [eV] | Dipole moment [D] |
|---|---|---|---|---|
| A-22 | 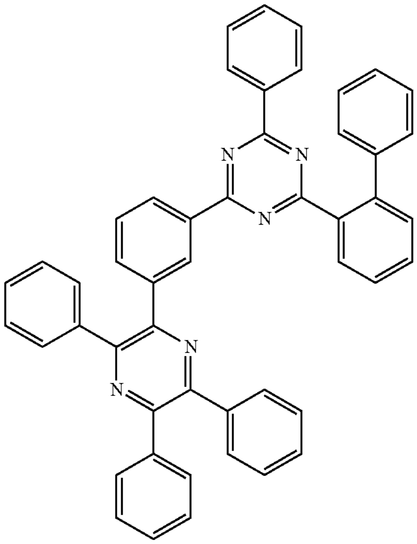 [SMILES: c1ccc(-c2nc(-c3cccc(-c4nc(-c5ccccc5)c(-c5ccccc5)nc4-c4ccccc4)c3)nc(-c3ccccc3-c3ccccc3)n2)cc1] | −1.78 | −5.79 | 0.25 |
| A-23 | 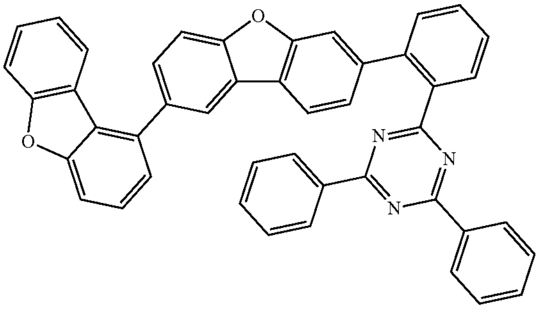 [SMILES: c1ccc(-c2nc(-c3ccccc3)nc(-c3ccccc3-c3ccc4c(c3)oc3ccc(-c5cccc6oc7ccccc7c56)cc34)n2)cc1] | −1.79 | −5.75 | 0.83 |
| A-24 | 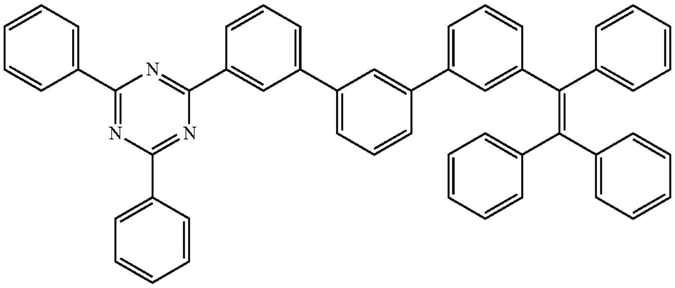 [SMILES: c1ccc(C(=C(c2ccccc2)c2cccc(-c3cccc(-c4cccc(-c5nc(-c6ccccc6)nc(-c6ccccc6)n5)c4)c3)c2)c2ccccc2)cc1] | −1.81 | −5.32 | 0.28 |
| A-25 | 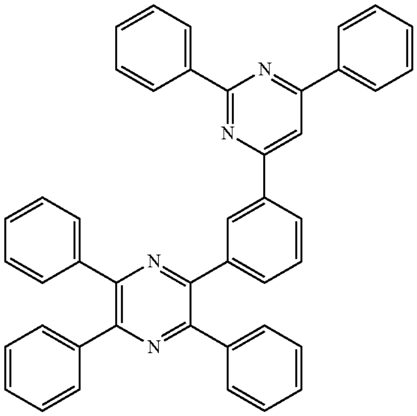 [SMILES: c1ccc(-c2cc(-c3cccc(-c4nc(-c5ccccc5)c(-c5ccccc5)nc4-c4ccccc4)c3)nc(-c3ccccc3)n2)cc1] | −1.69 | −5.88 | 2.45 |

TABLE 1-continued

| Name | Structure | LUMO [eV] | HOMO [eV] | Dipole moment [D] |
|---|---|---|---|---|
| A-26 | 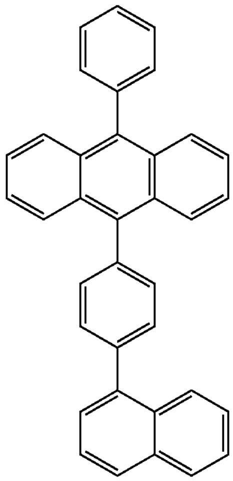 [SMILES: c1ccc(-c2c3ccccc3c(-c3ccc(-c4cccc5ccccc45)cc3)c3ccccc23)cc1] | n/a | n/a | |

In an embodiment the LUMO energy level of the compound of formula (I) in the absolute scale taking vacuum energy level as zero, computed by the TURBOMOLE V6.5 program package using hybrid functional B3LYP and Gaussian 6-31G* basis set, is in the range from −1.90 eV to −1.60 eV, preferably from −1.85 eV to −1.65 eV, even more preferred from −1.75 V to −1.85 eV, most preferred −1.76 eV to −1.84 eV.

The first electron transport layer may be arranged between the emission layer and the second electron transport layer. The first electron transport layer may be arranged in direct contact with the emission layer. The first electron transport layer may be arranged "contacting sandwiched" between the emission layer and the second electron transport layer.

The first electron transport layer may have a thickness of <50 nm, optionally between 1 and 30 nm, optionally between 1 and 10 nm, optionally between 1 and 5 nm.

Second Electron Transport Layer

The second electron transport layer comprises the compound of formula (I) and a compound of Formula (II)

$$(Ar^2)_m-(Z_k-G)_n \quad \text{(II).}$$

The compound of formula (I) may be a compound of formula (I) of one or more of the above embodiments defined above with respect to the first electron transport layer. The compound of formula (I) in the second electron transport layer is the same compound of formula (I) in the first electron transport layer. In other words, if, for example, a specific compound of formula (I) is chosen for use in the first electron transport layer than exactly the same specific compound of formula (I) is also used as compound of formula (I) in the second electron transport layer The second electron transport layer may consist of the compound of Formula (I) and the compound of Formula (II), that is, may consist of a mixture of the compound of Formula (I) and the compound of Formula (II). Alternatively, the second electron transport layer may consist of a mixture of the compound of the compound of Formula (I) and the compound of Formula (II) and one or more further compounds, provided that none of the further compounds is an electrical dopant. The second electron transport layer may comprise more than one compound of Formula (II) and more than one compound of Formula (I).

In the compound of Formula (II), the group "Z" is a spacer moiety connecting (if present, that is in case that k>1) the groups $Ar^2$ and G. In case that the compound of Formula (II) comprises more than one groups ($Z_k$-G) the groups may or may not independently comprise the spacer Z.

In Formula (II), m and n are independently 1 or 2. In Formula (II), m and n may be 1.

In Formula (II), k is independently 0, 1 or 2. In Formula (II), k may be independently 1 or 2.

$Ar^2$ may be independently selected from the group consisting of $C_2$ to $C_{39}$ heteroaryl and $C_6$ to $C_{54}$ aryl, optionally $C_2$ to $C_{36}$ heteroaryl and $C_6$ to $C_{48}$ aryl, optionally $C_3$ to $C_{30}$ heteroaryl and $C_6$ to $C_{42}$ aryl, optionally $C_3$ to $C_{27}$ heteroaryl and $C_6$ to $C_{36}$ aryl, optionally $C_3$ to $C_{24}$ heteroaryl and $C_6$ to $C_{30}$ aryl, and optionally $C_3$ to $C_{21}$ heteroaryl and $C_6$ to $C_{24}$ aryl.

$Ar^2$ may be independently selected from the group consisting of $C_2$ to $C_{39}$ N-containing heteroaryl and $C_6$ to $C_{54}$ aryl, optionally $C_2$ to $C_{36}$ N-containing heteroaryl and $C_6$ to $C_{48}$ aryl, optionally $C_3$ to $C_{30}$ N-containing heteroaryl and $C_6$ to $C_{42}$ aryl, optionally $C_3$ to $C_{27}$ N-containing heteroaryl and $C_6$ to $C_{36}$ aryl, optionally $C_3$ to $C_{24}$ N-containing heteroaryl and $C_6$ to $C_{30}$ aryl, and optionally $C_3$ to $C_{21}$ N-containing heteroaryl and $C_6$ to $C_{24}$ aryl. In this regard, it may be provided that a respective N-containing heteroaryl comprises one or more N-atoms as the only heteroatom(s).

$Ar^2$ may comprise at least two annelated 5- or 6-membered rings.

$Ar^2$ may be independently selected from the group consisting of pyridinyl, triazinyl, 1,2-diazinyl, 1,3-diazinyl, 1,4-diazinyl, quinazolinyl, benzoquinazolinyl, benzimidazolyl, quinolinyl, benzoquinolinyl benzoacridinyl, dibenzoacridinyl, fluoranthenyl, anthracenyl, naphthyl, triphenylenyl, phenathrolinyl, and dinaphthofuranyl which may be substituted or unsubstituted, respectively.

$Ar^2$ may be independently selected from the group consisting of triazinyl, 1,3-diazinyl, dibenzoacridinyl, anthracenyl, and naphthyl, which may be substituted or unsubstituted, respectively.

$Ar^2$ may be independently selected from the group consisting of triazinyl and 1,3-diazinyl, which may be substituted or unsubstituted, respectively.

$Ar^2$ may be selected independently from one of the following groups

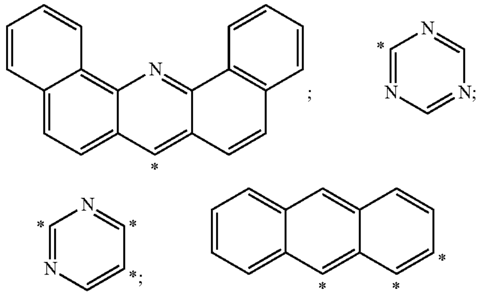

wherein the asterisk symbol "*" represents the binding position for binding the to Z, respectively; and which may be substituted or unsubstituted, respectively.

$Ar^2$ may be selected independently from one of the following groups

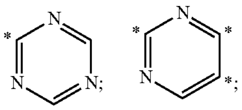

wherein the asterisk symbol "*" represents the binding position for binding the to Z, respectively; and which may be substituted or unsubstituted, respectively.

In case that Are is substituted, each substituent on $Ar^2$ may be independently selected from the group consisting of phenyl, naphthyl, especially β-naphthyl, pyridinyl and biphenyl-yl which may be substituted or unsubstituted, respectively.

In case that $Ar^2$ is substituted, each substituent on $Ar^2$ may be independently selected from the group consisting of phenyl, naphthyl, especially phenyl.

Z may be independently selected from $C_6$ to $C_{26}$ aryl which may be substituted or unsubstituted.

$Ar^2$ (including all substituents) may be selected from

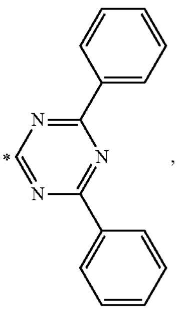

, or

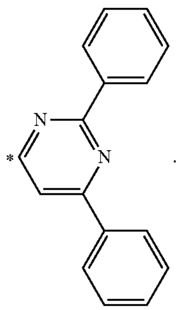

.

Z may be selected from the group consisting of phenylene, naphthylene, phenylene-naphthylene, phenylene-naphthylene-phenylene; phenylene-anthracenylene-phenylene; biphenylene and terphenylene which may be substituted or unsubstituted, respectively.

Z may be selected independently from one of the following groups

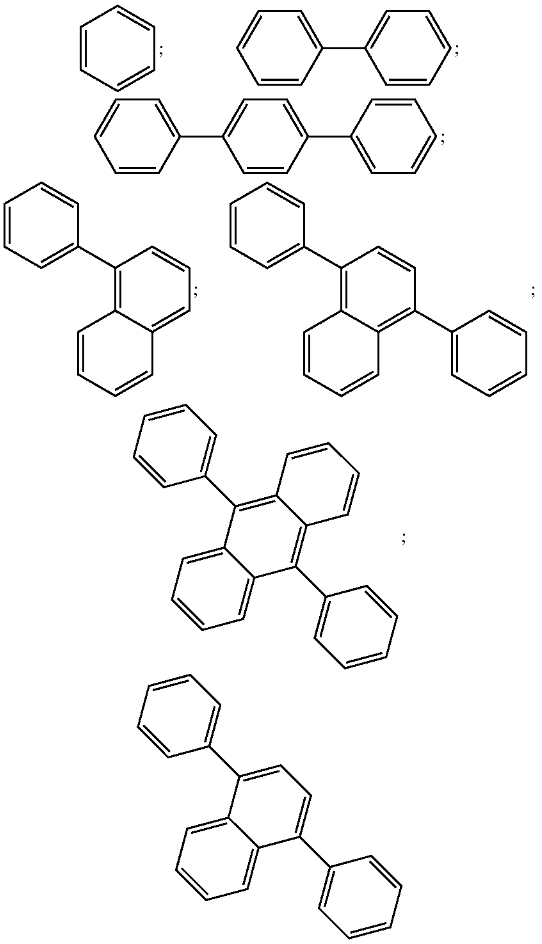

wherein the binding positions for binding to $Ar^2$ and G can be freely selected.

Z may be selected independently from one of the following groups

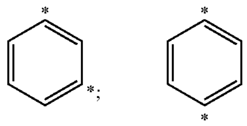 [SMILES: c1ccccc1 ; c1ccccc1]

wherein the asterisk symbol "*" represents the binding position for binding to $Ar^2$ and G, respectively.

In case that Z is substituted, each substituent on Z may be independently selected from the group consisting of phenyl and $C_1$ to $C_4$ alkyl.

G is chosen so that the dipole moment, computed by the TURBOMOLE V6.5 program package using hybrid functional B3LYP and Gaussian 6-31G* basis set, of a compound G-phenyl is ≥1 D and ≤7 D. The unit for the dipole moment "Debye" is abbreviated with the symbol "D". The inventors have found that it is advantageous if the compound of Formula (II) comprises a group having a certain polarity, that is a specific dipole moment within the above range or the ranges mentioned below. It was further found that it is still advantageous that the compound of Formula (II) comprises such a polar group (first polar group) if the compound of Formula (II) comprises, in addition, a further polar group (second polar group) which is suitable to balance the dipole moment of the first polar group in a way that the total dipole moment of the compound of Formula (II) is low, for example, in case that the compound is a symmetrical molecule comprising a first polar group and a second polar group which are the same, the dipole moment could be 0 Debye. Therefore, the compound of Formula (II) cannot be characterized be referring to the total dipole moment of the compound. As a consequence, reference is made instead to an artificial compound comprising the polar group "G" and an unpolar group "phenyl". In this regards, the dipole moment $|\vec{\mu}|$ of a compound containing N atoms is given by:

$$\vec{\mu} = \sum_{i}^{N} q_i \vec{r_i}$$

$$|\vec{\mu}| = \sqrt{\mu_x^2 + \mu_y^2 + \mu_z^2}$$

where $q_i$ and $\vec{r_i}$ are the partial charge and position of atom i in the molecule. The dipole moment is determined by a semi-empirical molecular orbital method. The geometries of the molecular structures are optimized using the hybrid functional B3LYP with the 6-31G* basis set in the gas phase as implemented in the program package TURBOMOLE V6.5 (TURBOMOLE GmbH, Litzenhardtstrasse 19, 76135 Karlsruhe, Germany). If more than one conformation is viable, the conformation with the lowest total energy is selected to determine the bond lengths of the molecules. In this regard, the entire moiety G encompasses all possible substituents which may be comprised.

G may be selected so that the dipole moment of a compound G-phenyl is >1 D; optionally ≥2 D; optionally ≥2.5 D, optionally ≥2.5 D, optionally ≥3 D, and optionally ≥3.5 D. G may be chosen so that the dipole moment of a compound G-phenyl is ≤7 D, optionally ≤6.5 D, optionally ≤6 D, optionally ≤5.5 D, optionally ≤5 D. If more than one conformational isomer of the compound G-phenyl is viable then the average value of the dipole moments of the conformational isomers of G-phenyl is selected to be in this range. Conformational isomerism is a form of stereoisomerism in which the isomers can be interconverted just by rotations about formally single bonds.

By selecting the G such that the dipole moment of a compound G-phenyl lies in the above range it is provided that the electron injection from the adjacent, distinct electron injection layer (EIL) is improved and voltage of the OLED device may decrease and the cd/A efficiency may increase.

Exemplary compounds "G-phenyl" are listed in the following Table 2, wherein the moiety

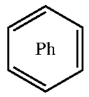

in the respective compound specifies the "phenyl" part in "G-phenyl"

TABLE 2

| | Structure of G-phenyl | HOMO [eV] | LUMO [eV] | Dipole moment [D] |
|---|---|---|---|---|
| G-phenyl-1 | 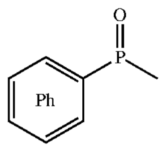 | −6.88 | −0.62 | 4.16 |
| G-phenyl-2 | 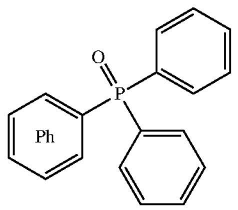 [SMILES: O=P(c1ccccc1)(c1ccccc1)c1ccccc1] | −6.74 | −0.86 | 4.19 |
| G-phenyl-3 | 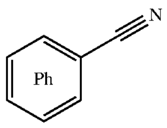 | −8.97 | 1.00 | 4.56 |

TABLE 2-continued
| | Structure of G-phenyl | HOMO [eV] | LUMO [eV] | Dipole moment [D] |
|---|---|---|---|---|
| G-phenyl-4 | 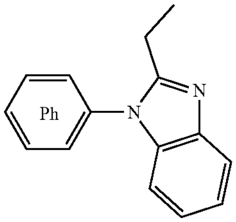 [SMILES: CCc1nc2ccccc2n1-c1ccccc1] | −5.82 | −0.62 | 3.97 |
| G-phenyl-5 | 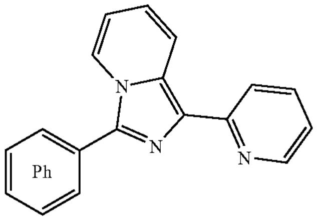 [SMILES: c1ccc(-c2nc(-c3ccccn3)c3ccccn23)cc1] | −5.04 | −1.18 | 3.86 |
| G-phenyl-6 | 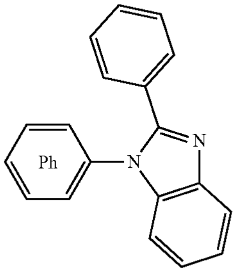 [SMILES: c1ccc(-c2nc3ccccc3n2-c2ccccc2)cc1] 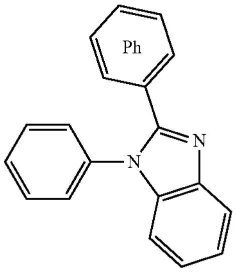 [SMILES: c1ccc(-c2nc3ccccc3n2-c2ccccc2)cc1] | −5.70 | −1.02 | 3.70 |
| G-phenyl-7 | 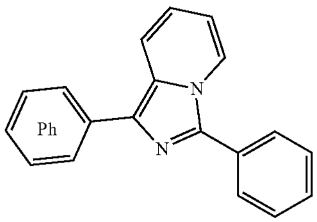 [SMILES: c1ccc(-c2nc(-c3ccccc3)n3ccccc23)cc1] 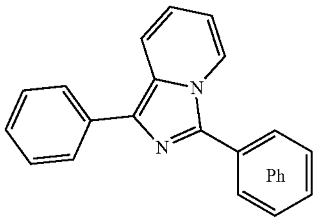 [SMILES: c1ccc(-c2nc(-c3ccccc3)n3ccccc23)cc1] | −4.92 | −1.11 | 3.11 |

TABLE 2-continued
| | Structure of G-phenyl | HOMO [eV] | LUMO [eV] | Dipole moment [D] |
|---|---|---|---|---|
| G-phenyl-8 | 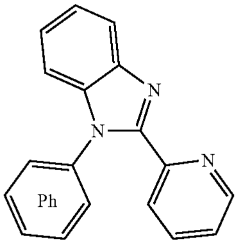 [SMILES: c1ccc(-n2c(-c3ccccn3)nc3ccccc32)cc1] | −5.86 | −1.19 | 5.14 |
| G-phenyl-9 | 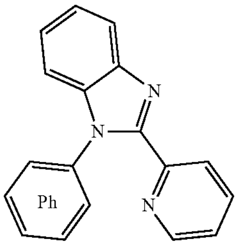 [SMILES: c1ccc(-n2c(-c3ccccn3)nc3ccccc32)cc1] | −5.76 | −1.33 | 2.61 |
| G-phenyl-10 | 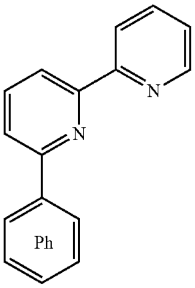 [SMILES: c1ccc(-c2cccc(-c3ccccn3)n2)cc1] | −5.96 | −1.35 | 2.69 |
| G-phenyl-11 | 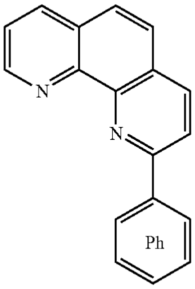 [SMILES: c1ccc(-c2ccc3ccc4cccnc4c3n2)cc1] | −5.83 | −1.59 | 2.67 |
| G-phenyl-12 | 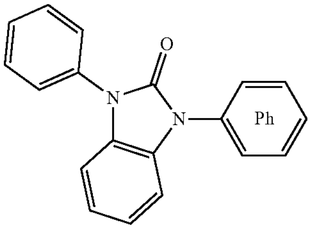 [SMILES: O=c1n(-c2ccccc2)c2ccccc2n1-c1ccccc1] | −5.54 | −0.48 | 2.12 |
| G-phenyl-13 | 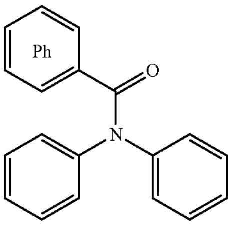 [SMILES: O=C(c1ccccc1)N(c1ccccc1)c1ccccc1] | −5.79 | −1.06 | 3.33 |

TABLE 2-continued
| | Structure of G-phenyl | HOMO [eV] | LUMO [eV] | Dipole moment [D] |
|---|---|---|---|---|
| | 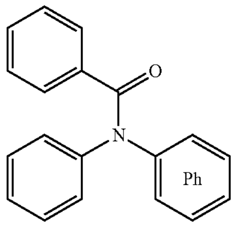 [SMILES: O=C(c1ccccc1)N(c1ccccc1)c1ccccc1] | | | |
| G-phenyl-14 | 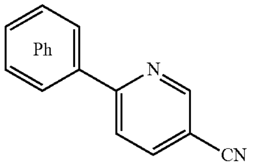 [SMILES: N#Cc1ccc(-c2ccccc2)nc1] | −6.59 | −2.08 | 4.79 |
| G-phenyl-15 | 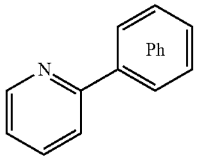 [SMILES: c1ccc(-c2ccccn2)cc1] | −6.12 | −1.13 | 1.71 |
| G-phenyl-16 | 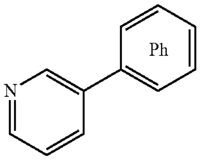 [SMILES: c1ccc(-c2cccnc2)cc1] | −6.32 | −0.98 | 2.31 |
| G-phenyl-17 | 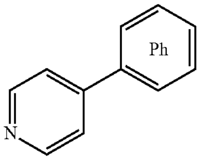 [SMILES: c1ccc(-c2ccncc2)cc1] | −6.57 | −1.19 | 2.75 |
| G-phenyl-18 | 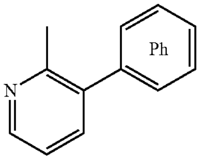 | −6.28 | −0.77 | 2.00 |
| G-phenyl-19 | 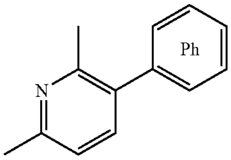 | −6.12 | −0.69 | 1.50 |
| G-phenyl-20 | 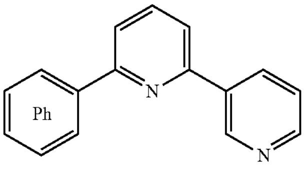 [SMILES: c1ccc(-c2cccc(-c3cccnc3)n2)cc1] | −6.10 | −1.41 | 3.51 |

TABLE 2-continued
| | Structure of G-phenyl | HOMO [eV] | LUMO [eV] | Dipole moment [D] |
|---|---|---|---|---|
| G-phenyl-21 | 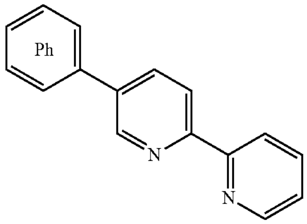 [SMILES: c1ccc(-c2ccc(-c3ccccn3)nc2)cc1] | −6.10 | −1.38 | 2.98 |
| G-phenyl-22 | 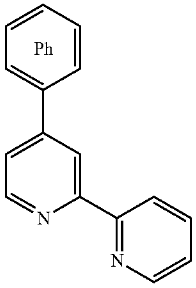 [SMILES: c1ccc(-c2ccnc(-c3ccccn3)c2)cc1] | −6.47 | −1.31 | 3.46 |
| G-phenyl-23 | 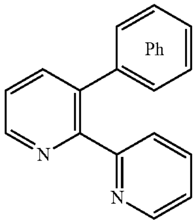 [SMILES: c1ccc(-c2cccnc2-c2ccccn2)cc1] | −6.19 | −1.03 | 3.02 |
| G-phenyl-24 | 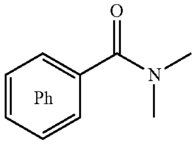 | −6.35 | −0.17 | 3.62 |
| G-phenyl-25 | 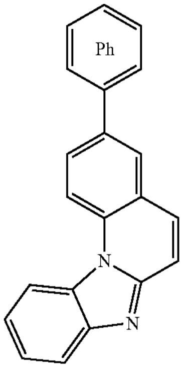 [SMILES: c1ccc(-c2ccc3c(ccc4nc5ccccc5n43)c2)cc1] | −5.54 | −1.58 | 3.49 |

TABLE 2-continued
| | Structure of G-phenyl | HOMO [eV] | LUMO [eV] | Dipole moment [D] |
|---|---|---|---|---|
| G-phenyl-26 | 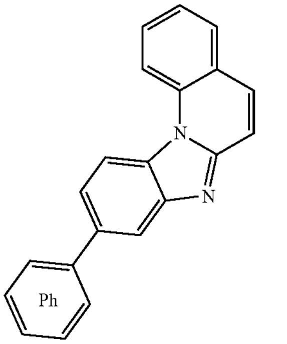 [SMILES: c1ccc(-c2ccc3c(c2)nc2ccc4ccccc4n23)cc1] | −5.60 | −1.61 | 3.39 |
| G-phenyl-27 | 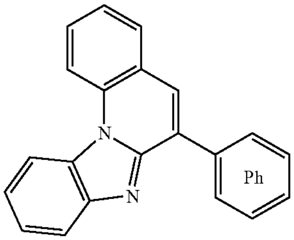 [SMILES: c1ccc(-c2cc3ccccc3n3c2nc2ccccc23)cc1] | −5.48 | −1.67 | 2.76 |
| G-phenyl-28 | 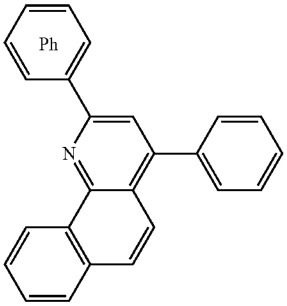 [SMILES: c1ccc(-c2cc(-c3ccccc3)c3ccc4ccccc4c3n2)cc1] 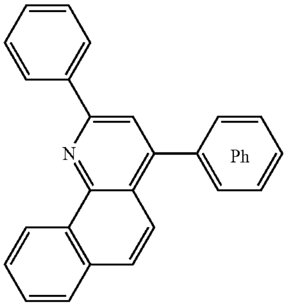 [SMILES: c1ccc(-c2cc(-c3ccccc3)c3ccc4ccccc4c3n2)cc1] | −5.63 | −1.56 | 1.84 |
| G-phenyl-29 | 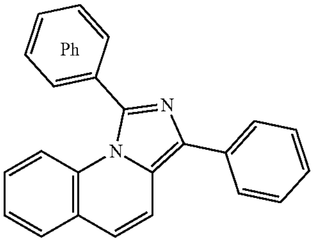 [SMILES: c1ccc(-c2nc(-c3ccccc3)n3c2ccc2ccccc23)cc1] | −5.02 | −1.39 | 2.96 |

TABLE 2-continued
| | Structure of G-phenyl | HOMO [eV] | LUMO [eV] | Dipole moment [D] |
|---|---|---|---|---|
| | 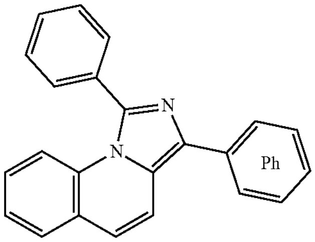 [SMILES: c1ccc(-c2nc(-c3ccccc3)n3c2ccc2ccccc23)cc1] | | | |
| G-phenyl-30 | 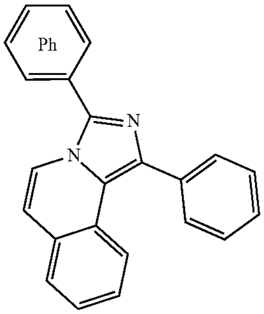 [SMILES: c1ccc(-c2nc(-c3ccccc3)n3ccc4ccccc4c23)cc1] 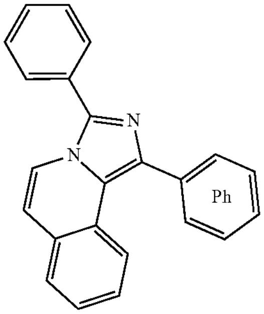 [SMILES: c1ccc(-c2nc(-c3ccccc3)n3ccc4ccccc4c23)cc1] | −5.08 | −1.13 | 2.70 |
| G-phenyl-31 | 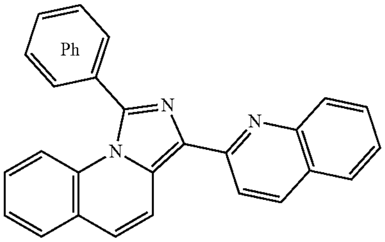 [SMILES: c1ccc(-c2nc(-c3ccc4ccccc4n3)c3ccc4ccccc4n23)cc1] | −5.07 | −1.58 | 2.29 |
| G-phenyl-32 | 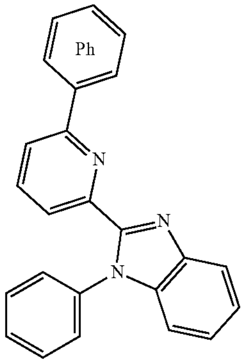 [SMILES: c1ccc(-c2cccc(-c3nc4ccccc4n3-c3ccccc3)n2)cc1] | −5.81 | −1.19 | 4.61 |

TABLE 2-continued
| | Structure of G-phenyl | HOMO [eV] | LUMO [eV] | Dipole moment [D] |
|---|---|---|---|---|
| | 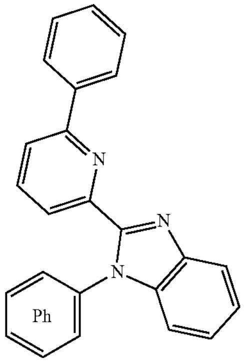 [SMILES: c1ccc(-c2cccc(-c3nc4ccccc4n3-c3ccccc3)n2)cc1] | | | |
| G-phenyl-33 | 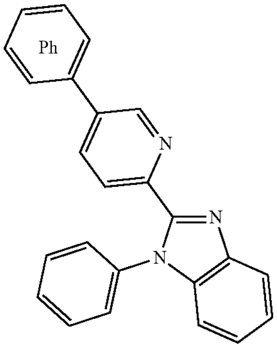 [SMILES: c1ccc(-c2ccc(-c3nc4ccccc4n3-c3ccccc3)nc2)cc1] | −5.78 | −1.42 | 5.20 |
| | 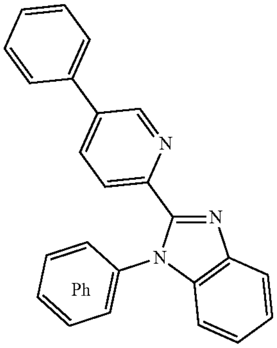 [SMILES: c1ccc(-c2ccc(-c3nc4ccccc4n3-c3ccccc3)nc2)cc1] | | | |
| G-phenyl-34 | 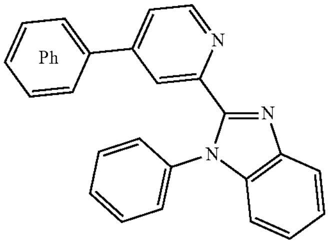 [SMILES: c1ccc(-c2ccnc(-c3nc4ccccc4n3-c3ccccc3)c2)cc1] | −5.84 | −1.38 | 5.63 |

TABLE 2-continued
| | Structure of G-phenyl | HOMO [eV] | LUMO [eV] | Dipole moment [D] |
|---|---|---|---|---|
| | 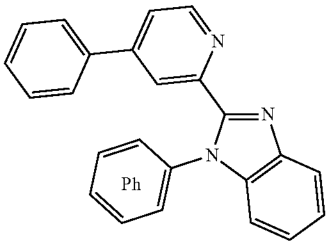 [SMILES: c1ccc(-c2ccnc(-c3nc4ccccc4n3-c3ccccc3)c2)cc1] | | | |
| G-phenyl-35 | 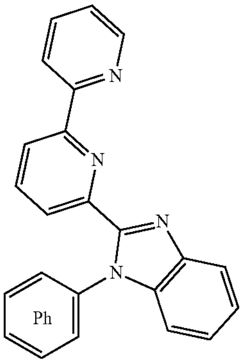 [SMILES: c1ccc(-n2c(-c3cccc(-c4ccccn4)n3)nc3ccccc32)cc1] | −5.83 | −1.35 | 3.37 |
| G-phenyl-36 | 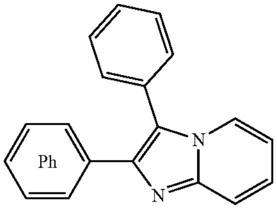 [SMILES: c1ccc(-c2nc3ccccn3c2-c2ccccc2)cc1] | −5.37 | −0.98 | 3.32 |
| | 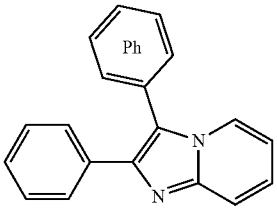 [SMILES: c1ccc(-c2nc3ccccn3c2-c2ccccc2)cc1] | | | |
| G-phenyl-37 | 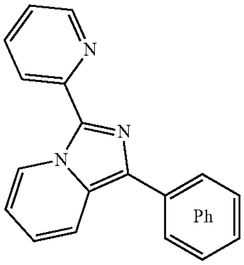 [SMILES: c1ccc(-c2nc(-c3ccccn3)n3ccccc23)cc1] | −4.94 | −1.15 | 1.81 |

TABLE 2-continued
| | Structure of G-phenyl | HOMO [eV] | LUMO [eV] | Dipole moment [D] |
|---|---|---|---|---|
| G-phenyl-38 | 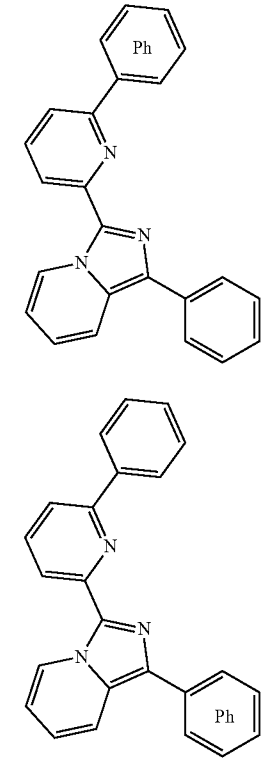 | −4.94 | −1.16 | 2.12 |
| G-phenyl-39 | 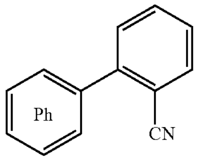 [SMILES: N#Cc1ccccc1-c1ccccc1] | −6.52 | −1.47 | 4.17 |
| G-phenyl-40 | 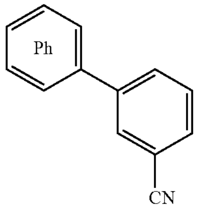 [SMILES: N#Cc1cccc(-c2ccccc2)c1] | −6.56 | −1.46 | 4.85 |
| G-phenyl-41 | 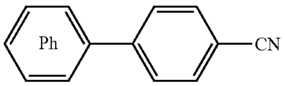 [SMILES: N#Cc1ccc(-c2ccccc2)cc1] | −6.53 | −1.67 | 5.27 |
| G-phenyl-42 | 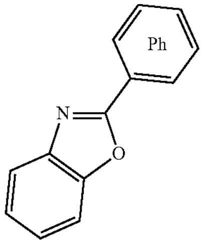 [SMILES: c1ccc(-c2nc3ccccc3o2)cc1] | −6.00 | −1.43 | 1.14 |

TABLE 2-continued
| | Structure of G-phenyl | HOMO [eV] | LUMO [eV] | Dipole moment [D] |
|---|---|---|---|---|
| G-phenyl-43 | 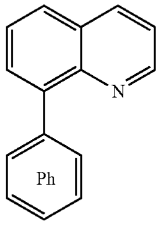 [SMILES: c1ccc(-c2cccc3cccnc23)cc1] | −5.84 | −1.47 | 1.94 |
| G-phenyl-44 | 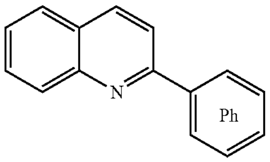 [SMILES: c1ccc(-c2ccc3ccccc3n2)cc1] | −5.97 | −1.56 | 1.53 |
| G-phenyl-45 | 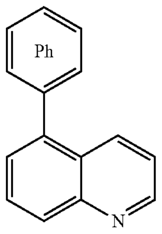 [SMILES: c1ccc(-c2cccc3ncccc23)cc1] | −6.01 | −1.42 | 2.31 |
| G-phenyl-46 | 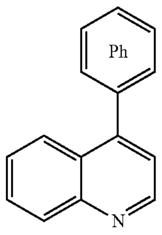 [SMILES: c1ccc(-c2ccnc3ccccc23)cc1] | −6.09 | −1.47 | 2.57 |
| G-phenyl-47 | 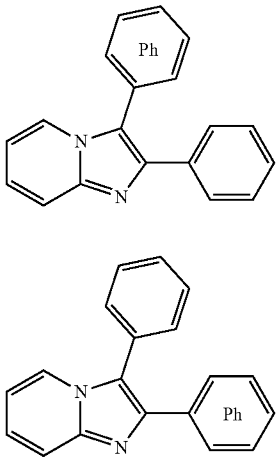 | −5.37 | −0.98 | 3.32 |

TABLE 2-continued
| | Structure of G-phenyl | HOMO [eV] | LUMO [eV] | Dipole moment [D] |
|---|---|---|---|---|
| G-phenyl-48 | 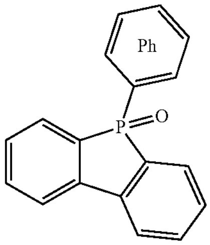 [SMILES: O=P1(c2ccccc2)c2ccccc2-c2ccccc21] | −6.22 | −1.47 | 4.49 |
| G-phenyl-49 | 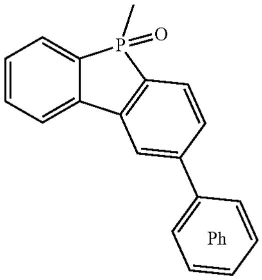 [SMILES: CP1(=O)c2ccccc2-c2cc(-c3ccccc3)ccc21] | −6.15 | −1.55 | 4.79 |
| G-phenyl-50 | 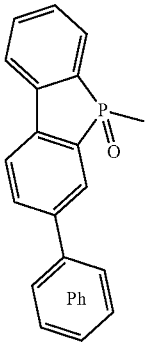 [SMILES: CP1(=O)c2ccccc2-c2ccc(-c3ccccc3)cc21] | −5.95 | −1.58 | 4.45 |
| G-phenyl-51 | 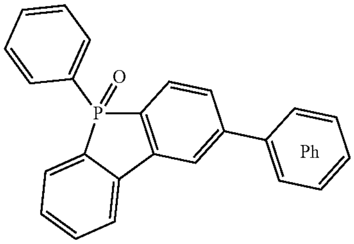 [SMILES: O=P1(c2ccccc2)c2ccccc2-c2cc(-c3ccccc3)ccc21] | −6.10 | −1.57 | 4.65 |
| | 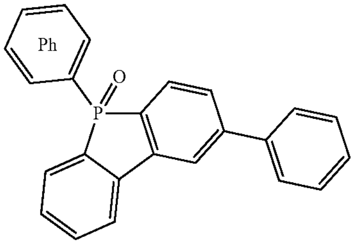 [SMILES: O=P1(c2ccccc2)c2ccccc2-c2cc(-c3ccccc3)ccc21] | | | |

TABLE 2-continued
| | Structure of G-phenyl | HOMO [eV] | LUMO [eV] | Dipole moment [D] |
|---|---|---|---|---|
| G-phenyl-52 | 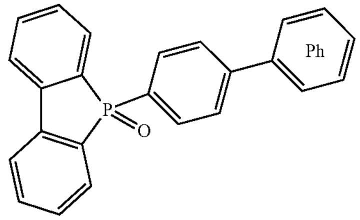 [SMILES: O=P1(c2ccc(-c3ccccc3)cc2)c2ccccc2-c2ccccc21] | −6.14 | −1.47 | 4.59 |
| G-phenyl-53 | 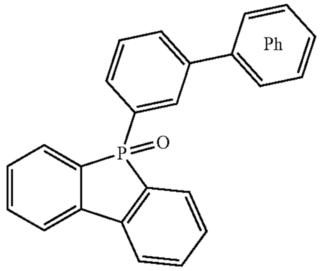 [SMILES: O=P1(c2cccc(-c3ccccc3)c2)c2ccccc2-c2ccccc21] | −6.12 | −1.48 | 4.26 |
| G-phenyl-54 | 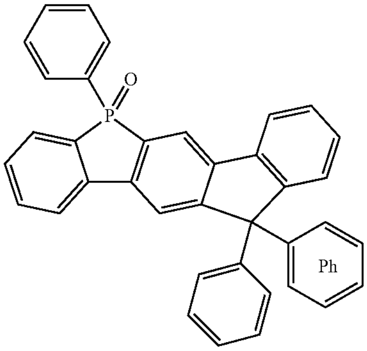 [SMILES: O=P1(c2ccccc2)c2ccccc2-c2cc3c(cc21)-c1ccccc1C3(c1ccccc1)c1ccccc1] | −5.71 | −1.60 | 4.55 |
| | 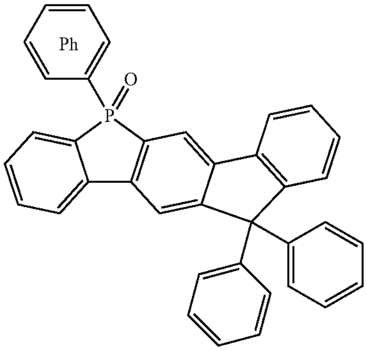 [SMILES: O=P1(c2ccccc2)c2ccccc2-c2cc3c(cc21)-c1ccccc1C3(c1ccccc1)c1ccccc1] | | | |
| G-phenyl-55 | 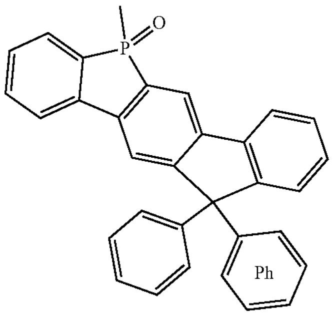 [SMILES: CP1(=O)c2ccccc2-c2cc3c(cc21)-c1ccccc1C3(c1ccccc1)c1ccccc1] | −5.74 | −1.60 | 4.73 |

TABLE 2-continued
| | Structure of G-phenyl | HOMO [eV] | LUMO [eV] | Dipole moment [D] |
|---|---|---|---|---|
| G-phenyl-56 | 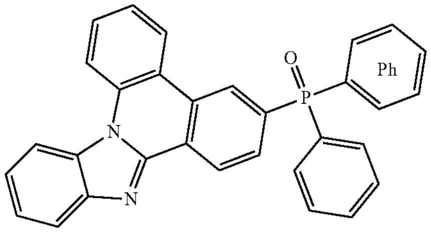 [SMILES: O=P(c1ccccc1)(c1ccccc1)c1ccc2c(c1)c1ccccc1n1c3ccccc3nc21] | −5.75 | −1.62 | −6.70 |
| G-phenyl-57 | 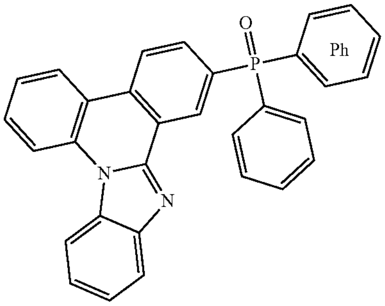 [SMILES: O=P(c1ccccc1)(c1ccccc1)c1ccc2c3ccccc3n3c4ccccc4nc3c2c1] | −5.68 | −1.61 | 6.58 |
| G-phenyl-58 | 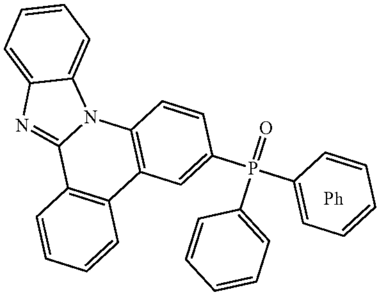 [SMILES: O=P(c1ccccc1)(c1ccccc1)c1ccc2c(c1)c1ccccc1c1nc3ccccc3n21] | −5.71 | −1.45 | 4.34 |
| G-phenyl-59 | 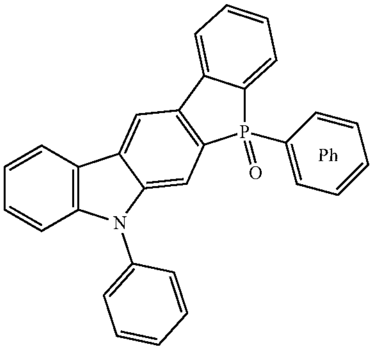 [SMILES: O=P1(c2ccccc2)c2ccccc2-c2cc3c4ccccc4n(-c4ccccc4)c3cc21] | −5.42 | −1.34 | 4.33 |
| | 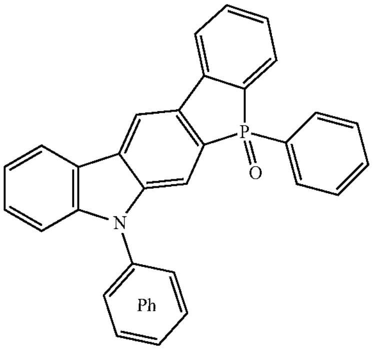 [SMILES: O=P1(c2ccccc2)c2ccccc2-c2cc3c4ccccc4n(-c4ccccc4)c3cc21] | | | |

TABLE 2-continued
| | Structure of G-phenyl | HOMO [eV] | LUMO [eV] | Dipole moment [D] |
|---|---|---|---|---|
| G-phenyl-60 | 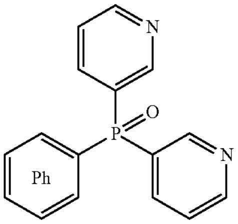 [SMILES: O=P(c1ccccc1)(c1cccnc1)c1cccnc1] | −6.89 | −1.25 | 3.44 |
| G-phenyl-61 | 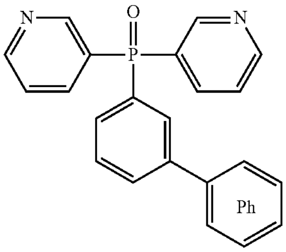 [SMILES: O=P(c1cccnc1)(c1cccnc1)c1cccc(-c2ccccc2)c1] | −6.32 | −1.28 | 3.20 |
| G-phenyl-62 | 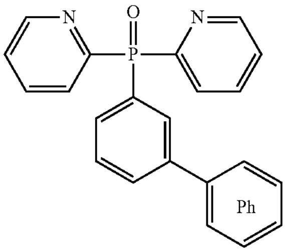 [SMILES: O=P(c1cccc(-c2ccccc2)c1)(c1ccccn1)c1ccccn1] | −5.96 | −1.24 | 4.42 |
| G-phenyl-63 | 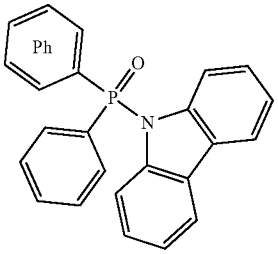 [SMILES: O=P(c1ccccc1)(c1ccccc1)n1c2ccccc2c2ccccc21] | −5.63 | −0.96 | 4.10 |
| G-phenyl-64 | 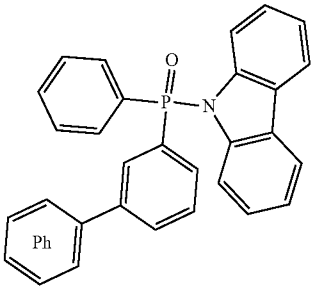 [SMILES: O=P(c1ccccc1)(c1cccc(-c2ccccc2)c1)n1c2ccccc2c2ccccc21] | −5.64 | −1.05 | 4.23 |

TABLE 2-continued
| | Structure of G-phenyl | HOMO [eV] | LUMO [eV] | Dipole moment [D] |
|---|---|---|---|---|
| | 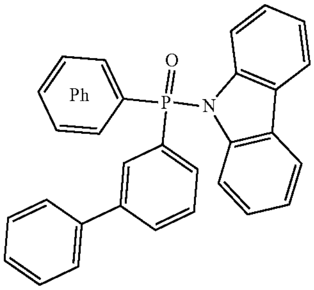 [SMILES: O=P(c1ccccc1)(c1cccc(-c2ccccc2)c1)n1c2ccccc2c2ccccc21] | | | |
| G-phenyl-65 | 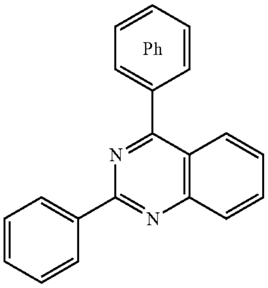 [SMILES: c1ccc(-c2nc(-c3ccccc3)c3ccccc3n2)cc1] 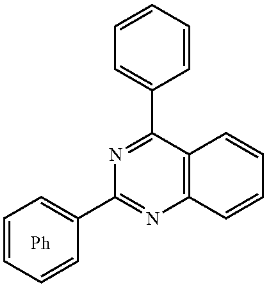 [SMILES: c1ccc(-c2nc(-c3ccccc3)c3ccccc3n2)cc1] | −6.00 | −1.88 | 2.46 |
| G-phenyl-66 | 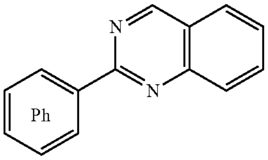 [SMILES: c1ccc(-c2ncc3ccccc3n2)cc1] | −6.12 | −1.82 | 2.22 |
| G-phenyl-67 | 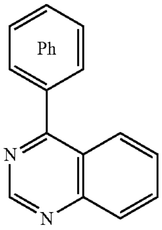 [SMILES: c1ccc(-c2ncnc3ccccc23)cc1] | −6.36 | −1.87 | 3.04 |
| G-phenyl-68 | 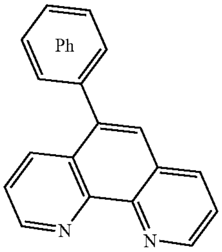 [SMILES: c1ccc(-c2cc3cccnc3c3ncccc23)cc1] | −6.03 | −1.46 | 3.58 |

TABLE 2-continued
| | Structure of G-phenyl | HOMO [eV] | LUMO [eV] | Dipole moment [D] |
|---|---|---|---|---|
| G-phenyl-69 | 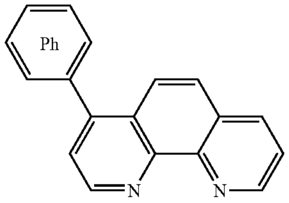 [SMILES: c1ccc(-c2ccnc3c2ccc2cccnc23)cc1] | −6.09 | −1.46 | 3.67 |
| G-phenyl-70 | 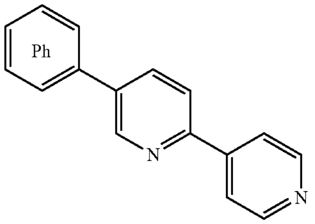 [SMILES: c1ccc(-c2ccc(-c3ccncc3)nc2)cc1] | −6.17 | −1.85 | 4.56 |
| G-phenyl-71 | 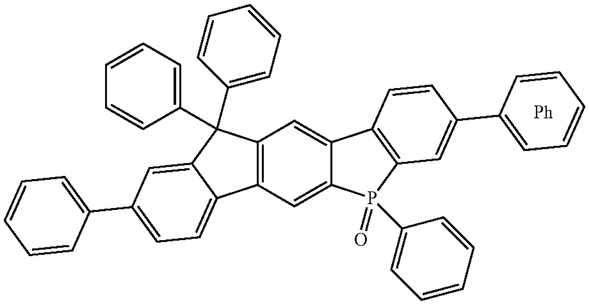 [SMILES: O=P1(c2ccccc2)c2cc(-c3ccccc3)ccc2-c2cc3c(cc21)-c1ccc(-c2ccccc2)cc1C3(c1ccccc1)c1ccccc1] 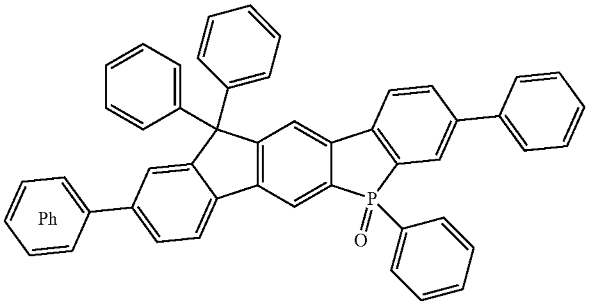 [SMILES: O=P1(c2ccccc2)c2cc(-c3ccccc3)ccc2-c2cc3c(cc21)-c1ccc(-c2ccccc2)cc1C3(c1ccccc1)c1ccccc1] 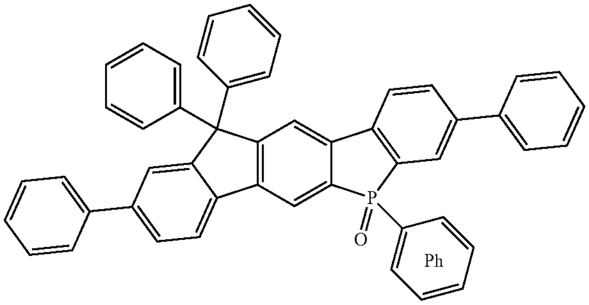 [SMILES: O=P1(c2ccccc2)c2cc(-c3ccccc3)ccc2-c2cc3c(cc21)-c1ccc(-c2ccccc2)cc1C3(c1ccccc1)c1ccccc1] | −5.50 | −1.74 | 4.45 |

TABLE 2-continued
| | Structure of G-phenyl | HOMO [eV] | LUMO [eV] | Dipole moment [D] |
|---|---|---|---|---|
| | 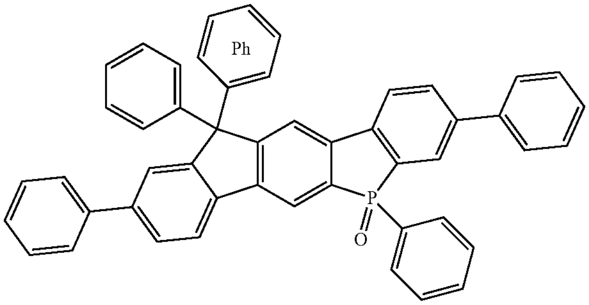 [SMILES: O=P1(c2ccccc2)c2cc(-c3ccccc3)ccc2-c2cc3c(cc21)-c1ccc(-c2ccccc2)cc1C3(c1ccccc1)c1ccccc1] | | | |
| G-phenyl-72 | 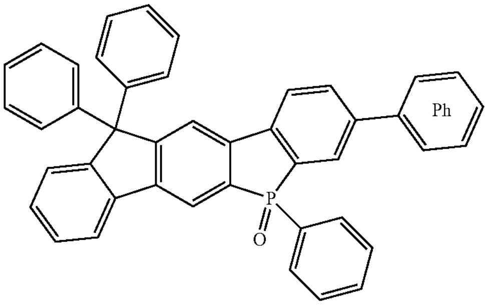 [SMILES: O=P1(c2ccccc2)c2cc(-c3ccccc3)ccc2-c2cc3c(cc21)-c1ccccc1C3(c1ccccc1)c1ccccc1] 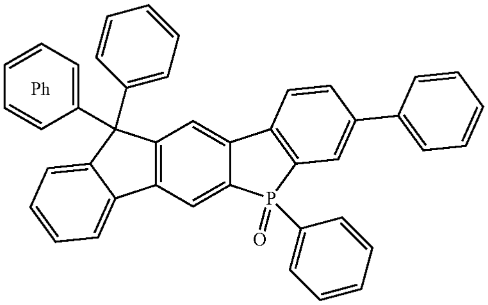 [SMILES: O=P1(c2ccccc2)c2cc(-c3ccccc3)ccc2-c2cc3c(cc21)-c1ccccc1C3(c1ccccc1)c1ccccc1] 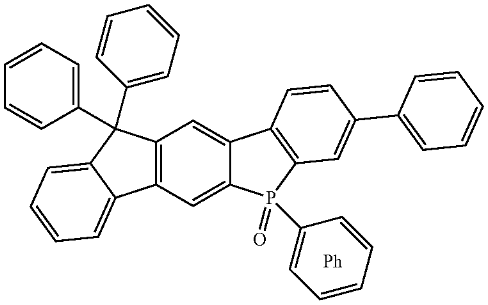 [SMILES: O=P1(c2ccccc2)c2cc(-c3ccccc3)ccc2-c2cc3c(cc21)-c1ccccc1C3(c1ccccc1)c1ccccc1] | −5.55 | −1.76 | 4.44 |
| G-phenyl-73 | 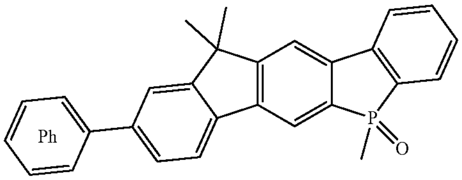 [SMILES: CC1(C)c2cc(-c3ccccc3)ccc2-c2cc3c(cc21)-c1ccccc1P3(C)=O] | −5.58 | −1.64 | 4.98 |

TABLE 2-continued
| | Structure of G-phenyl | HOMO [eV] | LUMO [eV] | Dipole moment [D] |
|---|---|---|---|---|
| G-phenyl-74 | 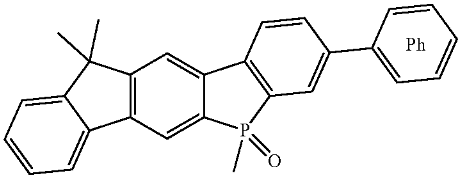 [SMILES: CC1(C)c2ccccc2-c2cc3c(cc21)-c1ccc(-c2ccccc2)cc1P3(C)=O] | −5.60 | −1.66 | 4.81 |
| G-phenyl-75 | 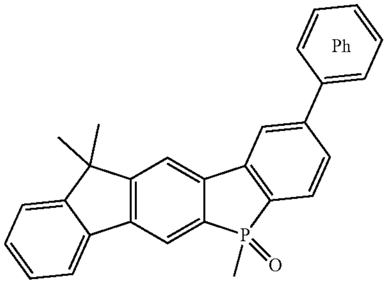 [SMILES: CC1(C)c2ccccc2-c2cc3c(cc21)-c1cc(-c2ccccc2)ccc1P3(C)=O] | −5.70 | −1.60 | 5.11 |
| G-phenyl-76 | 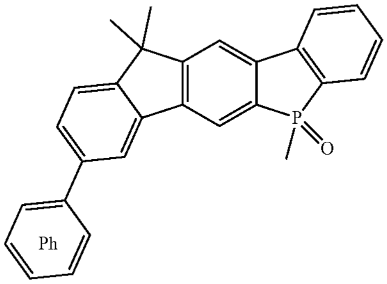 [SMILES: CC1(C)c2ccc(-c3ccccc3)cc2-c2cc3c(cc21)-c1ccccc1P3(C)=O] | −5.66 | −1.58 | 4.90 |
| G-phenyl-77 | 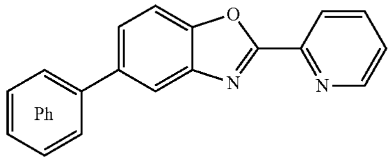 [SMILES: c1ccc(-c2ccc3oc(-c4ccccn4)nc3c2)cc1] | −5.95 | −1.70 | 1.25 |
| G-phenyl-78 | 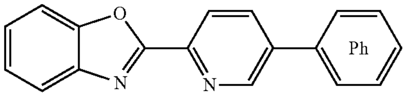 [SMILES: c1ccc(-c2ccc(-c3nc4ccccc4o3)nc2)cc1] | −5.92 | −1.91 | 1.83 |
| G-phenyl-79 | 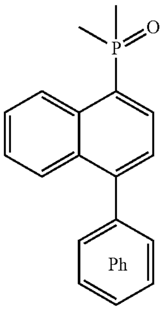 [SMILES: CP(C)(=O)c1ccc(-c2ccccc2)c2ccccc12] | −5.84 | −1.41 | 4.28 |

TABLE 2-continued

| | Structure of G-phenyl | HOMO [eV] | LUMO [eV] | Dipole moment [D] |
|---|---|---|---|---|
| G-phenyl-80 | 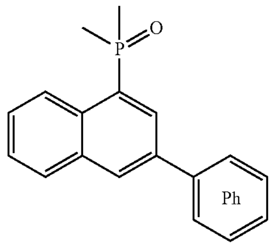 [SMILES: CP(C)(=O)c1cc(-c2ccccc2)cc2ccccc12] | -5.81 | -1.40 | 3.98 |
| G-phenyl-81 | 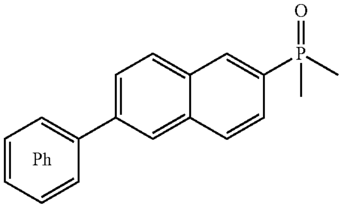 [SMILES: CP(C)(=O)c1ccc2cc(-c3ccccc3)ccc2c1] | -5.84 | -1.61 | 4.50 |
| G-phenyl-82 | 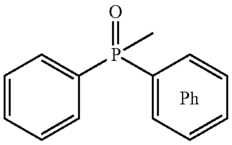 | -6.85 | -0.85 | 4.00 |
| G-phenyl-83 | 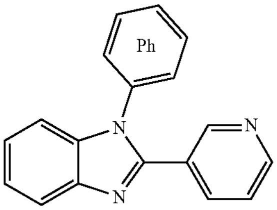 [SMILES: c1ccc(-n2c(-c3cccnc3)nc3ccccc32)cc1] | -5.88 | -1.27 | 2.59 |
| G-phenyl-84 | 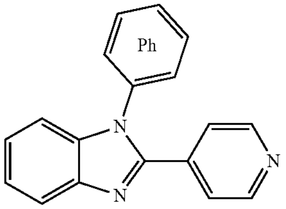 [SMILES: c1ccc(-n2c(-c3ccncc3)nc3ccccc32)cc1] | -6.02 | -1.48 | 4.35 |

G may be selected from the group consisting of dialkylphosphinyl, diarylphosphinyl, alkylarylphosphinyl, diheteroarylphosphinyl, arylheteroarylphosphinyl, cyclic diarylphosphinyl, phosphine oxide, aryl-containing phosphine oxide, heteroaryl-containing phosphine oxide, cyclic arylheteroarylphosphinyl, cyclic heteroaryl-containing phosphine oxide, nitrile, benzonitrile, nicotinonitrile, amide, carbamide, and $C_2$ to $C_{42}$ heteroaryl; wherein G may include one or more substituents attached to the group, wherein the one or more substituents are selected from the group consisting of $C_6$ to $C_{18}$ aryl, $C_1$ to $C_6$ alkyl, $C_2$ to $C_{14}$ heteroaryl. In this regard, "cyclic means that the "P═O" of the phosphinyl, respectively the phosphine oxide is part of a ring formed with further moieties of the group.

G may be selected from the group consisting of di-$C_1$ to $C_{10}$-alkylphosphinyl, di-$C_6$ to $C_{10}$-arylphosphinyl, $C_{10}$-$C_{42}$ diheteroarylphosphinyl, $C_7$-$C_{42}$ arylheteroarylphosphinyl, $C_8$-$C_{42}$ phosphine oxide, $C_8$-$C_{42}$ aryl-containing phosphine oxide, $C_8$-$C_{63}$ heteroaryl-containing phosphine oxide, $C_{12}$-$C_{63}$ cyclic arylphosphinyl, $C_7$-$C_{42}$ cyclic arylheteroarylphosphinyl, $C_7$-$C_{42}$ cyclic heteroaryl-containing phosphine oxide, and $C_1$ to $C_{39}$ heteroaryl, optionally $C_2$ to $C_{35}$ heteroaryl, optionally $C_2$ to $C_{32}$ heteroaryl, optionally $C_2$ to $C_2$, heteroaryl, optionally $C_2$ to $C_{25}$ heteroaryl; G may include one or more substituents attached to the group, wherein the one or more substituents are selected from the group consisting of $C_6$ to $C_{12}$ aryl, $C_1$ to $C_6$ alkyl, $C_2$ to $C_{11}$ heteroaryl.

G may be selected from the group consisting of di-$C_1$ to $C_4$-alkylphosphinyl, di-$C_6$ to $C_{10}$-arylphosphinyl, $C_{10}$ diheteroarylphosphinyl, $C_7$-$C_{25}$ arylheteroarylphosphinyl, $C_8$-$C_{42}$ phosphine oxide, $C_8$-$C_{42}$ aryl-containing phosphine oxide, $C_8$-$C_{24}$ heteroaryl-containing phosphine oxide, $C_{12}$-$C_{42}$ cyclic arylphosphinyl, $C_7$-$C_{25}$ cyclic arylheteroarylphosphinyl, $C_7$-$C_{25}$ cyclic heteroaryl-containing phosphine oxide, and $C_2$ to $C_{25}$ heteroaryl; wherein the respective G may include one or more substituents attached to the group, wherein the one or more substituents are selected from the group consisting of $C_6$ to $C_{10}$ aryl, $C_1$ to $C_4$ alkyl, $C_2$ to $C_5$ heteroaryl.

G may be selected from the group consisting of dialkylphosphinyl, diarylphosphinyl, alkylarylphosphinyl, diheteroarylphosphinyl, arylheteroarylphosphinyl, cyclic diarylphosphinyl, phosphine oxide, aryl-containing phosphine oxide, heteroaryl-containing phosphine oxide, cyclic arylheteroarylphosphinyl, cyclic heteroaryl-containing phosphine oxide, nitrile, benzonitrile, nicotinonitrile, amide-yl, carbamide-yl and $C_2$ to $C_{17}$ heteroaryl; wherein the respective G may include one or more substituents attached to the group, wherein the one or more substituents are selected from the group consisting of phenyl, methyl, ethyl, and pyridyl.

G may be selected from the group consisting of dialkylphosphinyl, diarylphosphinyl, alkylarylphosphinyl, nitrile, benzonitrile, nicotinonitrile, amide-yl, carbamide-yl and $C_2$ to $C_{17}$ heteroaryl; wherein the respective G may include one or more substituents attached to the group, wherein the one or more substituents are selected from the group consisting of phenyl, methyl, ethyl, and pyridyl.

G may be independently selected from the group consisting of dimethylphosphinyl, diphenylphosphinyl, 2-phenyl-1H-benzo[d]imidazolyl, 2-ethyl-1H-benzo[d]imidazolyl, 2-phenylbenzo[h]quinolinyl, pyridinyl, 2,2'-bipyridinyl, 2,2'quinolinyl-pyridyl 5-phenylbenzo[4,5]imidazo[1,2-a]quinolinyl, 9-phenyl-1,10-phenanthrolinyl and (pyridine-2-yl)imidazo[1,5-a]pyridinyl, which may be substituted or unsubstituted, respectively with one or more substituents selected from the group consisting of phenyl, methyl, ethyl, and pyridyl.

G may be independently selected from the group consisting of dimethylphosphinyl, diphenylphosphinyl, 2,2'-bipyridinyl and quinolinyl-pyridyl.

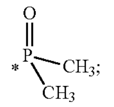

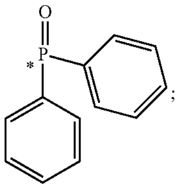

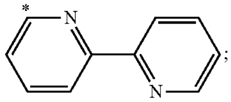

; and

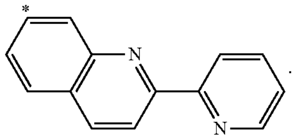

.

wherein the asterisk symbol "*" represents the binding position.

G may be dimethylphosphinyl.

The compound of Formula (II) may be selected from the compounds B-1 to B-8 of the following Table 3.

TABLE 3

| Name | Structure | LUMO [eV] | HOMO [eV] | Dipole moment [D] |
|---|---|---|---|---|
| B-1 | 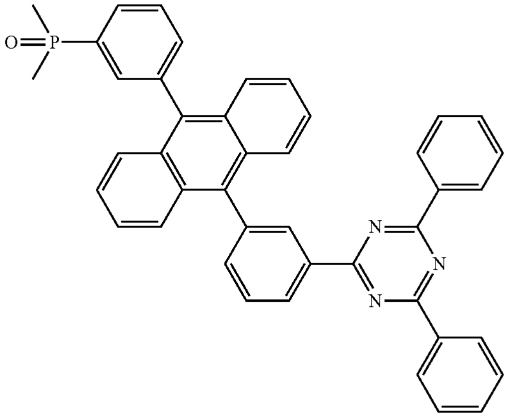 [SMILES: CP(C)(=O)c1cccc(-c2c3ccccc3c(-c3cccc(-c4nc(-c5ccccc5)nc(-c5ccccc5)n4)c3)c3ccccc23)c1] | −1.90 | −5.28 | 4.47 |
| B-2 | 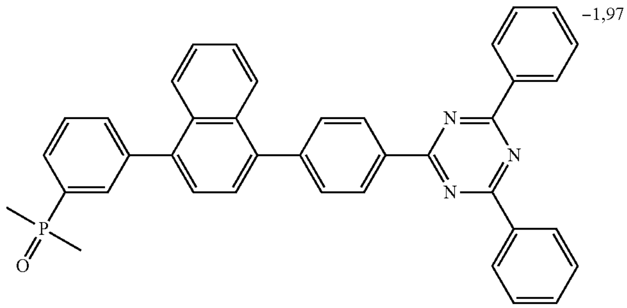 | −1,97 | −5.76 | 4.27 |

TABLE 3-continued
| Name | Structure | LUMO [eV] | HOMO [eV] | Dipole moment [D] |
|---|---|---|---|---|
| B-3 | 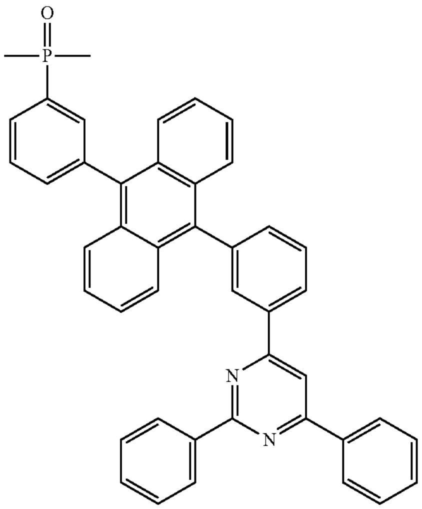 [SMILES: CP(C)(=O)c1cccc(-c2c3ccccc3c(-c3cccc(-c4cc(-c5ccccc5)nc(-c5ccccc5)n4)c3)c3ccccc23)c1] | −1.86 | −5.34 | 2.59 |
| B-4 | 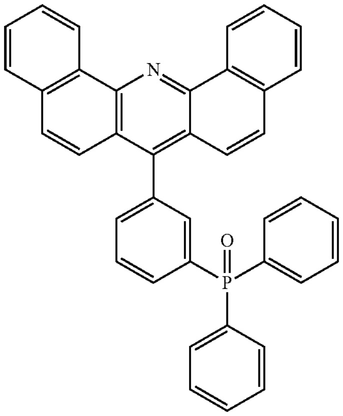 [SMILES: O=P(c1ccccc1)(c1ccccc1)c1cccc(-c2c3ccc4ccccc4c3nc3c2ccc2ccccc23)c1] | −1.84 | −5.73 | 2.66 |
| B-5 | 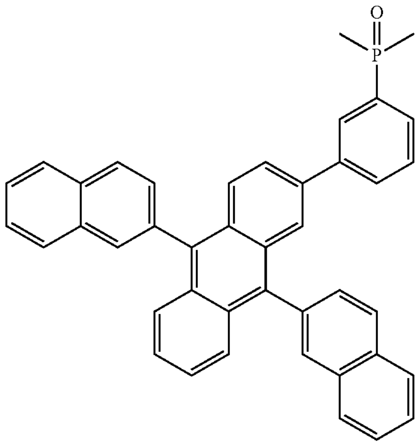 [SMILES: CP(C)(=O)c1cccc(-c2ccc3c(-c4ccc5ccccc5c4)c4ccccc4c(-c4ccc5ccccc5c4)c3c2)c1] | −1.75 | −5.11 | 3.78 |

TABLE 3-continued

| Name | Structure | LUMO [eV] | HOMO [eV] | Dipole moment [D] |
|---|---|---|---|---|
| B-6 | 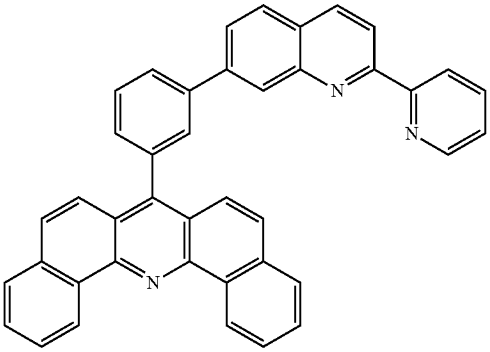 [SMILES: c1ccc(-c2ccc3ccc(-c4cccc(-c5c6ccc7ccccc7c6nc6c5ccc5ccccc56)c4)cc3n2)nc1] | −1.75 | −5.57 | 4.29 |
| B-7 | 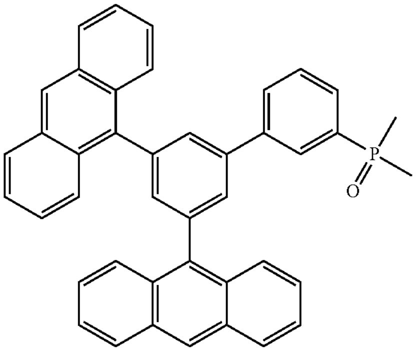 [SMILES: CP(C)(=O)c1cccc(-c2cc(-c3c4ccccc4cc4ccccc34)cc(-c3c4ccccc4cc4ccccc34)c2)c1] | −1.80 | −5.26 | 4.22 |
| B-8 | 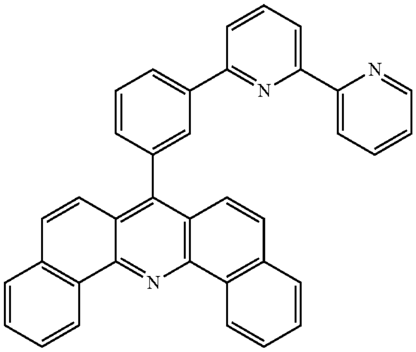 [SMILES: c1ccc(-c2cccc(-c3cccc(-c4c5ccc6ccccc6c5nc5c4ccc4ccccc45)c3)n2)nc1] | −1.59 | −5.48 | 4.68 |

In an embodiment the LUMO energy level of the compound of formula (II) in the absolute scale taking vacuum energy level as zero, computed by the TURBOMOLE V6.5 program package using hybrid functional B3LYP and Gaussian 6-31G* basis set, is in the range from −2.30 eV to −1.20 eV, preferably from −2.00 eV to −1.70 eV, even more preferred −2.00 eV to −1.80 eV, especially from −1.97 eV to −1.86 eV.

In an embodiment the compound of formula (II) comprises one polar group "G".

The compound of Formula (II) may comprise 6 to 12 aromatic or heteroaromatic rings, optionally 6 to 11 aromatic or heteroaromatic rings, optionally 7 to 10 aromatic or heteroaromatic rings. optionally 7 to 9 aromatic or heteroaromatic rings. In this regard, an aromatic, respectively heteroaromatic ring, is a single aromatic ring, for example a 6-membered aromatic ring such as phenyl, a 6-membered heteroaromatic ring, an example would be pyridyl, a 5-membered heteroaromatic ring an example would be pyrrolyl etc. In a system of condensed (hetero) aromatic rings, each ring is considered as a single ring in this regard. For example, naphthalene comprises two aromatic rings.

It may be provided that the compound of Formula (II) does not contain P(=O)Aryl$_2$. It may be provided that the compound of Formula (II) does not contain P(=O)Ph$_2$. It may be provided that the compound of Formula (II) does not contain R'P(=O)R" wherein R' and R" are connected with each other to form a ring, that is, does not contain ring-phosphine oxide. It may be provided that the compound of Formula (II) does not contain R'P(=O)R" wherein R' and R" are connected with each other to form a 7-membered ring.

It may be provided that the compound of Formula (II) does not contain two moieties P=O. It may be provided that wherein the compound of Formula (II) does not contain two P(=O)Aryl$_2$. It may be provided that wherein the compound of Formula (II) does not contain two P(=O)Alkyl$_2$. It may be provided that wherein the compound of Formula (II) does not contain two P(=O)Ph$_2$. It may be provided that wherein the compound of Formula (II) does not contain two P(=O)(CH$_3$)$_2$. It may be provided that wherein the compound of Formula (II) does not contain CN.

It may be provided that one or more of the following formulas are excluded from the scope of the Compound of Formula (II)

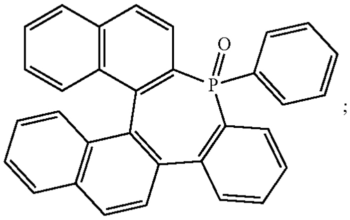

;

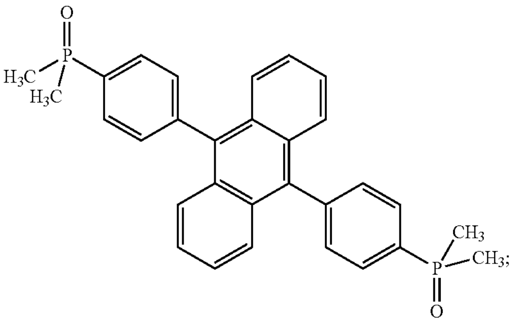

;

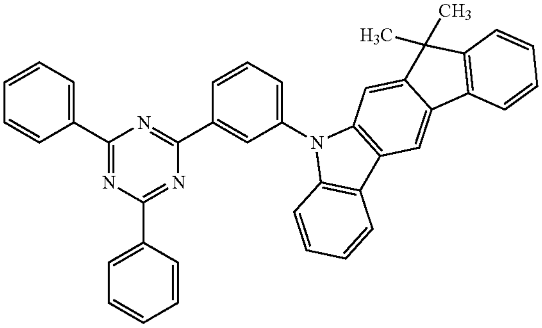

;

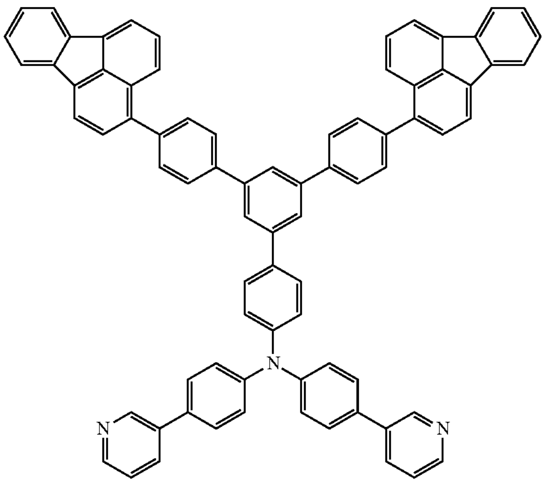

;

-continued

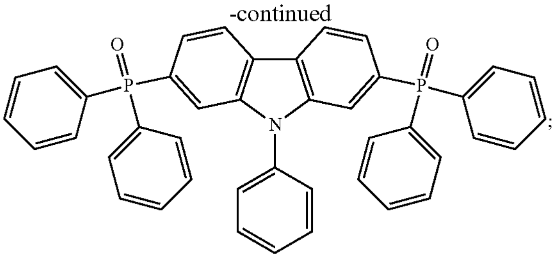

;

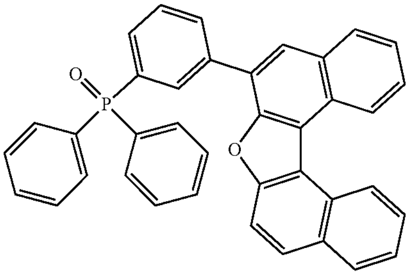

.

The second electron transport layer may have a thickness of <100 nm, optionally between 10 and 90 nm, optionally between 10 and 60 nm, optionally between 10 and 50 nm.

Third Electron Transport Layer

The third electron transport layer comprises the compound of Formula (II)

$$(Ar^2)_m-(Z_k-G)_n \quad \text{(II).}$$

The third electron transport layer does not comprise the compound of Formula (I), that is, the compound of formula (I) as it is comprised in the first electron transport layer and in the second electron transport layer.

The third electron transport layer may consist of the compound of Formula (II) (including a mixture of two or more of the compounds of Formula (II). Alternatively, the third electron transport layer may consist of a mixture of the compound of Formula (II) and one or more further compounds, provided that none of the further compounds is an electrical dopant. The third electron transport layer may comprise more than one compound of Formula (II). In particular, the third electron transport layer may consist of a mixture of the compound of Formula (II) and further compounds known in the art as electron transport matrix compounds. Exemplary further electron transport matrix compounds which may be contained are disclosed below.

The compound of formula (II) may be a compound of formula (II) of one or more of the above embodiments defined above with respect to the second electron transport layer.

The compound of formula (II) in the third electron transport layer is the same compound of formula (II) in the second electron transport layer. In other words, if, for example, a specific compound of formula (II) is chosen for use in the second electron transport layer than exactly the same specific compound of formula (II) is also used as compound of formula (II) in the third electron transport layer The compound of formula (I) is not a compound of formula (II).

The organic light emitting diode may further comprise an electron injection layer and the third electron transport layer may be arranged between the second electron transport layer and the electron injection layer. The third electron transport layer is arranged in direct contact with the second electron transport layer. The second electron transport layer may be arranged "contacting sandwiched" between the first electron transport layer and the electron injection layer.

The third electron transport layer may have a thickness of 0.1 and 10 nm, optionally between 1 and 5 nm, such as 3 to 5 nm.

Further Possible Characteristics of the OLED

In terms of the present disclosure, a layer stack is an arrangement of three or more, especially of three distinct layers. The layers of the layer stack may be distinguished from each other by the chemical nature of the materials comprised in the respective layers, that is, may be made of different compounds. An electron transport layer stack in terms of the present disclosure comprises at least three different layers made of electron transport materials, respectively.

The compound of Formula (I) and the compound of Formula (II) are different from each other. That is, that the compounds of Formula (I) and the compound of Formula (II) differ from each other with respect to at least one structural aspect from each other, in particular may differ from each other by at least one atom and/or group.

The first electron transport layer is distinguished from the second electron transport layer in that the first electron transport layer does not comprise the compound of formula (II) comprised in the second electron transport layer.

The third electron transport layer is distinguished from the second electron transport layer in that the third electron transport layer does not comprise the compound of formula (I) comprised in the second electron transport layer.

The first electron transport layer and the second electron transport layer are free of an electrical dopant. In this regard, "free of" means that respective compounds (electrical dopants) are only contained in the respective layers which cannot be avoided by standard purification methods and common technical means during preparation of the respective layer. In this regards, electrical dopants are in particular, but not limited thereto, electrical n-dopants. The electrical n-dopant may be selected from a metal, alternatively an alkali metal, a metal salt alternatively an alkaline earth metal salt and/or rare earth metal salt, or an organic alkali metal complex, alternatively an alkali metal complex, alternatively LiF, LiCl, LiBr, LiI, LiQ, a metal borate, or mixtures thereof. In particular, the first electron transport layer and the second electron transport layer may be free of an electrical n-dopant. The electrical n-dopant may be a metal salt comprising at least one metal cation and at least one anion. The metal cation of the metal salt may be selected from the group consisting of alkali metals, alkaline earth metals, and rare earth metals, alternatively from the group consisting of Li, Na, K, Rb, Cs, Mg, Ca, Sr, and Ba; alternatively from Li, Mg, Ca, and Sr. The anion of the metal salt may be selected from the group consisting of quinolinolate, phosphine oxide phenolate and borate.

In this regard, electrical n-dopants are in particular, but not limited thereto, an elemental metal, alternatively an electropositive metal selected from alkali metals, alkaline earth metals, rare earth metals and transition metals, transition metals; a metal salt, alternatively an alkali metal salt, alkaline earth metal salt and/or rare earth metal salt, or a metal complex, alternatively an alkali metal complex, alkaline earth metal complex, transition metal complex and/or rare earth metal complex. Examples of n-doping metal salts can be LiF, LiCl, LiBr, LiI, metal borates, metal quinolinolates or mixtures thereof. Further examples of electrical n-dopants are strong chemical reducing agents. This class of "redox" n-dopants may be generically characterized by energy level of the highest occupied molecular orbital (HOMO) comparable with lowest unoccupied molecular orbital Energy Level of corresponding electron transport matrices, which is in usual OLED transport materials about −3.0 eV or less. It is to be understood that the term "about −3.0 eV or less" means less negative values than −3.0 eV, for example −2.8 eV, −2.5 eV, −2.3 eV, −2.1 eV or vales less negative than −2.0 eV.

Electrical n-dopants may be organic compounds as disclosed in EP1837926A1, WO07107306A1 or WO07107356A1.

It is provided that the electrical dopant is essentially non-emissive.

The first electron transport layer and the second electron transport layer may be in direct contact with each other.

The electron transport layer stack may consist of the first electron transport layer and the second electron transport layer.

The second electron transport layer may be in direct contact with the electron injection layer.

The electron injection layer may consist of a number of individual electron injection sublayers.

The electron injection layer may comprise a metal, alternatively an alkali metal, a metal salt alternatively an alkaline earth metal salt and/or rare earth metal salt, or an organic alkali metal complex, alternatively an alkali metal complex, alternatively LiF, LiCl, LiBr, LiI, LiQ, a metal borate, or mixtures thereof.

The electron injection layer may consist of a metal, alternatively an alkali metal, a metal salt alternatively an alkaline earth metal salt and/or rare earth metal salt, or an organic alkali metal complex, alternatively an alkali metal complex, alternatively LiF, LiCl, LiBr, LiI, LiQ, a metal borate, or mixtures thereof.

It may be provided that the compound of Formula (II) is not comprised in the electron injection layer. It may be provided that the compound of Formula (I) is not comprised in the electron injection layer.

The compound of Formula (I) and the compound of Formula (II) are different from each other and may not be comprised in the electron injection layer, respectively.

In one embodiment, the electron injection layer is free of Li and G in the compound of formula (II) comprises a phosphine oxide (P═O) group.

In one embodiment, the electron injection layer is free of Li and G in the compound of formula (II) comprises a pyridine group.

In one embodiment, the electron injection layer is free of Li and G in the compound of formula (II) comprises a lutidine group.

In one embodiment, the electron injection layer is free of Li and G in the compound of formula (II) comprises a nitrile (CN) group.

Gradient Layer

The concentration of the compound of Formula (I) in the second electron transport layer may decrease in the direction from the first electron transport layer to the third electron transport layer; and the concentration of the compound of Formula (II) in the second electron transport layer may increase in the direction from the first electron transport layer to the third electron transport layer. In other words, there may be a concentration gradient in the second electron transport layer with respect to the concentration of the compound of Formula (I) and the concentration of the compound of Formula (II), wherein the concentration of the compound of Formula (I) is higher closer to the emission layer and the concentration of the compound of Formula (II) is higher closer to the cathode.

In this regard, it may be provided that the concentration of the compound of Formula (I) in the second electron transport layer decreases continually in the direction from the first electron transport layer to the third electron transport layer.

In this regard, it may be provided that the concentration of the compound of Formula (II) in the second electron transport layer increases continually in the direction from the first electron transport layer to the third electron transport layer.

The "direction" in this regard is the direction perpendicular to the surface of the respective layer, that is, perpendicular to the surface of all layers in the EML, the ETL layer stack and the cathode.

The embodiment in which the concentration of the compound of Formula (I) in the second electron transport layer decreases in the direction from the first electron transport layer to the third electron transport layer; and the concentration of the compound of Formula (II) in the second electron transport layer increases in the direction from the first electron transport layer to the third electron transport layer may be prepared by a method comprising the steps:

i) providing a first vapor deposition source and a second vapor deposition source in spatial proximity with respect to each other the spatial proximity allowing to co-deposit a first compound from the first vapor deposition source and a second compound from the second vapor deposition source on a layer or a layer stack arranged at equal distance from the first vapor deposition source and the second vapor deposition source;

ii) providing the compound of formula (I) in the first vapor deposition source;

iii) providing the compound of formula (II) in the second vapor deposition source;

iv) evaporating simultaneously the compound of formula (I) from the first vapor deposition source and the compound of formula (II) from the second vapor deposition source; and v) either a) moving a layer stack comprising the anode and the emission layer, wherein the emission layer is an outer layer, in a direction from the first vapor deposition source to the second vapor deposition source at first along the first vapor deposition source and thereafter along the second vapor deposition source to form, in this order, the first electron transport layer on the emission layer, the second electron transport layer on the first electron transport layer and the third electron transport layer on the second electron transport layer; or b)

moving the cathode or a layer stack comprising the cathode and at least one further layer in a direction from the second vapor deposition source to the first vapor deposition source at first along the second vapor deposition source and thereafter along the first vapor deposition to form, in this order, the third electron transport layer on the cathode or the outermost layer of the at least one further layer(s), the second electron transport layer on the third electron transport layer and the first electron transport layer on the second electron transport layer.

This method may be used in a continuous process.

This process can be an in-line deposition process with linear nozzle sources. The first electron transport layer, the second electron transport layer having a concentration gradient with respect to the concentration of the compound of Formula (I) and the concentration of the compound of Formula (II), and the third electron transport layer is naturally obtained from this co-deposition process as the layer stack comprising the emission layer as the outermost layer travels over the two sources (first vapor deposition source and second vapor deposition source). Since the deposition patterns of the two sources used for co-deposition do not overlap perfectly, the resulting co-deposited layer is not uniform in terms of composition ratio. As the layer stack comprising the emission layer as the outermost layer (and this outermost emission layer faces the vapor deposition sources) travels over the first vapor deposition source, a thin layer of compound of formula (I) is formed followed by a compound of formula (I)-enriched compound of formula (I): compound of formula (II) layer is formed. Then the resultant layer stack enters the zone where the first vapor deposition source and the second vapor deposition source deposition overlap is optimal, thus leading to a uniformly co-deposity layer of compound of formula (I): compound of formula (II) layer. Finally, as the resultant layer stack exits by passing over the second vapor deposition source, a compound of formula (II)-enriched compound of formula (I): compound of formula (II) layer is formed followed by a thin layer of compound of formula (II).

In more detail, during this co-deposition process the layer stack comprising the emission layer as the outermost layer is in a first step moved along the first vapor deposition source. Here, only the compound of formula (I) comprised in the first vapor deposition source is deposited on the light emission layer. In this way a layer of pure compound of formula (I) is deposited on the emission layer forming the first electron transport layer.

At next, the layer stack comprising the emission layer and the first electron transport layer formed on the surface thereof is moved to come closer to the second vapor deposition source. At this time, not only the compound of formula (I) comprised in the first vapor deposition source is deposited on this layer stack but also the compound of formula (II) in the second vapor deposition source, wherein in the beginning the amount of compound of formula (I) which is deposited is higher than the amount of compound of formula (II).

Then, when the resultant layer stack comprising the emission layer, the first electron transport layer formed on the surface of the emission layer and the second electron transport layer formed on the surface of the first electron transport layer is moved even closer to the second vapor deposition source, the amount of compound of formula (II) deposited on this layer stack increases while the amount of compound of formula (I) deposited on this layer stack decreases. In this way, the concentration gradient is formed.

In the end, when the resultant layer stack comprising the emission layer, the first electron transport layer formed on the surface of the emission layer and the second electron transport layer formed on the surface of the first electron transport layer is far off the first vapor deposition source, only the compound of formula (II) comprised in the second vapor deposition source is deposited on the surface of the second electron transport layer. In this way a layer of pure compound of formula (II) is deposited on the gradient layer forming the third electron transport layer.

Of course, the process can be carried out the other way round to move the cathode (which may include one or more layers formed on the surface of the cathode, such as an electron injection layer or a multi-layer electron injection layer) along the second vapor source first to form in the first step the electron transport layer and so on.

The "spatial proximity allowing to co-deposit a first compound from the first vapor deposition source and a second compound from the second vapor deposition source on a layer or a layer stack arranged at equal distance from the first vapor deposition source and the second vapor deposition source" may be a distance of the first and the second vapor deposition sources in the range from 50 mm to 500 mm, such as 100 mm to 200 mm.

The invention further relates to an OLED obtainable or obtained by a method comprising the steps:

i) providing a first vapor deposition source and a second vapor deposition source in spatial proximity with respect to each other the spatial proximity allowing to co-deposit a first compound from the first vapor deposition source and a second compound from the second vapor deposition source on a layer or a layer stack arranged at equal distance from the first vapor deposition source and the second vapor deposition source;

ii) providing the compound of formula (I) in the first vapor deposition source;

iii) providing the compound of formula (II) in the second vapor deposition source;

iv) evaporating simultaneously the compound of formula (I) from the first vapor deposition source and the compound of formula (II) from the second vapor deposition source; and v) either a)

moving a layer stack comprising the anode and the emission layer, wherein the emission layer is an outer layer, in a direction from the first vapor deposition source to the second vapor deposition source at first along the first vapor deposition source and thereafter along the second vapor deposition source to form, in this order, the first electron transport layer on the emission layer, the second electron transport layer on the first electron transport layer and the third electron transport layer on the second electron transport layer;

or b) moving the cathode or a layer stack comprising the cathode and at least one further layer in a direction from the second vapor deposition source to the first vapor deposition source at first along the second vapor deposition source and thereafter along the first vapor deposition to form, in this order, the third electron transport layer on the cathode or the outermost layer of the at least one further layer(s), the second electron transport layer on the third electron transport layer and the first electron transport layer on the second electron transport layer.

In one embodiment, the second electron transport layer consists of a first sublayer, a second sublayer and a third sublayer;

the second sublayer is arranged between and in direct contact with the first sublayer and the third sublayer, respectively;

the first sublayer is arranged closer to the first electron transport layer than the third sublayer;

the third sublayer is arranged closer to the third electron transport layer than the first sublayer;

the concentration of the compound of Formula (I) in the first sublayer decreases, especially may decrease continually, in the direction from the first electron transport layer to the second sublayer;

the concentration of the compound of Formula (II) in the first sublayer increases, especially may increase continually, in the direction from the first electron transport layer to the second sublayer;

the concentration of the compound of Formula (I) and the concentration of the compound of Formula (II) in the second sublayer remain constant, respectively, in the direction from the first sublayer to the third sublayer;

the concentration of the compound of Formula (I) in the third sublayer decreases, especially may decrease continually, in the direction from the second sub layer to the third electron transport layer; and the concentration of the compound of Formula (II) in the third sublayer increases, especially may increase continually, in the direction from the second sub layer to the third electron transport layer.

The "direction" in this regard is the direction perpendicular to the surface of the respective layer, that is, perpendicular to the surface of all layers in the EML, the ETL layer stack and the cathode.

The term "constant" as used in context of the concentration of the compound of Formula (I) and the concentration of the compound of Formula (II) in the second sublayer means constant within the statistical fluctuation range of the evaporation method used for preparing the layer.

Such a concentration profile with a second electron transport layer having the above three sublayers can be, for example, be obtained by a method for preparing the organic electronic device according to any of the preceding claims, the method comprising the steps:

i) providing the compound of formula (I) in a first vapor deposition source;

ii) providing the compound of formula (II) in a second vapor deposition source;

iii) either a) evaporating the compound of formula (I) from the first vapor deposition source and depositing the evaporated compound of formula (I) on the emission layer to form the first electron transport layer;

b) evaporating simultaneously the compound of formula (I) from the first vapor deposition source and the compound of formula (II) from the second vapor deposition source and depositing simultaneously the evaporated compound of formula (I) and the evaporated compound of formula (II) on the first electron transport layer to form the second electron transport layer; and c) evaporating the compound of formula (II) from the second vapor deposition source and depositing the evaporated compound of formula (II) on the second electron transport layer to form the third electron transport layer;

or d) evaporating the compound of formula (II) from the second vapor deposition source and depositing the evaporated compound of formula (II) on the cathode or on a layer provided on the cathode or an outermost layer of a layer stack provided on the cathode to form the third electron transport layer;

e) evaporating simultaneously the compound of formula (I) from the first vapor deposition source and the compound of formula (II) from the second vapor deposition source and depositing simultaneously the evaporated compound of formula (I) and the evaporated compound of formula (II) on the third electron layer to form the second electron transport layer; and f) evaporating the compound of formula (I) from the first vapor deposition source and depositing the evaporated compound of formula (I) on the second electron transport layer to form the first electron transport layer.

This method may be used in a "batch process".

This method of preparation can be considered as a point-source deposition process in a cluster tool. The first electron transport layer, the second electron transport layer having a concentration gradient with respect to the concentration of the compound of Formula (I) and the concentration of the compound of Formula (II) in the first and in the third sublayer and a concentration plateau in the second sublayer, and the third electron transport layer are obtained by depositing each layer successively in this method. The first vapor deposition source is used first to deposit the compound of formula (I). Then, the second vapor deposition source is started a mixed layer comprising the compound of formula (I) and the compound of formula (II) is formed. When starting the second vapor deposition source, the amount of compound of formula (II) released from this second vapor deposition source will increase in an initial period over time resulting in the first sublayer having a concentration gradient. Finally, the first vapor deposition source is turned off. However, in a final phase, some remaining compound of formula (I) will be released, wherein this amount decreases over time. In this way, the third sublayer with concentration gradient is formed. If now compound of formula (I) is released from the first source at all, a layer only containing the compound of formula (II) is formed which is the third electron transport layer.

The invention is further directed to an organic electronic device obtainable or obtained by a method comprising the steps:

i) providing the compound of formula (I) in a first vapor deposition source;
ii) providing the compound of formula (II) in a second vapor deposition source;
iii) either
  a) evaporating the compound of formula (I) from the first vapor deposition source and depositing the evaporated compound of formula (I) on emission layer to form the first electron transport layer;
  b) evaporating simultaneously the compound of formula (I) from the first vapor deposition source and the compound of formula (II) from the second vapor deposition source and depositing simultaneously the evaporated compound of formula (I) and the evaporated compound of formula (II) on the first electron transport layer to form the second electron transport layer; and
  c) evaporating the compound of formula (II) from the second vapor deposition source and depositing the evaporated compound of formula (II) on the second electron transport layer to form the third electron transport layer;

or
  d) evaporating the compound of formula (II) from the second vapor deposition source and depositing the evaporated compound of formula (II) on the cathode or on a layer provided on the cathode or an outer layer of a layer stack provided on the cathode to form the third electron transport layer;
  e) evaporating simultaneously the compound of formula (I) from the first vapor deposition source and the compound of formula (II) from the second vapor deposition source and depositing simultaneously the evaporated compound of formula (I) and the evaporated compound of formula (II) on the third electron layer to form the second electron transport layer; and
  f) evaporating the compound of formula (I) from the first vapor deposition source and depositing the evaporated compound of formula (I) on the second electron transport layer to form the first electron transport layer.

EXEMPLARY EMBODIMENTS

According to one embodiment, there is provided an organic light emitting diode comprising a non-transparent substrate, an anode, a cathode, an emission layer, and an electron transport layer stack; wherein the electron transport layer stack is arranged between the emission layer and the cathode;

the electron transport layer stack comprises a first electron transport layer, a second electron transport layer, and a third electron transport layer;

the second electron transport layer is arranged between and in direct contact with the first electron transport layer and the third electron transport layer, respectively;

the first electron transport layer is arranged closer to the emission layer than the third electron transport layer;

the third electron transport layer is arranged closer to the cathode than the first electron transport layer;

the first electron transport layer comprises a compound of Formula (I)

$$(Ar^1\text{-}A_c)_a\text{-}X_b \qquad (I);$$

a and b are independently 1 or 2;

c is independently 0 or 1;

Ar is independently selected from $C_6$ to $C_{30}$ aryl or $C_2$ to $C_{24}$ heteroaryl, wherein each $Ar^1$ may be substituted with one or two substituents independently selected from the group consisting of $C_6$ to $C_{12}$ aryl, $C_3$ to $C_{11}$ heteroaryl, and $C_1$ to $C_6$ alkyl, D, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, halogen, CN or $PY(R^{10})_2$, wherein Y is selected from O, S or Se, preferably O and $R^{10}$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy;

wherein each $C_6$ to $C_{12}$ aryl substituent on $Ar^1$ and each $C_3$ to $C_{11}$ heteroaryl substituent on $Ar^1$ may be substituted with $C_1$ to $C_4$ alkyl or halogen;

A is independently selected from $C_6$ to $C_{18}$ aryl, wherein each A may be substituted with one or two substituents independently selected from the group consisting of $C_6$ to $C_{12}$ aryl and $C_1$ to $C_6$ alkyl, D, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, halogen, CN or $PY(R^{10})_2$, wherein Y is selected from O, S or Se, preferably O, and $R^{10}$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy;

wherein each $C_6$ to $C_{12}$ aryl substituent on A may be substituted with $C_1$ to $C_4$ alkyl or halogen;

X is independently selected from the group consisting of $C_3$ to $C_{21}$ heteroaryl and $C_6$ to $C_{24}$ aryl, wherein each X may be substituted with one or two substituents independently selected from the group consisting of $C_6$ to $C_{12}$ aryl, $C_3$ to $C_{11}$ heteroaryl, and $C_1$ to $C_6$ alkyl, D, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, halogen, CN or $PY(R^{10})_2$, wherein Y is selected from O, S or Se, preferably O, and $R^{10}$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy;

wherein each $C_6$ to $C_{12}$ aryl substituent on X and each $C_3$ to $C_{11}$ heteroaryl substituent on X may be substituted with $C_1$ to $C_4$ alkyl or halogen;

the molecular dipole moment of the compound of formula (I) is ≥0 D and ≤3.5 D;

the second electron transport layer comprises a compound of Formula (II)

$$(Ar^2)_m-(Z_k-G)_n \qquad (II);$$

m and n are independently 1 or 2;

k is independently 0, 1 or 2;

$Ar^2$ is independently selected from the group consisting of $C_3$ to $C_{30}$ heteroaryl and $C_6$ to $C_{42}$ aryl, wherein each $Ar^2$ may be substituted with one or two substituents independently selected from the group consisting of $C_6$ to $C_{12}$ aryl, $C_3$ to $C_{11}$ heteroaryl, and C to $C_6$ alkyl, D, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, halogen, CN or $PY(R^{10})_2$, wherein Y is selected from O, S or Se, preferably O, and $R^{10}$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy;

wherein each $C_6$ to $C_{12}$ aryl substituent on $Ar^2$ and each $C_3$ to $C_{11}$ heteroaryl substituent on $Ar^2$ may be substituted with $C_1$ to $C_4$ alkyl or halogen;

Z is independently selected from $C_6$ to $C_{30}$ aryl, wherein each Z may be substituted with one or two substituents independently selected from the group consisting of $C_6$ to $C_{12}$ aryl and $C_1$ to $C_6$ alkyl, D, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, halogen, CN or $PY(R^{10})_2$, wherein Y is selected from O, S or Se, preferably O, and $R^{10}$ is independently selected from $C_6$ to $C_{12}$ aryl, $C_3$ to $C_{12}$ heteroaryl, $C_1$ to $C_6$ alkyl, C, to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy;

wherein each $C_6$ to $C_{12}$ aryl substituent on Z may be substituted with $C_1$ to $C_4$ alkyl or halogen;

G is chosen so that the dipole moment of a compound G-phenyl is ≥2 D and ≤6 D; and the third electron transport layer comprises the compound of Formula (II);

the compound of Formula (I) and the compound of Formula (II) are structurally different from each other;

the first electron transport layer does not comprise the compound of Formula (II) as comprised in the third electron transport layer; and the third electron transport layer does not comprise the compound of Formula (I) as comprised in the first electron transport layer; and the first electron transport layer and the second electron transport layer are free of an electrical dopant.

According to one embodiment, there is provided an organic light emitting diode comprising a non-transparent substrate, an anode, a cathode, an emission layer, and an electron transport layer stack; wherein the electron transport layer stack is arranged between the emission layer and the cathode;

the electron transport layer stack comprises a first electron transport layer, a second electron transport layer, and a third electron transport layer;

the second electron transport layer is arranged between and in direct contact with the first electron transport layer and the third electron transport layer, respectively;

the first electron transport layer is arranged closer to the emission layer than the third electron transport layer;

the third electron transport layer is arranged closer to the cathode than the first electron transport layer;

$$(Ar^1-A_c)_a-X_b \qquad (I);$$

a and b are independently 1 or 2;

c is independently 0 or 1;

$Ar^1$ is independently selected from $C_6$ to $C_{30}$ aryl or $C_2$ to $C_{24}$ heteroaryl, wherein each $Ar^1$ may be substituted with one or two substituents independently selected from the group consisting of phenyl, naphtyl, biphenyl, pyridyl, picolinyl, lutidinyl, dibenzofuranyl, dibenzothiophene-yl, and benzothiophene-yl;

A is independently selected from $C_6$ to $C_{18}$ aryl, wherein each A may be substituted with one or two substituents independently selected from the group consisting of phenyl and $C_1$ to $C_4$ alkyl;

X is independently selected from the group consisting of $C_3$ to $C_{21}$ N-containing heteroaryl and $C_3$ to $C_{21}$ O-containing heteroaryl, wherein each X may be substituted with one or two substituents independently selected from the group consisting of phenyl, naphthyl and biphenyl-yl;

the molecular dipole moment of the compound of formula (I) is ≥0.2 D and ≤3.5 D;

the second electron transport layer comprises a compound of Formula (II)

$$(Ar^2)_m-(Z_k-G)_n \qquad (II);$$

m and n are independently 1 or 2;

k is independently 0, 1 or 2;

$Ar^2$ is independently selected from the group consisting of $C_3$ to $C_{21}$ heteroaryl and $C_6$ to $C_{24}$ aryl, wherein each $Ar^2$ may be substituted with one or two substituents independently selected from the group consisting of phenyl, pyridinyl and biphenyl-yl, optionally para-biphenyl-yl;

Z is independently selected from $C_6$ to $C_{30}$ aryl, wherein each Z may be substituted with one or two substituents independently selected from the group consisting of phenyl and $C_1$ to $C_4$ alkyl;

G is selected from the group consisting of dialkylphosphinyl, diarylphosphinyl, alkylarylphosphinyl, nitrile, benzonitrile, nicotinonitrile, amide, carbamide, and $C_2$ to $C_{42}$ heteroaryl; wherein G may include one or more substituents attached to the group, wherein the one or more substituents are selected from the group consisting of $C_6$ to $C_{18}$ aryl, $C_1$ to $C_{10}$ alkyl, $C_2$ to $C_{14}$ heteroaryl; and G is chosen so that the dipole moment of a compound G-phenyl is ≥2 D and ≤6 D; and the third electron transport layer comprises the compound of Formula (II);

the compound of Formula (I) and the compound of Formula (II) are structurally different from each other;

the first electron transport layer does not comprise the compound of Formula (II) as comprised in the third electron transport layer; and the third electron transport layer does not comprise the compound of Formula (I) as comprised in the first electron transport layer; and the first electron transport layer and the second electron transport layer are free of an electrical dopant.

According to one embodiment, there is provided an organic light emitting diode comprising a non-transparent substrate, an anode, a cathode, an emission layer, and an electron transport layer stack; wherein the electron transport layer stack is arranged between the emission layer and the cathode;

the electron transport layer stack comprises a first electron transport layer, a second electron transport layer, and a third electron transport layer;

the second electron transport layer is arranged between and in direct contact with the first electron transport layer and the third electron transport layer, respectively;

the first electron transport layer is arranged closer to the emission layer than the third electron transport layer;

the third electron transport layer is arranged closer to the cathode than the first electron transport layer;

the first electron transport layer comprises a compound of Formula (I)

$$(Ar^1\text{-}A_c)_a\text{-}X_b \quad (I);$$

a and b are independently 1 or 2;

c is independently 0 or 1;

$Ar^1$ is independently selected from the group consisting of phenyl, naphthyl, anthracenyl, fluoranthenyl, xanthenyl, dibenzofuranyl, pyrimidinyl pyraziny, spiro-xanthenyl, fluorenyl, spiro-fluorenyl, triphenylsilyl, tetraphenylsilyl, tetraphenylethylene, or a group having the formula (IIa) or (IIb)

(IIa)

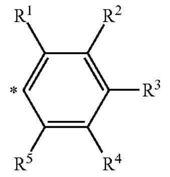

(IIb)

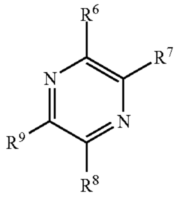

wherein the asterisk symbol "*" represents the binding position for binding the group of formula (IIa) to A; and $R^1$ to $R_9$ are independently selected from the group consisting of H, $C_6$ to $C_{12}$ aryl and $C_4$ to $C_{10}$ heteroray1 wherein each $Ar^1$ may be substituted with one or two substituents independently selected from the group consisting of phenyl, naphtyl, biphenyl, pyridyl, picolinyl, lutidinyl, dibenzofuranyl, dibenzothiophene-yl, and benzothiophene-yl;

A is independently selected from phenylene, naphthylene, biphenylene and terphenylene, wherein each A may be substituted with one or two substituents independently selected from the group consisting of phenyl and $C_1$ to $C_4$ alkyl;

X is independently selected from the group consisting of $C_3$ to $C_{21}$ N-containing heteroaryl, wherein each X may be substituted with one or two substituents independently selected from the group consisting of phenyl, naphthyl and biphenyl-yl;

the molecular dipole moment of the compound of formula (I) is ≥0.4 D and ≤3.2 D;

the second electron transport layer comprises a compound of Formula (II)

$$(Ar^2)_m\text{-}(Z_k\text{-}G)_n \quad (II);$$

m and n are independently 1 or 2;

k is independently 1 or 2;

$Ar^2$ is independently selected from the group consisting of $C_3$ to $C_{21}$ N-containing heteroaryl, wherein each $Ar^2$ may be substituted with one or two substituents independently selected from the group consisting of phenyl, pyridinyl and biphenyl-yl, optionally para-biphenyl-yl;

Z is independently selected from the group consisting of phenylene, naphthylene, phenylene-naphthylene, phenylene-naphthylene-phenylene, phenylene-anthracenylene-phenylene, biphenylene and terphenylene, wherein each Z may be substituted with one or two substituents independently selected from the group consisting of phenyl and $C_1$ to $C_4$ alkyl;

G is a dialkylphosphinyl; and the third electron transport layer comprises the compound of Formula (II);

the compound of Formula (I) and the compound of Formula (II) are structurally different from each other;

the first electron transport layer does not comprise the compound of Formula (II) as comprised in the third electron transport layer; and the third electron transport layer does not comprise the compound of Formula (I) as comprised in the first electron transport layer; and the first electron transport layer and the second electron transport layer are free of an electrical dopant.

According to one embodiment, there is provided an organic light emitting diode comprising a non-transparent substrate, an anode, a cathode, an emission layer, and an electron transport layer stack; wherein the electron transport layer stack is arranged between the emission layer and the cathode;

the electron transport layer stack comprises a first electron transport layer, a second electron transport layer, and a third electron transport layer;

the second electron transport layer is arranged between and in direct contact with the first electron transport layer and the third electron transport layer, respectively;

the first electron transport layer is arranged closer to the emission layer than the third electron transport layer;

the third electron transport layer is arranged closer to the cathode than the first electron transport layer;

the first electron transport layer comprises a compound selected from the compounds A-1 to A-26 shown in Table 1;

the second electron transport layer comprises a compound selected from the compounds A-1 to A-XX shown in Table 1 and a compound selected from the compounds B-1 to B-8 shown in Table 3; and the third electron transport layer comprises a compound selected from the compounds B-1 to B-8 shown in Table 3;

the first electron transport layer does not comprise the compound of Formula (II) as comprised in the third electron transport layer; and the third electron transport layer does not comprise the compound of Formula (I) as comprised in the first electron transport layer; and the first electron transport layer and the second electron transport layer are free of an electrical dopant.

Further Layers

In accordance with the invention, the organic electronic device may comprise, besides the layers already mentioned above, further layers. Exemplary embodiments of respective layers are described in the following:

Substrate

The non-transparent substrate may be any respective substrate that is commonly used in manufacturing of, electronic devices, such as organic light-emitting diodes. Since light is to be emitted through the top surface, the substrate is a non-transparent material, for example a plastic substrate, a metal substrate, a glass substrate coated with a non-transparent layer for example a non-transparent anode layer or a silicon substrate.

Anode Electrode

Either a first electrode or a second electrode comprised in the inventive organic electronic device may be an anode electrode. The anode electrode may be formed by depositing or sputtering a material that is used to form the anode electrode. The material used to form the anode electrode may be a high work-function material, so as to facilitate hole injection. The anode material may also be selected from a low work function material (i.e. aluminum). The anode electrode may be a transparent or reflective electrode. Transparent conductive oxides, such as indium tin oxide (ITO), indium zinc oxide (IZO), tin-dioxide ($SnO_2$), aluminum zinc oxide (AlZO) and zinc oxide (ZnO), may be used to form the anode electrode. The anode electrode may also be formed using metals, typically silver (Ag), gold (Au), or metal alloys.

Hole Injection Layer

A hole injection layer (HIL) may be formed on the anode electrode by vacuum deposition, spin coating, printing, casting, slot-die coating, Langmuir-Blodgett (LB) deposition, or the like. When the HIL is formed using vacuum deposition, the deposition conditions may vary according to the compound that is used to form the HIL, and the desired structure and thermal properties of the HIL. In general, however, conditions for vacuum deposition may include a deposition temperature of 100 °C to 500 °C, a pressure of 10-8 to 10-3 Torr (1 Torr equals 133.322 Pa), and a deposition rate of 0.1 to 10 nm/sec.

When the HIL is formed using spin coating or printing, coating conditions may vary according to the compound that is used to form the HIL, and the desired structure and thermal properties of the HIL. For example, the coating conditions may include a coating speed of about 2000 rpm to about 5000 rpm, and a thermal treatment temperature of about 80 °C to about 200 °C. Thermal treatment removes a solvent after the coating is performed.

The HIL may be formed of any compound that is commonly used to form a HIL. Examples of compounds that may be used to form the HIL include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

The HIL may comprise or consist of p-type dopant and the p-type dopant may be selected from tetrafluoro-tetracyanoquinonedimethane (F4TCNQ), 2,2'-(perfluoronaphthalen-2,6-diylidene) dimalononitrile, 4,4',4"-((1E,1'E,1"E)-cyclopropane-1,2,3-triylidenetris(cyanomethanylylidene))tris(2,3,5,6-tetrafluorobenzonitrile) or 2,2',2"-(cyclopropane-1,2,3-triylidene)tris(2-(p-cyanotetrafluorophenyl)acetonitrile) but not limited hereto. The HIL may be selected from a hole-transporting matrix compound doped with a p-type dopant. Typical examples of known doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis (naphthalen-1-yl)-N,N'-bis(phenyl)-benzidine) doped with F4TCNQ. α-NPD doped with 2,2'-(perfluoronaphthalen-2,6-diylidene) dimalononitrile. The p-type dopant concentrations can be selected from 1 to 20 wt.-%, more preferably from 3 wt.-% to 10 wt.-%.

The thickness of the HIL may be in the range from about 1 nm to about 100 nm, and for example, from about 1 nm to about 25 nm. When the thickness of the HIL is within this range, the HIL may have excellent hole injecting characteristics, without a substantial penalty in driving voltage.

Hole Transport Layer

A hole transport layer (HTL) may be formed on the HIL by vacuum deposition, spin coating, slot-die coating, printing, casting, Langmuir-Blodgett (LB) deposition, or the like. When the HTL is formed by vacuum deposition or spin coating, the conditions for deposition and coating may be similar to those for the formation of the HIL. However, the conditions for the vacuum or solution deposition may vary, according to the compound that is used to form the HTL.

The HTL may be formed of any compound that is commonly used to form a HTL. Compounds that can be suitably used are disclosed for example in Yasuhiko Shirota and Hiroshi Kageyama, Chem. Rev. 2007, 107, 953-1010 and incorporated by reference. Examples of the compound that may be used to form the HTL are: carbazole derivatives, such as N-phenylcarbazole or polyvinylcarbazole; benzidine derivatives, such as N,N'-bis(3-methylphenyl)-N,N'-diphenyl-[1,1-biphenyl]-4,4'-diamine (TPD), or N,N'-di(naphthalen-1-yl)-N,N'-diphenyl benzidine (alpha-NPD); and triphenylamine-based compound, such as 4,4',4"-tris(N-carbazolyl) triphenylamine (TCTA). Among these compounds, TCTA can transport holes and inhibit excitons from being diffused into the EML.

The thickness of the HTL may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL may be 170 nm to 200 nm.

When the thickness of the HTL is within this range, the HTL may have excellent hole transporting characteristics, without a substantial penalty in driving voltage.

Electron Blocking Layer

The function of an electron blocking layer (EBL) is to prevent electrons from being transferred from an emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer may be selected between 2 and 20 nm.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable compounds for the triplet control layer, in particular the triarylamine compounds, are described in EP 2 722 908 A1.

Emission Layer (EML)

The EML may be formed on the HTL by vacuum deposition, spin coating, slot-die coating, printing, casting, LB deposition, or the like. When the EML is formed using vacuum deposition or spin coating, the conditions for deposition and coating may be similar to those for the formation of the HIL. However, the conditions for deposition and coating may vary, according to the compound that is used to form the EML.

It may be provided that the emission layer does not comprise the compound of Formulas (I), (II) and/or the compound (III).

The emission layer (EML) may be formed of a combination of a host and an emitter dopant. Example of the host are Alq3, 4,4'-N,N'-dicarbazole-biphenyl (CBP), poly(n-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBI), 3-tert-butyl-9,10-di-2-naphthylanthracenee (TBADN), distyrylarylene (DSA) and bis(2-(2-hydroxyphenyl)benzothiazolate)zinc (Zn(BTZ)2).

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, Ir(piq)3, and Btp2lr(acac), but are not limited thereto. These compounds are phosphorescent emitters, however, fluorescent red emitter dopants could also be used.

Examples of phosphorescent green emitter dopants are Ir(ppy)3 (ppy=phenylpyridine), Ir(ppy)2(acac), Ir(mpyp)3.

Examples of phosphorescent blue emitter dopants are F2Irpic, (F2ppy)2Ir(tmd) and Ir(dfppz)3 and ter-fluorene. 4.4'-bis(4-diphenyl amiostyryl)biphenyl (DPAVBi), 2,5,8,11-tetra-tert-butyl perylene (TBPe) are examples of fluorescent blue emitter dopants.

The amount of the emitter dopant may be in the range from about 0.01 to about 50 parts by weight, based on 100 parts by weight of the host. Alternatively, the emission layer may consist of a light-emitting polymer. The EML may have a thickness of about 10 nm to about 100 nm, for example, from about 20 nm to about 60 nm. When the thickness of the EML is within this range, the EML may have excellent light emission, without a substantial penalty in driving voltage.

Hole Blocking Layer (HBL)

A hole blocking layer (HBL) may be formed on the EML, by using vacuum deposition, spin coating, slot-die coating, printing, casting, LB deposition, or the like, in order to prevent the diffusion of holes into the ETL. When the EML comprises a phosphorescent dopant, the HBL may have also a triplet exciton blocking function.

The HBL may also be named auxiliary ETL or a-ETL.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include oxadiazole derivatives, triazole derivatives, and phenanthroline derivatives.

The HBL may have a thickness in the range from about 5 nm to about 100 nm, for example, from about 10 nm to about 30 nm. When the thickness of the HBL is within this range, the HBL may have excellent hole-blocking properties, without a substantial penalty in driving voltage.

Electron Transport Layer (ETL)

The OLED according to the present invention comprises at least three electron transport layers (ETLs). At least three of the electron transport layers are the first electron transport layer, the second electron transport layer, and the third electron transport layer as defined herein. In addition, the OLED may comprise further ETLs which may or may not be as defined above. If the additional ETL(s) is/are not as defined above, the characteristics thereof may be as follows.

According to various embodiments the OLED comprises an electron transport layer stack comprising at least a first electron transport layer (ETL-1) comprising (especially consisting of) the compound of formula (I), at least a second electron transport layer (ETL-2) comprising (especially consisting of) the compound of formula (I) and the compound of formula (II), and at least a third electron transport layer (ETL-3) comprising (or especially consisting of) the of formula (II).

By suitably adjusting energy levels of particular layers of the ETL, the injection and transport of the electrons may be controlled, and the holes may be efficiently blocked. Thus, the OLED may have long lifetime, improved performance and stability.

Electron Injection Layer (EIL)

An EIL, which may facilitate injection of electrons from the cathode into the electron transport layer stack, may be formed on the electron transport layer stack, preferably directly on the electron transport layer stack, preferably directly on the second electron transport layer, preferably in direct contact with the second electron transport layer. Examples of materials for forming the EIL or being comprised in the EIL include lithium 8-hydroxyquinolinolate (LiQ), LiF, NaCl, CsF, Li2O, BaO, Ca, Ba, Yb, Mg which are known in the art. Deposition and coating conditions for forming the EIL are similar to those for formation of the HIL, although the deposition and coating conditions may vary, according to the material that is used to form the EIL. The EIL may comprise an organic matrix material doped with an n-type dopant. The matrix material may be selected from materials conventionally used as matrix materials for electron transport layers.

The EIL may consist of a number of individual EIL sublayers. In case the EIL consists of a number of individual EIL sublayers, the number of sublayers is preferably 2. The individual EIL sublayers may comprise different materials for forming the EIL.

The thickness of the EIL may be in the range from about 0.1 nm to about 10 nm, for example, in the range from about 0.5 nm to about 9 nm. When the thickness of the EIL is within this range, the EIL may have satisfactory electron-injecting properties, without a substantial penalty in driving voltage.

The electron transport stack of the present invention is not part of the electron injection layer.

Cathode Electrode

The cathode electrode is formed on the EIL if present, preferably directly on the EIL, preferably in direct contact with the EIL. In the sense of this invention the cathode and the EIL can be regarded as one functional part enabling the injection of electrons into the electron transport layer stack. The cathode electrode may be formed of a metal, an alloy, an electrically conductive compound, or a mixture thereof. The cathode electrode may have a low work function. For example, the cathode electrode may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. Alternatively, the cathode electrode may be formed of a transparent conductive oxide, such as ITO or IZO.

Charge Generation Layer

The charge generation layer (CGL), that is, the first CGL as well as any other CGL comprised in the inventive OLED, may comprise a p-type CGL and an n-type CGL. An interlayer may be arranged between the p-type layer and the n-type layer.

Typically, the charge generation layer GCL is a pn junction joining an n-type charge generation layer (electron generating layer, n-type CGL) and a-type charge generation layer (hole generating layer, p-type CGL). The n-side of the pn junction generates electrons and injects them into the layer which is adjacent in the direction to the anode. Analogously, the p-side of the pn junction generates holes and injects them into the layer which is adjacent in the direction to the cathode.

Charge generation layers are used in tandem OLEDs (such as that of the present disclosure) comprising, between the cathode and anode, two or more emission layers. In a tandem OLED comprising two emission layers, the n-type charge generation layer provides electrons for the first light emission layer arranged near the anode, while the hole generating layer provides holes to the second light emission layer arranged between the first emission layer and the cathode.

Suitable matrix materials for the hole generating layer may be materials conventionally used as hole injection and/or hole transport matrix materials. Also, p-type dopant used for the hole generating layer can employ conventional materials. For example, the p-type dopant can be one selected from a group consisting of tetrafluore-7,7,8,8-tetracyanoquinodimethane (F4-TCNQ), derivatives of tetracyanoquinodimethane, radialene derivatives, iodine, FeCl3, FeF3, and SbCl5. Also, the host can be one selected from a group consisting of N,N'-di(naphthalen-1-yl)-N,N-diphenyl-benzidine (NPB), N,N'-diphenyl-N,N'-bis(3-methylphenyl)-1,1-biphenyl-4,4'-diamine (TPD) and N,N',N'-tetranaphthyl-benzidine (TNB). The p-type charge generation layer may consist of CNHAT.

The n-type charge generation layer may be layer of a neat n-type dopant, for example of an electropositive metal, or can consist of an organic matrix material doped with the n-type dopant. In one embodiment, the n-type dopant can be alkali metal, alkali metal compound, alkaline earth metal, alkaline earth metal compound, a transition metal, a transition metal compound or a rare earth metal. In another embodiment, the metal can be one selected from a group consisting of Li, Na, K, Rb, Cs, Mg, Ca, Sr, Ba, La, Ce, Sm, Eu, Tb, Dy, and Yb. More specifically, the n-type dopant can be one selected from a group consisting of Cs, K, Rb, Mg, Na, Ca, Sr, Eu and Yb. Suitable matrix materials for the n-type charge generation layer layer may be the materials conventionally used as matrix materials for electron injection or electron transport layers. The matrix material can be for example one selected from a group consisting of N-containing heterocyclic compounds like triazine compounds or phenathroline compounds such as compound E or bipyridyl or terpyridyl compounds, hydroxyquinoline derivatives like tris(8-hydroxyquinoline)aluminum, benzazole derivatives, and silole derivatives.

The hole generating layer may be arranged in direct contact to the n-type charge generation layer.

Organic Light-Emitting Diode (OLED)

The organic electronic device according to the invention is an organic light-emitting device.

According to one aspect of the present invention, there is provided an organic light-emitting diode (OLED) comprising: a substrate; an anode electrode formed on the substrate; a hole injection layer, a hole transport layer, an emission layer, the electron transport layer stack and a cathode electrode.

According to one aspect of the present invention, there is provided an organic light-emitting diode (OLED) comprising: a substrate; an anode electrode formed on the substrate; a hole injection layer, a hole transport layer, an electron blocking layer, an emission layer, the electron transport layer stack, an electron injection layer and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer, the electron transport layer stack, and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer, the electron transport layer stack, an electron injection layer, and a cathode electrode.

According to various embodiments of the present invention, there may be provided OLEDs layers arranged between the above mentioned layers, on the substrate or on the top electrode.

According to one aspect, the OLED can comprise a layer structure of a substrate that is adjacent arranged to an anode electrode, the anode electrode is adjacent arranged to a first hole injection layer, the first hole injection layer is adjacent arranged to a first hole transport layer, the first hole transport layer is adjacent arranged to a first electron blocking layer, the first electron blocking layer is adjacent arranged to a first emission layer, the first emission layer is adjacent arranged to a first electron transport layer, the first electron transport layer is adjacent arranged to a second electron transport layer, the second electron transport layer is adjacent to a third electron transport layer, the third electron transport layer is arranged to an electron injection layer, the electron injection layer is adjacent arranged to the cathode electrode.

For example, the OLED (100) according to FIG. 1 may be formed by a process, wherein on a substrate (110), an anode (120), a hole injection layer (130), a hole transport layer (140), an emission layer (150), an electron transport layer stack (160) comprising a first electron transport layer (161), a second electron transport layer (162), a third electron transport layer (163), an electron injection layer (180) and the cathode electrode (190) are subsequently formed in that order.

For example, the OLED (100) according to FIG. 2 may be formed by a process, wherein on a substrate (110), an anode (120), a hole injection layer (130), a hole transport layer (140), an electron blocking layer (145), an emission layer (150), an electron transport layer stack (160) comprising a first electron transport layer (161), a second electron transport layer (162), a third electron transport layer (163), an electron injection layer (180) and the cathode electrode (190) are subsequently formed in that order.

For preparing the inventive OLED, it is possible to use only 2 sources one comprising the compound of formula (I) and the other one comprising the compound of formula (II). The first electron transport layer can then be prepared using only the first source; the second electron transport layer is prepared using both sources for co-evaporating the compounds of the formulas (I) and (II), and the third electron transport layer can then be prepared using only the second source.

The methods for deposition that can be suitable comprise:

deposition via vacuum thermal evaporation;

deposition via solution processing, preferably the processing is selected from spin-coating, printing, casting; and/or slot-die coating.

The second electron transport layer comprises a compound of formula (I) and a compound of formula (II) and the two compounds may be deposited by co-deposition from two separate deposition sources or deposited as a pre-mix from one single deposition source. A pre-mix is a mixture of at least two compounds and that mixture was prepared prior to filling it into the deposition source.

According to various embodiments of the present invention, the method may further include forming on the anode electrode, an emission layer and at least one layer selected from the group consisting of forming a hole injection layer, forming a hole transport layer, or forming an electron hole blocking layer, between the anode electrode and the first electron transport layer.

According to various embodiments of the present invention, the method may further include the steps for forming an organic light-emitting diode (OLED), wherein on a substrate a first anode electrode is formed, on the first anode electrode an emission layer is formed, on the emission layer an electron transport layer stack is formed, optionally a hole blocking layer is formed on the emission layer and on the electron transport layer an electro injection layer is formed, and finally a cathode electrode is formed, optional a hole injection layer, a hole transport layer, and a hole blocking layer, formed in that order between the first anode electrode and the emission layer, an electron injection layer is formed between the electron transport layer stack and the cathode electrode.

According to various embodiments of the present invention, the method further comprises forming an electron injection layer on the organic semiconducting layer. According to various embodiments, the OLED may have the following layer structure, wherein the layers having the following order:

anode, hole injection layer, first hole transport layer, second hole transport layer, emission layer, optional hole blocking layer, the electron transport layer stack, an electron injection layer, and cathode.

According to another aspect of the invention, it is provided an electronic device comprising at least one organic light emitting device according to any embodiment described throughout this application, preferably, the electronic device comprises the organic light emitting diode in one of embodiments described throughout this application. More preferably, the electronic device is a display device.

In one embodiment, the organic electronic device according to the invention may further comprise a layer comprising a radialene compound and/or a quinodimethane compound.

In one embodiment, the radialene compound and/or the quinodimethane compound may be substituted with one or more halogen atoms and/or with one or more electron withdrawing groups. Electron withdrawing groups can be selected from nitrile groups, halogenated alkyl groups, alternatively from perhalogenated alkyl groups, alternatively from perfluorinated alkyl groups. Other examples of electron withdrawing groups may be acyl, sulfonyl groups or phosphoryl groups.

Alternatively, acyl groups, sulfonyl groups and/or phosphoryl groups may comprise halogenated and/or perhalogenated hydrocarbyl. In one embodiment, the perhalogenated hydrocarbyl may be a perfluorinated hydrocarbyl. Examples of a perfluorinated hydrocarbyl can be perfluormethyl, perfluorethyl, perfluorpropyl, perfluorisopropyl, perfluorobutyl, perfluorophenyl, perfluorotolyl; examples of sulfonyl groups comprising a halogenated hydrocarbyl may be trifluoromethylsulfonyl, pentafluoroethylsulfonyl, pentafluorophenylsulfonyl, heptafluoropropylsufonyl, nonafluorobutylsulfonyl, and like.

In one embodiment, the radialene and/or the quinodimethane compound may be comprised in a hole injection, hole transporting and/or a hole generation layer.

In one embodiment, the radialene compound may have Formula (XX) and/or the quinodimethane compound may have Formula (XXIa) or (XXIb):

(XX)

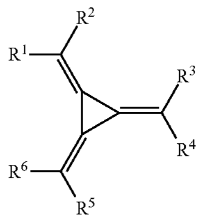

(XXIa)

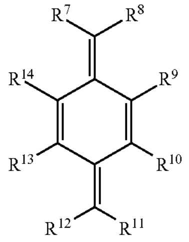

(XXIb)

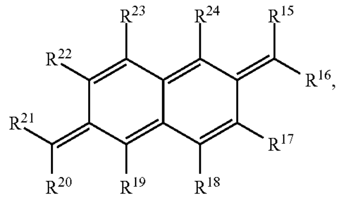

wherein $R^1$, $R^2$, $R^3$, $R^4$, $R^5$, $R^6$, $R^7$, $R^8$, $R^{11}$, $R^{12}$, $R^{15}$, $R^{16}$, $R^{20}$, $R^{21}$ are independently selected from above mentioned electron withdrawing groups and $R^9$, $R^{10}$, $R^{13}$, $R^{14}$, $R^{17}$, $R^{18}$, $R^{19}$, $R^{22}$, $R^{23}$ and $R^{24}$ are independently selected from H, halogen and above mentioned electron withdrawing groups.

Hereinafter, the embodiments are illustrated in more detail with reference to examples. However, the present disclosure is not limited to the following examples. Reference will now be made in detail to the exemplary aspects.

GENERAL DEFINITIONS

In the present specification, when a definition is not otherwise provided, an "alkyl group" may refer to an aliphatic hydrocarbon group. The alkyl group may refer to "a saturated alkyl group" without any double bond or triple bond. The term "alkyl" as used herein shall encompass linear as well as branched and cyclic alkyl. For example, $C_3$-alkyl may be selected from n-propyl and iso-propyl. Likewise, $C_4$-alkyl encompasses n-butyl, sec-butyl and t-butyl. Likewise, $C_6$-alkyl encompasses n-hexyl and cyclohexyl.

As used herein if not explicitly mentioned else, the asterisk symbol "*" represents a binding position at which the moiety labelled accordingly is bond to another moiety.

The subscribed number n in $C_n$ relates to the total number of carbon atoms in the respective alkyl, arylene, heteroarylene or aryl group.

The term "aryl" or "arylene" as used herein shall encompass phenyl ($C_6$-aryl), fused aromatics, such as naphthalene, anthracene, phenanthrene, tetracene etc. Further encompassed are biphenyl and oligo- or polyphenyls, such as terphenyl, phenyl-substituted biphenyl, phenyl-substituted terphenyl (such as tetraphenyl benzole groups) etc. "Arylene" respectively "heteroarylene", refers to groups to which two further moieties are attached. In the present specification, the term "aryl group" or "arylene group" may refer to a group comprising at least one hydrocarbon aromatic moiety, and all the elements of the hydrocarbon aromatic moiety may have p-orbitals which form conjugation, for example a phenyl group, a napthyl group, an anthracenyl group, a phenanthrenyl group, a pyrinyl group, a fluorenyl group and the like. Further encompassed are spiro compounds in which two aromatic moieties are connected with each other via a spiro-atom, such as 9,9'-spirobi[9H-fluorene]yl. The aryl or arylene group may include a monocyclic or fused ring polycyclic (i.e., links sharing adjacent pairs of carbon atoms) functional group.

The term "heteroaryl" as used herein refers to aryl groups in which at least one carbon atom is substituted with a heteroatom. The term "heteroaryl" may refer to aromatic heterocycles with at least one heteroatom, and all the elements of the hydrocarbon heteroaromatic moiety may have p-orbitals which form conjugation. The heteroatom may be selected from N, O, S, B, Si, P, Se, preferably from N, O and S. A heteroarylene ring may comprise at least 1 to 3 heteroatoms. Preferably, a heteroarylene ring may comprise at least 1 to 3 heteroatoms individually selected from N, S and/or O. Just as in case of "aryl"/"arylene", the term "heteroaryl" comprises, for example, spiro compounds in which two aromatic moieties are connected with each other, such as spiro[fluorene-9,9'-xanthene]. Further exemplary heteroaryl groups are diazine, triazine, dibenzofurane, dibenzothiofurane, acridine, benzoacridine, dibenzoacridine etc.

The term "alkenyl" as used herein refers to a group $-CR^1{=}CR^2R^3$ comprising a carbon-carbon double bond.

The term "perhalogenated" as used herein refers to a hydrocarbyl group wherein all of the hydrogen atoms of the hydrocarbyl group are replaced by halogen (F, Cl, Br, I) atoms.

The term "alkoxy" as used herein refers to a structural fragment of the Formula —OR with R being hydrocarbyl, preferably alkyl or cycloalkyl.

The term "thioalkyl" as used herein refers to a structural fragment of the Formula —SR with R being hydrocarbyl, preferably alkyl or cycloalkyl.

The subscripted number n in $C_n$-heteroaryl merely refers to the number of carbon atoms excluding the number of heteroatoms. In this context, it is clear that a $C_3$ heteroarylene group is an aromatic compound comprising three carbon atoms, such as pyrazol, imidazole, oxazole, thiazole and the like.

The term "heteroaryl" as used herewith shall encompass pyridine, quinoline, benzoquinoline, quinazoline, benzoquinazoline, pyrimidine, pyrazine, triazine, benzimidazole, benzothiazole, benzo[4,5]thieno[3,2-d]pyrimidine, carbazole, xanthene, phenoxazine, benzoacridine, dibenzoacridine and the like.

In the present specification, the term single bond refers to a direct bond.

The term "fluorinated" as used herein refers to a hydrocarbon group in which at least one of the hydrogen atoms comprised in the hydrocarbon group is substituted by a fluorine atom. Fluorinated groups in which all of the hydrogen atoms thereof are substituted by fluorine atoms are referred to as perfluorinated groups and are particularly addressed by the term “fluorinated”.

In terms of the invention, a group is “substituted with” another group if one of the hydrogen atoms comprised in this group is replaced by another group, wherein the other group is the substituent.

In terms of the invention, the expression “between” with respect to one layer being between two other layers does not exclude the presence of further layers which may be arranged between the one layer and one of the two other layers. In terms of the invention, the expression “in direct contact” with respect to two layers being in direct contact with each other means that no further layer is arranged between those two layers. One layer deposited on the top of another layer is deemed to be in direct contact with this layer.

The term “contacting sandwiched” refers to an arrangement of three layers whereby the layer in the middle is in direct contact with the two adjacent layers.

With respect to the inventive electron transport layer stack the compounds mentioned in the experimental part are most preferred.

A lighting device may be any of the devices used for illumination, irradiation, signaling, or projection. They are correspondingly classified as illuminating, irradiating, signaling, and projecting devices. A lighting device usually consists of a source of optical radiation, a device that transmits the radiant flux into space in the desired direction, and a housing that joins the parts into a single device and protects the radiation source and light-transmitting system against damage and the effects of the surroundings.

The organic electroluminescent device (OLED) may be a bottom- or top-emission device. The organic electroluminescent device (OLED) may emit the light trough a transparent anode or through a transparent cathode.

Another aspect is directed to a device comprising at least one organic electroluminescent device (OLED).

A device comprising organic light-emitting diodes is for example a display or a lighting panel.

In the present invention, the following defined terms, these definitions shall be applied, unless a different definition is given in the claims or elsewhere in this specification.

In the context of the present specification the term “different” or “differs” in connection with the matrix material means that the matrix material differs in their structural Formula.

The terms “OLED” and “organic light-emitting diode” are simultaneously used and have the same meaning. The term “organic electroluminescent device” as used herein may comprise both organic light emitting diodes as well as organic light emitting transistors (OLETs).

As used herein, “weight percent”, “wt.-%”, “percent by weight”, “% by weight”, and variations thereof refer to a composition, component, substance or agent as the weight of that component, substance or agent of the respective electron transport layer divided by the total weight of the respective electron transport layer thereof and multiplied by 100. It is under-stood that the total weight percent amount of all components, substances and agents of the respective electron transport layer and electron injection layer are selected such that it does not exceed 100 wt.-%.

As used herein, “volume percent”, “vol.-%”, “percent by volume”, “% by volume”, and variations thereof refer to a composition, component, substance or agent as the volume of that component, substance or agent of the respective electron transport layer divided by the total volume of the respective electron transport layer thereof and multiplied by 100. It is understood that the total volume percent amount of all components, substances and agents of the cathode layer are selected such that it does not exceed 100 vol.-%.

All numeric values are herein assumed to be modified by the term “about”, whether or not explicitly indicated. As used herein, the term “about” refers to variation in the numerical quantity that can occur. Whether or not modified by the term “about” the claims include equivalents to the quantities.

It should be noted that, as used in this specification and the appended claims, the singular forms “a”, “an”, and “the” include plural referents unless the content clearly dictates otherwise.

The term “free of”, “does not contain”, “does not comprise” does not exclude impurities. Impurities have no technical effect with respect to the object achieved by the present invention.

In the context of the present specification the term “essentially non-emissive” or “non-emissive” means that the contribution of the compound or layer to the visible emission spectrum from the device is less than 10%, preferably less than 5% relative to the visible emission spectrum. The visible emission spectrum is an emission spectrum with a wavelength of about ≥380 nm to about ≤780 nm.

Preferably, the organic semiconducting layer comprising the compound of Formula (I) is essentially non-emissive or non-emitting.

The operating voltage, also named U, is measured in Volt (V) at 10 milliAmpere per square centimeter (mA/cm2).

The candela per Ampere efficiency, also named cd/A efficiency is measured in candela per ampere at 10 milliAmpere per square centimeter (mA/cm2).

The external quantum efficiency, also named EQE, is measured in percent (%).

The color space is described by coordinates CIE-x and CIE-y (International Commission on Illumination 1931). For blue emission the CIE-y is of particular importance. A smaller CIE-y denotes a deeper blue color. Efficiency values are compared at the same CIE-y.

The highest occupied molecular orbital, also named HOMO, and lowest unoccupied molecular orbital, also named LUMO, are measured in electron volt (eV).

The term “OLED”, “organic light emitting diode”, “organic light emitting device”, “organic optoelectronic device” and “organic light-emitting diode” are simultaneously used and have the same meaning.

The term “life-span” and “lifetime” are simultaneously used and have the same meaning.

The anode and cathode may be described as anode electrode/cathode electrode or anode electrode/cathode electrode or anode electrode layer/cathode electrode layer.

Room temperature, also named ambient temperature, is 23 °C.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
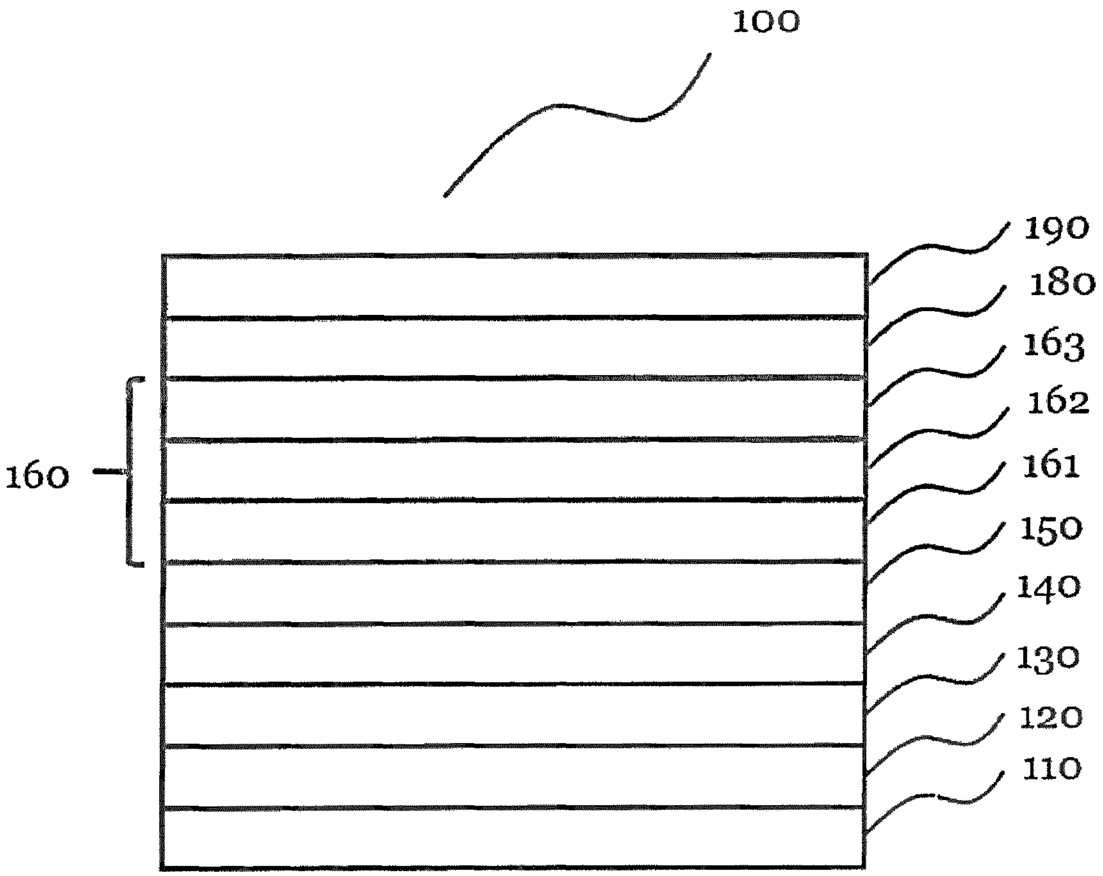
FIG. 1 is a schematic sectional view of an organic light-emitting diode (OLED), according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" or "onto" a second element, the first element can be disposed directly on the second element, or one or more other elements may be disposed there between. When a first element is referred to as being formed or disposed "directly on" or "directly onto" a second element, no other elements are disposed there between.

FIG. 1 is a schematic sectional view of an organic light-emitting diode (OLED) 100, according to an exemplary embodiment of the present invention. The OLED 100 includes a non-transparent substrate 110, an anode 120, a hole injection layer (HIL) 130, a hole transport layer (HTL) 140, an emission layer (EML) 150, an electron transport layer (ETL) stack 160 comprising a first electron transport layer 161, a second electron transport layer 162 and a third electron transport layer 163. The electron transport layer stack 160 is formed on the EML 150. Onto the electron transport layer stack 160, an electron injection layer (EIL) 180 is disposed. The cathode 190 is disposed directly onto the electron injection layer (EIL) 180.

Figure 2:
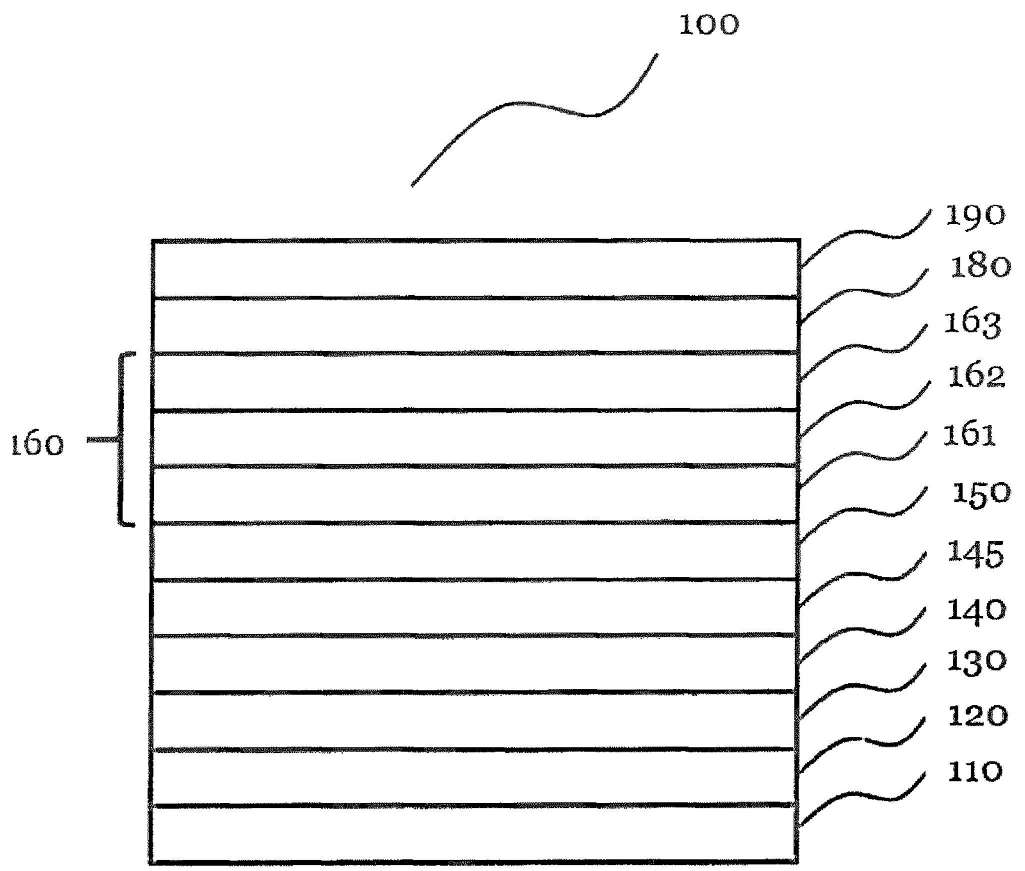
FIG. 2 is a schematic sectional view of an OLED, according to an exemplary embodiment of the present invention.

FIG. 2 is a schematic sectional view of an OLED 100, according to another exemplary embodiment of the present invention. FIG. 2 differs from FIG. 1 in that the OLED 100 of FIG. 2 comprises an electron blocking layer (EBL) 145.

Referring to FIG. 2, the OLED 100 includes a non-transparent substrate 110, an anode 120, a hole injection layer (HIL) 130, a hole transport layer (HTL) 140, an electron blocking layer (EBL) 145, an emission layer (EML) 150, an electron transport layer (ETL) stack 160 comprising a first electron transport layer 161, a second electron transport layer 162, a third electron transport layer 163, an electron injection layer (EIL) 180 and a cathode electrode 190.

While not shown in FIG. 1 and FIG. 2 a sealing layer may further be formed on the cathode electrodes 190, in order to seal the OLEDs 100 and 200. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

Dipole Moment

The dipole moment $|\vec{\mu}|$ of a molecule containing N atoms is given by:

$$\vec{\mu} = \sum_{i}^{N} q_i \vec{r_i}$$

$$|\vec{\mu}| = \sqrt{\mu_x^2 + \mu_y^2 + \mu_z^2}$$

where $q_i$ and $\vec{r_i}$ are the partial charge and position of atom i in the molecule.

The dipole moment is determined by a semi-empirical molecular orbital method.

The geometries of the molecular structures are optimized using the hybrid functional B3LYP with the 6-31G* basis set in the gas phase as implemented in the program package TURBOMOLE V6.5 (TURBOMOLE GmbH, Litzenhardtstrasse 19, 76135 Karlsruhe, Germany). If more than one conformation is viable, the conformation with the lowest total energy is selected to determine the bond lengths of the molecules.

Calculated HOMO and LUMO

The HOMO and LUMO are calculated with the program package TURBOMOLE V6.5 (TURBOMOLE GmbH, Litzenhardtstrasse 19, 76135 Karlsruhe, Germany). The optimized geometries and the HOMO and LUMO energy levels of the molecular structures are determined by applying the hybrid functional B3LYP with a 6-31G* basis set in the gas phase. If more than one conformation is viable, the conformation with the lowest total energy is selected.

Melting Point

The melting point (mp) is determined as peak temperatures from the DSC curves of the above TGA-DSC measurement or from separate DSC measurements (Mettler Toledo DSC822e, heating of samples from room temperature to completeness of melting with heating rate 10 K/min under a stream of pure nitrogen. Sample amounts of 4 to 6 mg are placed in a 40 μL Mettler Toledo aluminum pan with lid, a <1 mm hole is pierced into the lid).

Glass Transition Temperature

The glass transition temperature (Tg) is measured under nitrogen and using a heating rate of 10 K per min in a Mettler Toledo DSC 822e differential scanning calorimeter as described in DIN EN ISO 11357, published in March 2010.

Rate Onset Temperature

The rate onset temperature (TRO) is determined by loading 100 mg compound into a VTE source. As VTE source a point source for organic materials may be used as supplied by Kurt J. Lesker Company (www.lesker.com) or CreaPhys GmbH (http://www.creaphys.com). The VTE source is heated at a constant rate of 15 K/min at a pressure of less than 10-5 mbar and the temperature inside the source measured with a thermocouple. Evaporation of the compound is detected with a QCM detector which detects deposition of the compound on the quartz crystal of the detector. The deposition rate on the quartz crystal is measured in Angstrom per second. To determine the rate onset temperature, the deposition rate is plotted against the VTE source temperature. The rate onset is the temperature at which noticeable deposition on the QCM detector occurs. For accurate results, the VTE source is heated and cooled three time and only results from the second and third run are used to determine the rate onset temperature.

To achieve good control over the evaporation rate of an organic compound, the rate onset temperature may be in the range of 200 to 255 °C. If the rate onset temperature is below 200 °C the evaporation may be too rapid and therefore difficult to control. If the rate onset temperature is above 255 °C the evaporation rate may be too low which may result in low tact time and decomposition of the organic compound in VTE source may occur due to prolonged exposure to elevated temperatures.

The rate onset temperature is an indirect measure of the volatility of a compound. The higher the rate onset temperature the lower is the volatility of a compound.

Reduction Potential

The reduction potential is determined by cyclic voltammetry with potenioststic device Metrohm PGSTAT30 and software Metrohm Autolab GPES at room temperature. The redox potentials given at particular compounds were measured in an argon de-aerated, dry 0.1M THF solution of the tested substance, under argon atmosphere, with 0.1M tetrabutylammonium hexafluorophosphate supporting electrolyte, between platinum working electrodes and with an Ag/AgCl pseudo-standard electrode (Metrohm Silver rod electrode), consisting of a silver wire covered by silver chloride and immersed directly in the measured solution, with the scan rate 100 mV/s. The first run was done in the broadest range of the potential set on the working electrodes, and the range was then adjusted within subsequent runs appropriately. The final three runs were done with the addition of ferrocene (in 0.1M concentration) as the standard. The average of potentials corresponding to cathodic and anodic peak of the studied compound, after subtraction of the average of cathodic and anodic potentials observed for the standard Fc+/Fc redox couple, afforded finally the values reported above. All studied compounds as well as the reported comparative compounds showed well-defined reversible electrochemical behavior.

Synthesis Procedure 2,4-diphenyl-6-(1-(3',4',5'-triphenyl-[1,1':2',1"-terphenyl]-3-yl) naphthalen-2-yl)-1,3,5-triazine (A-10)

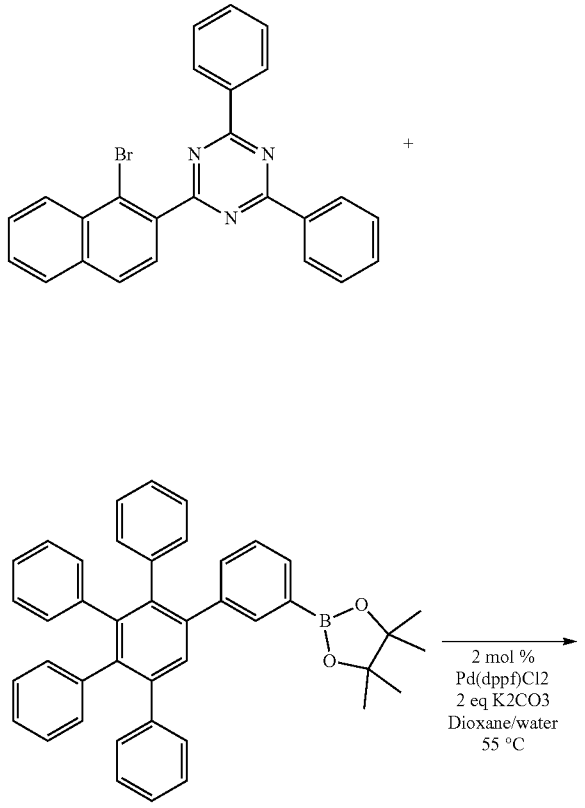

-continued

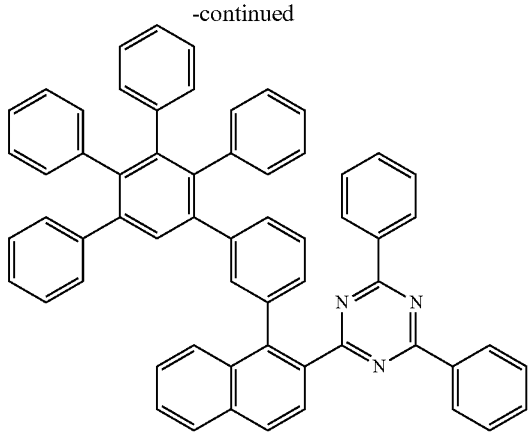

3-neck round-bottom flask was flushed with nitrogen and charged with 2-(1-bromonaphthalen-2-yl)-4,6-diphenyl-1,3,5-triazine (CAS 1642848-97-2, 1 eq, 15.0 g), 4,4,5,5-tetramethyl-2-(3',4',5'-triphenyl-[1,1':2',1"-terphenyl]-3-yl)-1,3,2-dioxaborolane (CAS 872118-08-6, 1 eq, 20 g), [1,1'-bis (diphenylphosphino)ferrocene]dichloropalladium(II) (CAS 72287-26-4, 0.02 eq, 0.50 g), potassium carbonate (CAS 584-08-7, 2 eq, 9.44 g). Deaerated mixture of 170 ml dioxane and 34 ml water was added. Reaction was running at 55 °C under a nitrogen atmosphere overnight. Next day, dense yellow suspension was formed. The reaction mixture was cooled down, the precipitate was filtered and washed with methanol and water, and dried at low pressure. The raw product was dissolved at elevated temperature in 300 ml chlorobenzene and filtered hot through a silica pad. The solvent was rotary evaporated to residual volume of the solution about 200 mL and the formed precipitate was filtered. Light yellow crystalline powder was obtained. Yield: 22.5 g (81%).

The synthesis of B-6 (WO 2021/116 225 A1), B-8 (WO 2021/058 761 A1), A-4 (WO 2016/171 358 A1), A-5 (WO 2017/135 510 A1), A-8 (EP 3 312 895 A1), A-9 (WO 2017/135 510 A1), A-12 (EP 3 805 206 A1), A-16 (EP 3 312 895 A1), A-17 (WO 2020/120 794 A1), A-18 (WO 2016/111 515 A1) and A-19 (EP 3 312 896 A1) has been described elsewhere.

Compounds A-3, A-6 and A-14 can be synthesized according to the disclosure of WO 2019/238 858 A1. A-1 can be synthesized according to the disclosure of WO 2019/121 672 A1. A-2 can be synthesized according to the disclosure of WO 2021/009 206 A1. A-13 can be synthesized analogue to A-2. B-2 can be synthesized according to procedure in WO 2018/215 355 A1, starting from the direct precursor 2361069-49-8—this synthesis is described in WO 2020 004 844. B-1 can be synthesized according to the disclosure of WO 2018/215 355 A1. B-3 can be synthesized analogue to B-1.

General Procedure for Fabrication of OLEDs

For the top emission OLED devices, a substrate with dimensions of 150 mm×150 mm×0.7 mm was ultrasonically cleaned with a 2% aqueous solution of Deconex FPD 211 for 7 minutes and then with pure water for 5 minutes, and dried for 15 minutes in a spin rinse dryer. Subsequently, Ag was deposited as anode at a pressure of $10^{-5}$ to $10^{-7}$ mbar.

Then, HT-1 and D-1 were vacuum co-deposited on the anode to form a HIL. Then, HT-1 was vacuum deposited on the HIL to form an HTL. Then, HT-2 was vacuum deposited on the HTL to form an electron blocking layer (EBL).

Afterwards the emission layer was formed on the EBL by co-deposition of HOST-1 and EMITTER-1.

Then, the compound of Formula (I) was vacuum deposited from source A onto the emission layer to form the first electron transport layer. Then, the compound of formula (II) was evaporated from a second source B by switching the same on to form a mixed layer of compound of Formula (I) and compound of formula (II). Then, source A was switched off to form the second electron transport layer by depositing the compound of Formula (II).

Then, the electron injection layer is formed as a double layer on the second electron transport layer by depositing first LiQ and subsequently Yb.

Ag:Mg is then evaporated at a rate of 0.01 to 1 Å/s at $10^{-7}$ mbar to form a cathode.

A cap layer of HT-3 is formed on the cathode.

TABLE 4

| | IUPAC name | Reference |
|---|---|---|
| HT-1 | N-([1,1'-biphenyl]-2-yl)-N-(9,9-dimethyl-9H-fluoren-2-yl)-9,9'-spirobi[fluoren]-2-amine [CAS 1364603-07-5] | WO2012034627 |
| HT-2 | N-([1,1'-biphenyl]-4-yl)-9,9-diphenyl-N-(4-(triphenylsilyl)phenyl)-9H-fluoren-2-amine [CAS 1613079-70-1] | WO2014088047 |
| D-1 | 4,4',4''-((1E,1'E,1''E)-cyclopropane-1,2,3-triylidenetris(cyanomethanylylidene))tris(2,3,5,6-tetrafluorobenzonitrile) [CAS 1224447-88-4] | US2008265216 |
| HOST-1 | H09 (Fluorescent-blue host material) | Commercially available from Sun Fine Chemicals, Inc, S. Korea |
| EMITTER-1 | BD200 (Fluorescent-blue emitter material) | Commercially available from Sun Fine Chemicals, Inc, S. Korea |
| LiQ | 8-Hydroxyquinolinolato-lithium [CAS 850918-68-2] | WO2013079217 |
| HT-3 | N-([1,1'-biphenyl]-4-yl)-9,9-dimethyl-N-(4-(9-phenyl-9H-carbazol-3-yl)phenyl)-9H-fluoren-2-amine [CAS 1242056-42-3] | US2016322581 |

The details of the layer stack in the top emission OLED devices are given below. A slash "/" separates individual layers. Layer thicknesses are given in squared brackets [ . . . ], mixing ratios in wt % given in round brackets ( . . . ):

Layer stack details used in the OLED device examples of Table 5:

Ag [100 nm]/HT-1:D-1 (wt %, 92:8) [10 nm]/HT-1 [130 mm]/HT-2 [5 nm]/H09:BD200 (wt % 97:3) [20 nm]/Compound of Formula (I) [5 nm]/Compound of Formula (I): Compound of Formula (IL) [25 nm]/Compound of Formula (ID) [5 nm]/LiQ [1 nm]/Yb [2 nm]/Ag:Mg (wt %-90:10) [13 mm]/HT-3 [75 nm]

TABLE 5

| OLED device name | ETL1 | ETL2 | ETL3 | EIL1 | EIL2 | CIEy | V 10 mA/cm$^2$ (% vs CompEx − 1) | CEff 10 mA/cm$^2$ (% vs CompEx − 1) | CEff/CIEy 10 mA/cm$^2$ (% vs CompEx − 1) | LT97 30 mA/cm$^2$ (% vs CompEx − 1) |
|---|---|---|---|---|---|---|---|---|---|---|
| Comp Ex-1 | A-16 | B-1:A-17 (30:70) | — | LiQ | Yb | 0.044 | 100% | 100% | 100% | 100% |
| OLED-1 | A-16 | B-1:A-16 (30:70) | B-1 | LiQ | Yb | 0.044 | 102% | 103% | 102% | 107% |
| OLED-2 | A-16 | B-3:A-16 (30:70) | B-3 | LiQ | Yb | 0.044 | 101% | 106% | 105% | 97% |
| OLED-3 | A-16 | B-1:A-16 (30:70) | B-1 | LiQ | Yb | 0.043 | 102% | 101% | 97% | 139% |
| OLED-4 | A-16 | B-3:A-16 (30:70) | B-3 | LiQ | Yb | 0.046 | 102% | 101% | 97% | 104% |
| OLED-5 | A-16 | B-3:A-16 (40:60) | B-3 | LiQ | Yb | 0.047 | 103% | 101% | 97% | 106% |
| OLED-7 | A-16 | B-1:A-16 (30:70) | B-1 | LiQ | Yb | 0.043 | 102% | 101% | 97% | 139% |
| OLED-9 | A-16 | B-3:A-16 (30:70) | B-3 | LiQ | Yb | 0.046 | 102% | 101% | 97% | 104% |

TABLE 5-continued

| OLED device name | ETL1 | ETL2 | ETL3 | EIL1 | EIL2 | CIEy | V 10 mA/$cm^2$ (% vs CompEx − 1) | CEff 10 mA/$cm^2$ (% vs CompEx − 1) | CEff/CIEy 10 mA/$cm^2$ (% vs CompEx − 1) | LT97 30 mA/$cm^2$ (% vs CompEx − 1) |
|---|---|---|---|---|---|---|---|---|---|---|
| OLED-10 | A-4 | B-3:A-4 (30:70) | B-3 | — | — | 0.043 | 104% | 113% | 111% | 112% |
| OLED-11 | A-4 [1 nm] | B-1:A-4 (30:70) [33 nm] | B-1 [1 nm] | LiQ | Yb | 0.043 | 106% | 94% | 91% | 131% |

The OLED devices according to the invention show improved efficiency at comparable voltage in devices comprising an electron transport layer stack according to claim 1.

The features disclosed in the foregoing description and in the dependent claims may, both separately and in any combination thereof, be material for realizing the aspects of the disclosure made in the independent claims, in diverse forms thereof.

The invention claimed is:

1. Organic light emitting diode comprising a non-transparent substrate, an anode, a cathode, an emission layer, and an electron transport layer stack; wherein the electron transport layer stack is arranged between the emission layer and the cathode;

the electron transport layer stack comprises a first electron transport layer, a second electron transport layer, and a third electron transport layer;

the second electron transport layer is arranged between and in direct contact with the first electron transport layer and the third electron transport layer, respectively;

the first electron transport layer is arranged closer to the emission layer than the third electron transport layer;

the third electron transport layer is arranged closer to the cathode than the first electron transport layer;

the first electron transport layer comprises a compound of Formula (I)

$$(Ar^1\text{-}A_c)_a\text{-}X_b \quad (I);$$

a and b are independently 1 or 2;

c is independently 0 or 1;

$Ar^1$ is independently selected from $C_6$ to $C_{60}$ aryl or $C_2$ to $C_{42}$ heteroaryl, wherein each $Ar^1$ may be substituted with one or two substituents independently selected from the group consisting of $C_6$ to $C_{12}$ aryl, $C_3$ to $C_{11}$ heteroaryl, and $C_1$ to $C_6$ alkyl, D, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, halogen, CN or $PY(R^{10})_2$, wherein Y is selected from O, S or Se, and $R^{10}$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy;

wherein each $C_6$ to $C_{12}$ aryl substituent on $Ar^1$ and each $C_3$ to $C_{11}$ heteroaryl substituent on $Ar^1$ may be substituted with $C_1$ to $C_4$ alkyl or halogen;

A is independently selected from $C_6$ to $C_{30}$ aryl, wherein each A may be substituted with one or two substituents independently selected from the group consisting of $C_6$ to $C_{12}$ aryl and $C_1$ to $C_6$ alkyl, D, $C_1$ to $C_6$ alkoxy, $C_3$ to $C_6$ branched alkyl, $C_3$ to $C_6$ cyclic alkyl, $C_3$ to Co branched alkoxy, $C_3$ to $C_6$ cyclic alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, halogen, CN or $PY(R^{10})_2$, wherein Y is selected from O, S or Se, and $R^{10}$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy;

wherein each $C_6$ to $C_{12}$ aryl substituent on A may be substituted with $C_1$ to $C_4$ alkyl or halogen;

X is independently selected from the group consisting of $C_2$ to $C_{42}$ heteroaryl and $C_6$ to $C_{60}$ aryl, wherein each X may be substituted with one or two substituents independently selected from the group consisting of $C_6$ to $C_{12}$ aryl, $C_3$ to $C_{11}$ heteroaryl, and $C_1$ to $C_6$ alkyl, D, $C_1$ to $C_6$ alkoxy, $C_3$ to $C_6$ branched alkyl, $C_3$ to Co cyclic alkyl, $C_3$ to $C_6$ branched alkoxy, $C_3$ to $C_6$ cyclic alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, halogen, CN or $PY(R^{10})_2$, wherein Y is selected from O, S or Se, and $R^{10}$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy;

wherein each $C_6$ to $C_{12}$ aryl substituent on X and each $C_3$ to $C_{11}$ heteroaryl substituent on X may be substituted with $C_1$ to $C_4$ alkyl or halogen;

the molecular dipole moment of the compound of formula (I) is ≥0 D and ≤4 D;

the second electron transport layer comprises the compound of formula (I) and a compound of Formula (II)

$$(Ar^2)_m\text{-}(Z_k\text{-}G)_n \quad (II);$$

m and n are independently 1 or 2;

k is independently 0, 1 or 2;

$Ar^2$ is independently selected from the group consisting of $C_2$ to $C_{42}$ heteroaryl and $C_6$ to $C_{60}$ aryl, wherein each $Ar^2$ may be substituted with one or two substituents independently selected from the group consisting of $C_6$ to $C_{12}$ aryl, $C_3$ to $C_{11}$ heteroaryl, and $C_1$ to $C_6$ alkyl, D, $C_1$ to $C_6$ alkoxy, $C_3$ to $C_6$ branched alkyl, $C_3$ to Co cyclic alkyl, $C_3$ to $C_6$ branched alkoxy, $C_3$ to $C_6$ cyclic alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, halogen, CN or $PY(R^{10})_2$, wherein Y is selected from O, S or Se, and $R^{10}$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy;

wherein each $C_6$ to $C_{12}$ aryl substituent on $Ar^2$ and each $C_3$ to $C_{11}$ heteroaryl substituent on $Ar^2$ may be substituted with $C_1$ to $C_4$ alkyl or halogen;

Z is independently selected from $C_6$ to $C_{30}$ aryl, wherein each Z may be substituted with one or two substituents independently selected from the group consisting of $C_6$ to $C_{12}$ aryl and $C_1$ to $C_6$ alkyl, D, $C_1$ to $C_6$ alkoxy, $C_3$ to $C_6$ branched alkyl, $C_3$ to $C_6$ cyclic alkyl, $C_3$ to $C_6$ branched alkoxy, $C_3$ to $C_6$ cyclic alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, halogen, CN or $PY(R^{10})_2$, wherein Y is selected from O, S or Se, and $R^{10}$ is independently selected from $C_6$ to $C_{12}$ aryl, $C_3$ to $C_{12}$ heteroaryl, $C_1$ to Co alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy;

wherein each $C_6$ to $C_{12}$ aryl substituent on Z may be substituted with $C_1$ to $C_4$ alkyl or halogen;

G is chosen so that the dipole moment of a compound G-phenyl is ≥1 D and ≤7 D;

the third electron transport layer comprises the compound of Formula (II);

the compound of Formula (I) and the compound of Formula (II) are structurally different from each other;

the first electron transport layer does not comprise the compound of Formula (II) as comprised in the third electron transport layer; and the third electron transport layer does not comprise the compound of Formula (I) as comprised in the first electron transport layer; and the first electron transport layer and the second electron transport layer are free of an electrical dopant.

2. Organic light emitting diode according to claim 1, wherein the concentration of the compound of Formula (I) in the second electron transport layer decreases in the direction from the first electron transport layer to the third electron transport layer; and the concentration of the compound of Formula (II) in the second electron transport layer increases in the direction from the first electron transport layer to the third electron transport layer.

3. Organic light emitting diode according to claim 1, wherein the second electron transport layer consists of a first sublayer, a second sublayer and a third sublayer;

the second sublayer is arranged between and in direct contact with the first sublayer and the third sublayer, respectively;

the first sublayer is arranged closer to the first electron transport layer than the third sublayer;

the third sublayer is arranged closer to the third electron transport layer than the first sublayer;

the concentration of the compound of Formula (I) in the first sublayer decreases in the direction from the first electron transport layer to the second sublayer;

the concentration of the compound of Formula (II) in the first sublayer increases in the direction from the first electron transport layer to the second sublayer;

the concentration of the compound of Formula (I) and the concentration of the compound of Formula (II) in the second sublayer remain constant, respectively, in the direction from the first sublayer to the third sublayer;

the concentration of the compound of Formula (I) in the third sublayer decreases in the direction from the second sub layer to the third electron transport layer; and the concentration of the compound of Formula (II) in the third sublayer increases in the direction from the second sub layer to the third electron transport layer.

4. Organic light emitting diode according to claim 1, wherein wherein $Ar^1$ is independently selected from the group consisting of phenyl, naphthyl, anthracenyl, fluoranthenyl, xanthenyl, dibenzofuranyl, pyrimidinyl pyraziny, spiro-xanthenyl, fluorenyl, spiro-fluorenyl, triphenylsilyl, tetraphenylsilyl, tetraphenylethylene, or a group having the formula (IIa) or (IIb)

(IIa)

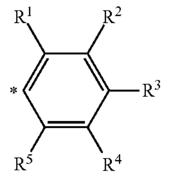

(IIb)

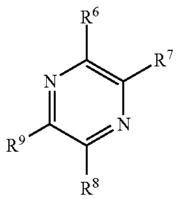

wherein the asterisk symbol "*" represents the binding position for binding the group of formula (IIa) to A; and $R^1$ to $R^9$ are independently selected from the group consisting of H, $C_6$ to $C_{12}$ aryl and $C_4$ to $C_{10}$ heteroaryl.

5. Organic light emitting diode according to claim 1, wherein A is selected from the group consisting of phenylene, naphthylene, biphenylene and terphenylene, which may be substituted or unsubstituted, respectively.

6. Organic light emitting diode according to claim 1, wherein X is independently selected from the group consisting of, naphthyl, triazinyl, 1,2-diazinyl, 1,3-diazinyl, 1,4-diazinyl, quinazolinyl, benzoquinazolinyl, benzimidazolyl, quinolinyl, benzoquinolinyl benzoacridinyl, dibenzoacridinyl, fluoranthenyl, anthracenyl, naphthyl, triphenylenyl, phenathrolinyl, and dinaphthofuranyl which may be substituted or unsubstituted, respectively.

7. Organic light emitting diode according to claim 1, wherein the compound of formula (I) is selected from the following structures A-17, A-16 and A-4

A-17

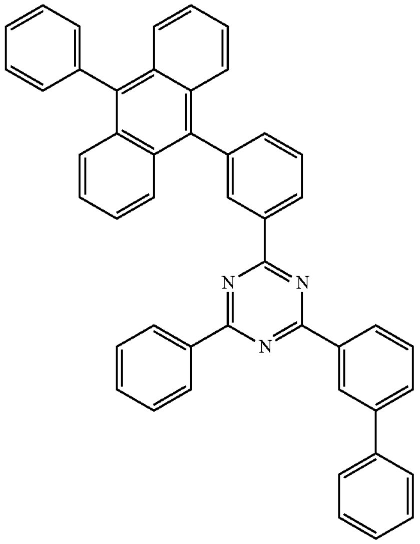

A-16

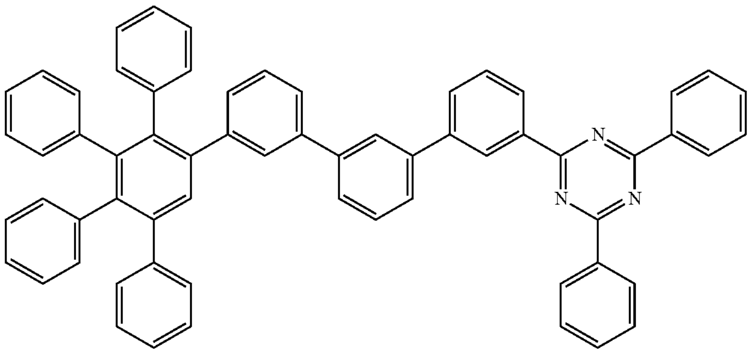

A-4

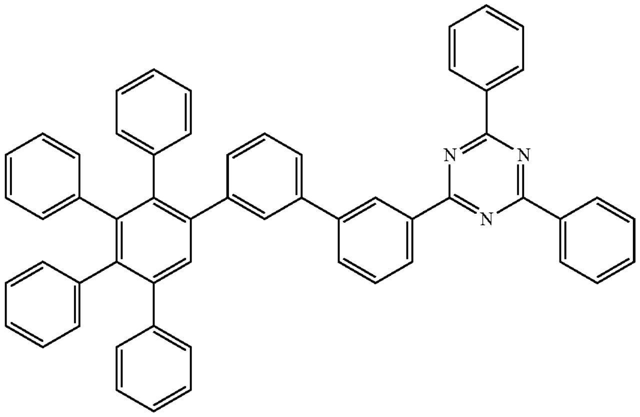

.

8. Organic light emitting diode according to claim 1, wherein $Ar^2$ is independently selected from the group consisting of pyridinyl, triazinyl, 1,2-diazinyl, 1,3-diazinyl, 1,4-diazinyl, quinazolinyl, benzoquinazolinyl, benzimidazolyl, quinolinyl, benzoquinolinyl benzoacridinyl, dibenzoacridinyl, fluoranthenyl, anthracenyl, naphthyl, triphenylenyl, phenathrolinyl, and dinaphthofuranyl which may be substituted or unsubstituted, respectively.

9. Organic light emitting diode according to claim 1, wherein

G is selected from the group consisting of dialkylphosphinyl, diarylphosphinyl, alkylarylphosphinyl, nitrile, benzonitrile, nicotinonitrile, amide-yl, carbamide-yl and $C_2$ to $C_{17}$ heteroaryl;

the respective G may include one or more substituents attached to the group, wherein the one or more substituents are selected from the group consisting of phenyl, methyl, ethyl, and pyridyl.

10. Organic light emitting diode according to claim 1, wherein the compound of formula (II) is selected from the following structures B-1 to B-3

B-1

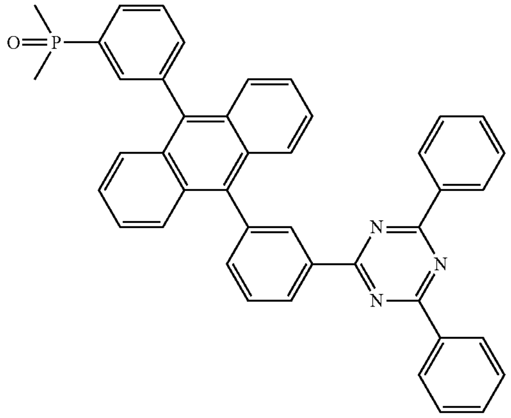

B-2

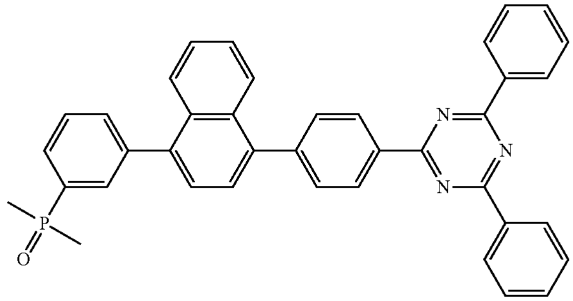

B-3

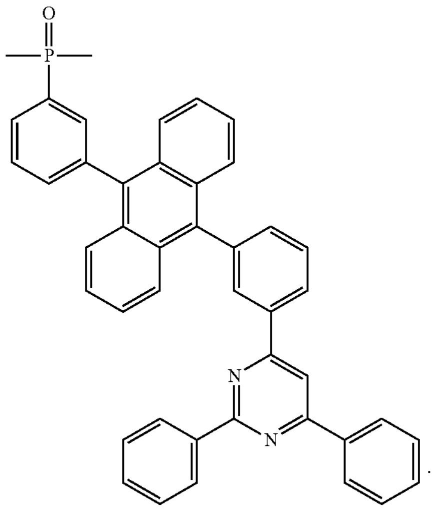

11. Organic light emitting diode according to claim 1, wherein the organic electronic device comprises an electron injection layer and the third electron transport layer is in direct contact with the electron injection layer.

12. Organic light emitting diode according to claim 1, wherein the first electron transport layer is in direct contact to the emission layer.

13. Method for preparing the organic electronic device according to claim 1, the method comprising the steps:

i) providing the compound of formula (I) in a first vapor deposition source;

ii) providing the compound of formula (II) in a second vapor deposition source;

iii) either a) evaporating the compound of formula (I) from the first vapor deposition source and depositing the evaporated compound of formula (I) on the emission layer to form the first electron transport layer;

b) evaporating simultaneously the compound of formula (I) from the first vapor deposition source and the compound of formula (II) from the second vapor deposition source and depositing simultaneously the evaporated compound of formula (I) and the evaporated compound of formula (II) on the first electron transport layer to form the second electron transport layer; and c) evaporating the compound of formula (II) from the second vapor deposition source and depositing the evaporated compound of formula (II) on the second electron transport layer to form the third electron transport layer;

or d) evaporating the compound of formula (II) from the second vapor deposition source and depositing the evaporated compound of formula (II) on the cathode or on a layer provided on the cathode or an outermost layer of a layer stack provided on the cathode to form the third electron transport layer;

e) evaporating simultaneously the compound of formula (I) from the first vapor deposition source and the compound of formula (II) from the second vapor deposition source and depositing simultaneously the evaporated compound of formula (I) and the evaporated compound of formula (II) on the third electron layer to form the second electron transport layer; and f) evaporating the compound of formula (I) from the first vapor deposition source and depositing the evaporated compound of formula (I) on the second electron transport layer to form the first electron transport layer.

14. Method for preparing the organic electronic device according to claim 1, the method comprising the steps:

i) providing a first vapor deposition source and a second vapor deposition source in spatial proximity with respect to each other the spatial proximity allowing to co-deposit a first compound from the first vapor deposition source and a second compound from the second vapor deposition source on a layer or a layer stack arranged at equal distance from the first vapor deposition source and the second vapor deposition source;

ii) providing the compound of formula (I) in the first vapor deposition source;

iii) providing the compound of formula (II) in the second vapor deposition source;

iv) evaporating simultaneously the compound of formula (I) from the first vapor deposition source and the compound of formula (II) from the second vapor deposition source; and v) either a) moving a layer stack comprising the anode and the light emission layer, wherein the light emitting layer is an outermost layer, in a direction from the first vapor deposition source to the second vapor deposition source at first along the first vapor deposition source and thereafter along the second vapor deposition source to form, in this order, the first electron transport layer on the light emission layer, the second electron transport layer on the first electron layer and the third electron transport layer on the second electron transport layer;

or b) moving the cathode or a layer stack comprising the cathode and at least one further layer in a direction from the second vapor deposition source to the first vapor deposition source at first along the second vapor deposition source and thereafter along the first vapor deposition to form, in this order, the third electron transport layer on the cathode or the outermost layer of the at least one further layer(s), the second electron transport layer on the third electron transport layer and the first electron transport layer on the second electron transport layer.

15. Device comprising the organic light emitting diode according to claim 1, wherein the device is a display device or a lighting device.

* * * * *